(12) United States Patent
Tsuchihashi et al.

(10) Patent No.: US 8,637,222 B2
(45) Date of Patent: Jan. 28, 2014

(54) NEGATIVE RESIST PATTERN FORMING METHOD, DEVELOPER AND NEGATIVE CHEMICAL-AMPLIFICATION RESIST COMPOSITION USED THEREFOR, AND RESIST PATTERN

(75) Inventors: Toru Tsuchihashi, Shizuoka (JP); Tadateru Yatsuo, Shizuoka (JP); Koji Shirakawa, Shizuoka (JP); Hideaki Tsubaki, Shizuoka (JP); Akira Asano, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 35 days.

(21) Appl. No.: 13/146,976

(22) PCT Filed: Jan. 29, 2010

(86) PCT No.: PCT/JP2010/051652
§ 371 (c)(1),
(2), (4) Date: Aug. 11, 2011

(87) PCT Pub. No.: WO2010/087516
PCT Pub. Date: Aug. 5, 2010

(65) Prior Publication Data
US 2011/0287234 A1 Nov. 24, 2011

Related U.S. Application Data

(60) Provisional application No. 61/148,517, filed on Jan. 30, 2009.

(30) Foreign Application Priority Data

Jan. 30, 2009 (JP) ................................. 2009-020887
Feb. 20, 2009 (JP) ................................. 2009-038665
Mar. 31, 2009 (JP) ................................. 2009-088556

(51) Int. Cl.
*G03C 5/00* (2006.01)

(52) U.S. Cl.
USPC ........ 430/296; 430/270.1; 430/311; 430/325; 430/330; 430/331; 430/942

(58) Field of Classification Search
USPC .............. 430/270.1, 296, 311, 325, 330, 331, 430/942
See application file for complete search history.

(56) References Cited

U.S. PATENT DOCUMENTS 5,665,527 A 9/1997 Allen et al.
7,485,405 B2 * 2/2009 Kato et al. ................ 430/270.1

2004/0039153 A1 2/2004 Elce et al.
2006/0079658 A1 4/2006 Kato et al.
2008/0131820 A1 6/2008 Van Steenwinckel et al.
2008/0182087 A1 7/2008 Kato et al.

FOREIGN PATENT DOCUMENTS

| EP | 1 117 002 A1 | 7/2001 |
|---|---|---|
| EP | 1 186 624 A1 | 3/2002 |
| EP | 1 953 183 A2 | 8/2008 |
| JP | 62-175739 A | 8/1987 |
| JP | 4-134350 A | 5/1992 |
| JP | 6-112119 A | 4/1994 |
| JP | 7-140674 A | 6/1995 |
| JP | 7-199467 A | 8/1995 |
| JP | 7-226358 A | 8/1995 |
| JP | 7-261392 A | 10/1995 |
| JP | 2000-321789 A | 11/2000 |
| JP | 2000-321791 A | 11/2000 |
| JP | 3277114 B2 | 2/2002 |
| JP | 2002-148806 A | 5/2002 |
| JP | 2002-174908 A | 6/2002 |
| JP | 2006-133757 A | 5/2006 |
| JP | 2008-522206 A | 6/2006 |
| JP | 2006-227174 A | 8/2006 |
| JP | 2008-26667 A | 2/2008 |
| JP | 2008-184571 A | 8/2008 |
| JP | 2008-268935 A | 11/2008 |
| JP | 2008-286877 A | 11/2008 |
| JP | 2009-115835 A | 5/2009 |

OTHER PUBLICATIONS

Extended European Search Report dated Oct. 29, 2012 in European Application No. 10735970.5.
Search Report from the International Searching Authority, dated Mar. 2, 2010, issued in Application No. PCT/JP2010/051652, English.
Written Opinion from the International Searching Authority, dated Mar. 2, 2010, issued in Application No. PCT/JP2010/051652, English.
Office Action dated Nov. 26, 2013, issued by the Japanese Patent Office, in counterpart Japanese Application No. 2010-017489.

* cited by examiner

*Primary Examiner* — Christopher Young
(74) *Attorney, Agent, or Firm* — Sughrue Mion, PLLC

(57) ABSTRACT

A resist pattern forming method including in the following order, (1) a step of forming a film by using a negative chemical-amplification resist composition capable of undergoing negative conversion by a crosslinking reaction, (2) a step of exposing the film, and (4) a step of developing the exposed film by using a developer containing an organic solvent; a developer and a negative chemical-amplification resist composition used therefor; and a resist pattern formed by the pattern forming method.

16 Claims, No Drawings

NEGATIVE RESIST PATTERN FORMING METHOD, DEVELOPER AND NEGATIVE CHEMICAL-AMPLIFICATION RESIST COMPOSITION USED THEREFOR, AND RESIST PATTERN

TECHNICAL FIELD

The present invention relates to a resist pattern forming method using a negative chemical-amplification resist composition suitably used for the ultramicrolithography process such as production of VLSI or a high-capacity microchip or in other photo-fabrication processes. More specifically, the present invention relates to a negative chemical-amplification resist composition suitably usable in the microfabrication of a semiconductor, where an electron beam, X-ray or EUV light (wavelength: near 13 nm) is used, a resist pattern forming method using the same, a developer for use in the resist pattern forming method, and a resist pattern formed by the resist pattern forming method.

BACKGROUND ART

In the process of producing a semiconductor device such as IC and LSI, microfabrication by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X-ray or EUV light is also proceeding.

The lithography using electron beam, X-ray or EUV light is positioned as a next-generation or next-next-generation pattern formation technique and a high-sensitivity and high-resolution resist is being demanded.

Particularly, in order to shorten the wafer processing time, the elevation of sensitivity is very important, but when higher sensitivity is sought for, this incurs not only reduction in the resolution but also worsening of the line width roughness, and development of a resist satisfying all of these properties at the same time is strongly demanded.

The line width roughness as used herein means that the resist edge at the interface between the pattern and the substrate irregularly fluctuates in the direction perpendicular to the line direction due to resist characteristics and when the pattern is viewed from right above, the edge gives an uneven appearance. This unevenness is transferred in the etching step using the resist as a mask and gives rise to deterioration of electrical properties and in turn, reduction in the yield.

The high sensitivity is in a trade-off relationship with high resolution, good pattern profile and good line width roughness, and it is very important how to satisfy all of these properties at the same time.

The resist composition includes "a positive type" using a resin sparingly-soluble or insoluble in an alkali developer, where the exposed area is solubilized by an alkali developer at the exposure to radiation and a pattern is thereby formed, and "a negative type" using a resin soluble in an alkali developer, where the exposed area is sparingly solubilized or insolubilized by an alkali developer at the exposure to radiation and a pattern is thereby formed.

As regards the resist suitable for such a lithography process using electron beam, X-ray or EUV light, a chemical amplification positive resist utilizing an acid catalytic reaction is mainly studied from the standpoint of elevating the sensitivity, and a chemical amplification positive resist composition containing, as main components, an acid generator and a phenolic resin having a property of being insoluble or sparingly soluble in an alkali developer but becoming soluble in an alkali developer by the action of an acid (hereinafter simply referred to as a "phenolic acid-decomposable resin") is being effectively used.

In the production of a semiconductor device or the like, various patterns such as line, trench and hole need to be fowled. For meeting the requirement to form various patterns, not only a positive resist composition but also a negative resist composition are currently under development. For example, JP-A-2002-148806 (the term "JP-A" as used herein means an "unexamined published Japanese patent application") and JP-A-2008-268935 disclose a negative chemical-amplification resist composition for electron beam or X-ray lithography and a technique of forming a pattern by subjecting a film formed from the composition to exposure and then development using an alkali developer.

In the formation of an ultrafine pattern, it is demanded to more improve the reduction of resolution and the line width roughness.

With an attempt to satisfy this demand, there has been also proposed a method where a film formed from a resist composition containing an acid-decomposable resin is exposed and then developed using a developer other than an alkali developer. For example, Japanese Patent No. 3277114 discloses developing the film with a supercritical fluid (supercritical $CO_2$), and JP-A-7-199467 discloses a method where a film formed from a resist composition containing a resin having a group capable of being cleaved by the action of an acid to cause polarity conversion (deprotection reaction) is exposed and then developed with a developer containing an organic solvent.

Furthermore, a pattern forming method using a resin whose main chain is cut directly by exposure is also known. For example, JP-A-62-175739 and JP-A-2006-227174 disclose a non-chemical amplification positive resist composition containing a copolymer of PMMA (polymethyl methacrylate) or methyl α-chloroacrylate with α-methylstyrene. According to such a method, the chain of the polymer is cut upon irradiation with radiation such as electron beam to decrease the molecular weight and in turn, the dissolution rate in an organic solvent as a developer is increased, whereby a pattern is formed.

However, it is impossible at present to satisfy high sensitivity, high resolution, good pattern profile and good line width roughness in the ultrafine region all at the same time.

SUMMARY OF INVENTION

An object of the present invention is to solve the problems in the technology for enhancing the performance at the microfabrication of a semiconductor device, where high-energy ray, X-ray, electron beam or EUV light is used, and provide a resist pattern forming method satisfying high sensitivity, high resolution, good pattern profile, good line width roughness, residual film ratio, bridge margin and collapse margin all at the same time, a developer and a negative chemical-amplification resist composition used therefor, and a resist pattern foamed by the resist pattern forming method.

Here, the residual film ratio (%) is expressed by (film thickness after development/film thickness before exposure)×100. When the residual film ratio is sufficiently large, wirings are prevented from joining together at the wiring formation and in turn, reduction of the yield is suppressed.

The bridge margin is indicated by a maximum size allowing a pattern to be separated when irradiated with an exposure dose exceeding the exposure dose at which the objective pattern size is obtained. A pattern is stably separated and formed even in an overexposed region, so that production of a bridge defect giving rise to wiring breakage at the wiring formation can be prevented and reduction of the yield can be suppressed.

The collapse margin is indicated by a minimum size allowing a pattern to be held when irradiated with an exposure dose less than the exposure dose at which the objective pattern size is obtained. A pattern can be held without collapsing even in a region having a small exposure dose, so that a pattern with a small exposure dose compared to a dense pattern, such as isolated pattern, can be stably formed.

In the production of a semiconductor device or the like, formation of various patterns such as line, trench and hole is required and therefore, it is important to satisfy both the bridge margin and the collapse margin.

As a result of intensive studies, the present inventors have found that the above-described object can be attained by performing pattern exposure of a crosslinkable negative chemical-amplification resist and then developing the unexposed area with a developer containing an organic solvent.

That is, the present invention is as follows.

1. A resist pattern forming method comprising, in the following order, (1) a step of forming a film by using a negative chemical-amplification resist composition capable of undergoing negative conversion by a crosslinking reaction, (2) a step of exposing the film, and (4) a step of developing the exposed film by using a developer containing an organic solvent.

2. The resist pattern forming method as described in 1 above, wherein the organic solvent contained in the developer is one or more kinds of solvents selected from the group consisting of an ester-based solvent, a ketone-based solvent, an alcohol-based solvent, an amide-based solvent, an ether-based solvent and a hydrocarbon-based solvent.

3. The resist pattern forming method as described in 1 or 2 above, wherein the organic solvent contained in the developer is one or more kinds of solvents selected from the group consisting of an alkylene glycol monoalkyl ether carboxylate-based solvent, an alkylene glycol monoalkyl ether-based solvent, an alkyl carboxylate-based solvent and an alkyl ketone-based solvent.

4. The resist pattern forming method as described in any one of 1 to 3 above, wherein the organic solvent contained in the developer is one or more kinds of solvents selected from the group consisting of propylene glycol monomethyl ether, propylene glycol monomethyl ether acetate, methyl isobutyl ketone, methyl amyl ketone, cyclopentanone, cyclohexanone, ethyl lactate and butyl acetate.

5. The resist pattern forming method as described in any one of 1 to 3 above, wherein the organic solvent contained in the developer is one or more kinds or solvents selected from the group consisting of an ester-based solvent containing no hydroxyl group in the molecule, a ketone-based solvent containing no hydroxyl group in the molecule, and an ether-based solvent containing no hydroxyl group in the molecule.

6. The resist pattern forming method as described in any one of 1 to 5 above, further comprising: (5) a step of performing a rinsing treatment by using a rinsing solution containing an organic solvent after (4) the developing step.

7. The resist pattern forming method as described in 6 above, wherein the organic solvent contained in the rinsing solution is one or more kinds of solvents selected from the group consisting of a monohydric alcohol-based solvent and a hydrocarbon-based solvent.

8. The resist pattern forming method as described in any one of 1 to 7 above, further comprising: (3) a baking step between the exposing step (2) and the developing step (4).

9. The resist pattern forming method as described in any one of 1 to 8 above, wherein the exposure in the exposing step (2) is performed by an electron beam or EUV light.

10. The resist pattern forming method as described in any one of 1 to 9 above, which is used for fabrication of a semiconductor microcircuit.

11. The resist pattern forming method as described in any one of 1 to 10, wherein the percentage of water content in the developer is 10 mass % or less.

12. The resist pattern forming method as described in any one of 1 to 11 above, wherein the negative chemical-amplification resist composition comprises: (A) a resin, (B) a crosslinking agent capable of crosslinking the resin (A) by the action of an acid, and (C) a compound capable of generating an acid upon irradiation with an actinic ray or radiation.

13. The resist pattern forming method as described in 12 above, wherein the resin (A) is a resin containing a repeating unit represented by formula (1):

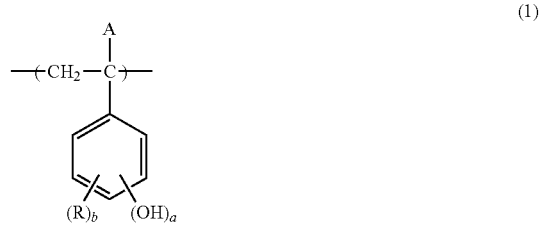

wherein

A represents a hydrogen atom, an alkyl group, a cycloalkyl group, a halogen atom or a cyano group, R represents a halogen atom, an alkyl group, a cycloalkyl group, an aryl group, an alkenyl group, an aralkyl group, an alkoxy group, an alkylcarbonyloxy group or an alkylsulfonyloxy group, and when a plurality of R's are present, each R may be the same as or different from every other R and they may combine with each other to form a ring, a represents an integer of 1 to 3, and b represents an integer of 0 to (3-a).

14. The resist pattern forming method as described in 12 or 13 above, wherein the crosslinking agent (B) is a phenol compound.

15. The resist pattern forming method as described in 14 above, wherein the crosslinking agent (B) is a phenol compound having two or more benzene rings in the molecule.

16. The resist pattern forming method as described in any one of 12 to 15 above, wherein the content of the crosslinking agent (B) in the negative chemical-amplification resist composition is from 3 to 65 mass % based on the entire solid content of the resist composition.

17. The resist pattern forming method as described in any one of 12 to 16 above, wherein the compound (C) is a compound capable of generating at least any one acid of a sulfonic acid, a bis(alkylsulfonyl)imide and a tris(alkylsulfonyl)methide upon irradiation with an actinic ray or radiation.

18. A developer for use in the resist pattern forming method described in any one of 1 to 17 above.

19. A crosslinkable negative chemical-amplification resist composition for organic solvent development, which is used in the resist pattern forming method described in any one of 1 to 17 above.

20. A resist pattern formed by the resist pattern forming method described in any one of 1 to 17 above.

DESCRIPTION OF EMBODIMENTS

The negative chemical-amplification resist composition of the present invention and a pattern forming method using the same are described in detail below.

Incidentally, in the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

Furthermore, in the present invention, unless otherwise indicated, the "exposure" includes not only exposure with a mercury lamp, a far ultraviolet ray typified by excimer laser, an X-ray, EUV light or the like but also lithography with a particle beam such as electron beam and ion beam.

[Pattern Forming Method and Resist Pattern]

The mode of using the negative chemical-amplification resist composition of the present invention is described below.

The pattern forming method of the present invention comprises, in the following order, (1) a step of forming a film by using a negative chemical-amplification resist composition capable of undergoing negative conversion by a crosslinking reaction, (2) a step of exposing the film, and (4) a step of developing the exposed film by using a developer containing an organic solvent.

The term "negative conversion" as used herein means that the molecular weight of the resin is increased by a crosslinking reaction to insolubilize the resin in a solvent (developer).

Also, the resist pattern of the present invention is formed by the above-described pattern forming method of the present invention.

(1) Film Formation

For obtaining a negative chemical-amplification resist composition film, respective components described later are dissolved in a solvent, and the solution is filtered through a filter, if desired, and then applied on a support (substrate). The filter is preferably a polytetrafluoroethylene-, polyethylene- or nylon-made filter having a pore size of 0.1 μm or less, more preferably 0.05 μm or less, still more preferably 0.03 μm or less.

The composition is applied on such a substrate as used in the production of a precision integrated circuit device (for example, a silicon- or silicon dioxide-coated substrate) by an appropriate coating method such as spinner and then dried to form a photosensitive film.

If desired, a commercially available inorganic or organic antireflection film may be used. Furthermore, an antireflection film may also be used as an underlying layer of the resist.

(2) Exposure

An actinic ray or radiation is irradiated on the formed film through a predetermined mask. Here, irradiation with an electron beam is generally performed to draw a pattern without a mask (direct lithography).

The actinic ray or radiation is not particularly limited, but examples thereof include KrF excimer laser, ArF excimer laser, EUV light and electron beam, with EUV light and electron beam being preferred.

(3) Baking

The exposed film is preferably baked (heated) before performing development.

The heating temperature is preferably from 80 to 150° C., more preferably from 90 to 150° C., still more preferably from 100 to 140° C.

The heating time is preferably from 30 to 300 seconds, more preferably from 30 to 180 seconds, still more preferably from 30 to 90 seconds.

The heating may be performed by normal means equipped with an exposure/developing machine and may also be performed using a hot plate or the like.

The reaction of the exposed area is accelerated by the baking and in turn, the sensitivity or pattern profile is improved.

(4) Development

In the present invention, development is performed using a developer containing an organic solvent.

Developer:

The organic solvent used for the developer is preferably an organic solvent having a vapor pressure at 20° C. of 5 kPa or less, more preferably 3 kPa or less, still more preferably 2 kPa or less. By setting the vapor pressure of the organic solvent to 5 kPa or less, evaporation of the developer on a substrate or in a development cup is suppressed and the temperature uniformity in the wafer plane is enhanced, as a result, the dimensional uniformity in the wafer plane is improved.

As for the organic solvent used as the developer, various organic solvents may be widely used but, for example, at least one kind of a solvent selected from solvents such as ester-based solvent, ketone-based solvent, alcohol-based solvent, amide-based solvent, ether-based solvent and hydrocarbon-based solvent may be used. Such a solvent is preferred particularly when the later-described resin (A) containing a repeating unit represented by formula (1) is used.

Above all, a developer containing at least one kind of a solvent selected from a ketone-based solvent, an ester-based solvent, an alcohol-based solvent and an ether-based solvent is preferred.

Examples of the ester-based solvent include an alkyl carboxylate-based solvent such as methyl acetate, butyl acetate, ethyl acetate, isopropyl acetate, amyl acetate, ethyl-3-ethoxypropionate, propylene glycol diacetate, 3-methoxybutyl acetate, 3-methyl-3-methoxybutyl acetate, methyl formate, ethyl formate, butyl formate, propyl formate, ethyl lactate, butyl lactate and propyl lactate, and an alkylene glycol monoalkyl ether carboxylate-based solvent such as propylene glycol monomethyl ether acetate (PGMEA; another name: 1-methoxy-2-acetoxypropane), ethylene glycol monoethyl ether acetate, diethylene glycol monobutyl ether acetate, diethylene glycol monoethyl ether acetate and propylene glycol monoethyl ether acetate. Among these, butyl acetate, amyl acetate, ethyl lactate and propylene glycol monomethyl ether acetate are preferred.

Examples of the ketone-based solvent include 1-octanone, 2-octanone, 1-nonanone, 2-nonanone, acetone, 4-heptanone, 1-hexanone, 2-hexanone, diisobutyl ketone, cyclopentanone, cyclohexanone, methylcyclohexanone, phenylacetone, methyl ethyl ketone, methyl amyl ketone, methyl isobutyl ketone, acetyl acetone, acetonyl acetone, ionone, diacetonyl alcohol, acetyl carbinol, acetophenone, methyl naphthyl ketone, isophorone and propylene carbonate. Among these, an alkyl ketone-based solvent such as methyl isobutyl ketone, methyl amyl ketone, cyclopentanone and cycloheptane is preferred.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, hexyl alcohol (e.g., n-hexyl alcohol), heptyl alcohol (e.g., n-heptyl alcohol), octyl alcohol (e.g., n-octyl alcohol) and decanol (e.g., n-decanol); a glycol-based solvent such as ethylene glycol, diethylene glycol, triethylene glycol, 1,2-propylene glycol, 1,3-propylene glycol, 1,2-butylene glycol, 1,3-butylene glycol and 1,4-butylene glycol; an alkylene glycol monoalkyl ether-based solvent such as ethylene glycol monomethyl ether, propylene glycol monomethyl ether (PGME; another name: 1-methoxy-2-propanol), ethylene glycol monoethyl ether, propylene glycol monoethyl ether, diethylene glycol monomethyl ether and triethylene glycol monoethyl ether; a glycol ether-based solvent such as methoxymethyl butanol and propylene glycol dimethyl ether; and a phenol-based solvent such as phenol and cresol. Among these, 1-hexanol, 2-hexanol, 1-octanol, 2-ethyl-hexanol, propylene glycol monomethyl ether and cresol are preferred.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the ether-based solvent include, in addition to the alkylene glycol monoalkyl ether-based solvents and glycol ether-based solvents above, dioxane, tetrahydrofuran and tetrahydropyran.

Examples of the hydrocarbon-based solvent include an aromatic hydrocarbon-based solvent such as toluene and xylene, and an aliphatic hydrocarbon-based solvent such as pentane, hexane, octane, decane and dodecane.

The developer preferably contains one or more kinds of solvents selected from an alkylene glycol monoalkyl ether carboxylate-based solvent, an alkylene glycol monoalkyl ether-based solvent, an alkyl carboxylate-based solvent and an alkyl ketone-based solvent, more preferably one or more kinds of solvents selected from propylene glycol monomethyl ether, propylene glycol monomethyl ether acetate, methyl isobutyl ketone, methyl amyl ketone, cyclopentanone, cyclohexanone, ethyl lactate and butyl acetate.

The developer is preferably a developer containing at least one kind of an organic solvent selected from the group consisting of an ester-based solvent containing no hydroxyl group in the molecule, a ketone-based solvent containing no hydroxyl group in the molecule, and an ether-based solvent containing no hydroxyl group in the molecule.

More specifically, the developer is preferably a developer containing an organic solvent that does not contain a hydroxyl group in the molecule, represented by any one of the following formulae (S1) to (S3):

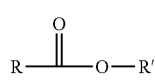
(S1)

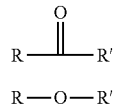
(S2)

R—O—R'  (S3)

In formulae (S1) to (S3), each of R and R' independently represents an alkyl group, a cycloalkyl group, an alkoxyl group, an alkoxycarbonyl group, a cyano group or a halogen atom. The carbon number of the alkyl group, cycloalkyl group, alkoxy group and alkoxycarbonyl group is usually from 1 to 6. R and R' may combine with each other to form a ring (preferably a 5- or 6-membered ring). These groups and the ring formed by combining R and R' with each other may be further substituted by a carbonyl group-containing group (e.g., acyl, aldehyde), a cyano group, an alkoxy group, an alkyl ester group or the like.

The organic solvent having no hydroxyl group in the molecule is preferably an ester-based solvent such as methyl acetate, butyl acetate, ethyl acetate, isopropyl acetate, amyl acetate, ethyl-3-ethoxypropionate, propylene glycol diacetate, 3-methoxybutyl acetate and 3-methyl-3-methoxybutyl acetate, a ketone-based solvent other than a ketone-based solvent having a hydroxyl group in the molecule, such as diacetonyl alcohol and acetyl carbinol, out of the above-described ketone-based solvents, or an ether-based solvent such as dioxane, tetrahydrofuran and tetrahydropyran, and it is more preferred to contain one or more members selected from methyl isobutyl ketone, methyl amyl ketone, cyclohexanone and butyl acetate.

A plurality of these solvents may be mixed, or the solvent may be mixed with a solvent other than those described above or with water.

The concentration of the organic solvent (in the case of mixing a plurality of solvents, the total concentration) in the developer is preferably 50 mass % or more, more preferably 70 mass % or more, still more preferably 90 mass % or more. It is particularly preferred that the developer is substantially composed of only an organic solvent. Here, the expression "substantially composed of only an organic solvent" includes a case where the developer contains a small amount of a surfactant, an antioxidant, a stabilizer, a defoaming agent or the like.

The percentage of water content in the developer is preferably 10 mass % or less, more preferably 5 mass % or less, still more preferably 3 mass % or less, and it is most preferred to contain substantially no water. By virtue of setting the percentage of water content to 10 mass % or less, good development characteristics can be obtained.

Surfactant:

In the developer containing an organic solvent, an appropriate amount of a surfactant can be added, if desired.

As for the surfactant, the same as the later-described surfactant used in the resist composition may be used.

The amount of the surfactant used is usually from 0.001 to 5 mass %, preferably from 0.005 to 2 mass %, more preferably from 0.01 to 0.5 mass %, based on the entire amount of the developer.

Developing Method:

As regards the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on the substrate surface (spraying method), and a method of continuously ejecting the developer on the substrate spinning at a constant speed while scanning the developer ejecting nozzle at a constant rate (dynamic dispense method) may be applied.

Also, after the developing step, a step of stopping the development while replacing the developer with another solvent may be practiced.

The developing time is preferably a time long enough to sufficiently dissolve the resin, crosslinking agent and the like in the unexposed area and, usually, the developing time is preferably from 10 to 300 seconds, more preferably from 20 to 120 seconds.

The temperature of the developer is preferably from 0 to 50° C., more preferably from 15 to 35° C.

The amount of the developer can be appropriately adjusted according to the developing method.

(5) Rinsing

The pattern forming method of the present invention may contain (5) a step of rinsing the film by using a rinsing solution containing an organic solvent after the developing step (4).

Rinsing Solution:

The organic solvent used for the rinsing solution is an organic solvent having a vapor pressure at 20° C. of preferably from 0.05 to 5 kPa, more preferably from 0.1 to 5 kPa, and most preferably from 0.12 to 3 kPa. By setting the vapor pressure of the organic solvent used for the rinsing solution to from 0.05 to 5 kPa, the temperature uniformity in the wafer plane is enhanced and swelling ascribable to permeation of the rinsing solution is suppressed, as a result, the dimensional uniformity in the wafer plane is improved.

As for the rinsing solution, various organic solvents may be used but, for example, in the case where a resin containing a repeating unit represented by formula (1) is used as the resin (A), a rinsing solution containing at least one kind of a solvent selected from a hydrocarbon-based solvent, a ketone-based solvent, an ester-based solvent, an alcohol-based solvent, an amide-based solvent and an ether-based solvent, or water is preferably used.

More preferably, a step of washing the film by using a rinsing solution containing at least one kind of an organic solvent selected from a ketone-based solvent, an ester-based solvent, an alcohol-based solvent, an amide-based solvent and a hydrocarbon-based solvent is preformed after development. Still more preferably, a step of washing the film by using a rinsing solution containing at least one or more kinds of organic solvents selected from the group consisting of an alcohol-based solvent and a hydrocarbon-based solvent is preformed after development.

Specific examples of the ketone-based solvent, ester-based solvent, alcohol-based solvent, amide-based solvent, ether-based solvent and hydrocarbon-based solvent used as the rinsing solution are the same as those described above for the developer.

In particular, use of a rinsing solution containing at least one or more kinds of organic solvents selected from the group consisting of a monohydric alcohol-based solvent and a hydrocarbon-based solvent is preferred.

The monohydric alcohol-based solvent used in the rinsing step after development includes a linear, branched or cyclic monohydric alcohol, and specific examples of the monohydric alcohol which can be used include 1-butanol, 2-butanol, 3-methyl-1-butanol, tert-butyl alcohol isopropyl alcohol, cyclopentanol and cyclohexanol, with 1-butanol, 2-butanol, 3-methyl-1-butanol and isopropyl alcohol being preferred.

The hydrocarbon-based solvent includes an aromatic hydrocarbon-based solvent such as toluene and xylene, and an aliphatic hydrocarbon-based solvent such as octane, decane and dodecane.

As for these components, a plurality of kinds may be mixed, or the component may be mixed with an organic solvent other than those described above.

The above-described organic solvent may be mixed with water, but the percentage of water content in the rinsing solution is usually 30 mass % or less, preferably 10 mass % or less, more preferably 5 mass % or less, still more preferably 3 mass % or less. The rinsing solution most preferably contains no water. By virtue of setting the percentage of water content to 30 mass % or less, good development characteristics can be obtained.

The rinsing solution may also be used after adding thereto an appropriate amount of a surfactant.

As for the surfactant, the same as the later-described surfactant used in the resist composition may be used, and the amount used thereof is usually from 0.001 to 5 mass %, preferably from 0.005 to 2 mass %, more preferably from 0.01 to 0.5 mass %, based on the entire amount of the rinsing solution.

Rinsing Method:

In the rinsing step, the developed wafer is wished using the above-described rinsing solution containing an organic solvent.

The method of washing treatment is not particularly limited but, for example, a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method) may be applied. Above all, a method where the washing treatment is performed by the spin coating method and after the washing, the rinsing solution is removed from the substrate surface by spinning the substrate at a rotation speed of 2,000 to 4,000 rpm, is preferred. The spinning time of the substrate may be set according to the rotation speed in the range achieving removal of the rinsing solution from the substrate surface but is usually from 10 seconds to 3 minutes. Incidentally, the rinsing is preferably performed under room-temperature conditions.

The rinsing time is preferably long enough to allow for no remaining of the developing solvent on the wafer and is usually from 10 to 300 seconds, more preferably from 20 to 120 seconds.

The temperature of the rinsing solution is preferably from 0 to 50° C., more preferably from 15 to 35° C.

The amount of the rinsing solution can be appropriately adjusted according to the rinsing method.

Also, after the development or rinsing, a treatment of removing the developer or rinsing solution adhering on the pattern with a supercritical fluid may be performed.

Furthermore, after the development, rinsing or treatment with a supercritical fluid, a heating treatment for removing the solvent remaining in the pattern may be performed. The heating temperature and heating time are not particularly limited as long as a good resist pattern can be obtained, but they are usually from 40 to 160° C. and from 10 seconds to 3 minutes. The heating treatment may be performed a plurality of times.

[Negative Chemical-Amplification Resist Composition]

The negative chemical-amplification resist composition capable of undergoing negative conversion by a crosslinking reaction, which is used in the pattern forming method of the present invention, is described below.

The negative chemical-amplification resist composition capable of undergoing negative conversion by a crosslinking reaction preferably contains (A) a resin, (B) a crosslinking agent capable of crosslinking the resin (A) by the action of an acid, and (C) a compound capable of generating an acid upon irradiation with an actinic ray or radiation.

[1] (A) Resin (A) a resin is used together with (B) a compound capable of crosslinking by the action of an acid. Here, a known resin capable of crosslinking with the crosslinking agent (B) can be used as the resin (A).

The resin (A) may contain an acidic group.

Examples of the acidic group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

The acidic group is preferably a phenolic hydroxyl group, a carboxyl group, a fluorinated alcohol group (preferably hexafluoroisopropanol group) or a sulfonic acid group.

Preferred examples of the resin (A) which can be used include a hydroxystyrene, a partially hydrogenated hydroxystyrene, a novolak resin, a (meth)acrylic polymer (e.g., (meth)acrylic acid-containing polymer), a hydroxyl group-containing polymer, a polyvinyl acetate, a diene copolymer and an epoxy group-containing polymer.

From the standpoint of secondary electron generation efficiency in the electron beam or EUV exposure, the resin (A) preferably contains a benzene ring, more preferably a repeating unit represented by formula (1):

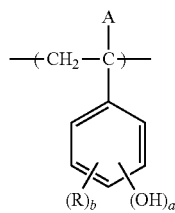

(1)

In formula (1), A represents a hydrogen atom, an alkyl group, a cycloalkyl group, a halogen atom or a cyano group.

R represents a halogen atom, an alkyl group, a cycloalkyl group, an aryl group, an alkenyl group, an aralkyl group, an alkoxy group, an alkylcarbonyloxy group or an alkylsulfonyloxy group and when a plurality of R's are present, each R may be the same as or different from every other R.

a represents an integer of 1 to 3, and a is preferably 1.

b represents an integer of 0 to (3-a), and b is preferably 0 or 1, more preferably 0.

In formula (1), the alkyl group as A may further has a substituent and is preferably an alkyl group having a carbon number of 1 to 3. The cycloalkyl group as A may further has a substituent and may be monocyclic or polycyclic, and a cycloalkyl group having a carbon number of 5 to 10 is preferred. Examples of the halogen atom as A include Cl, Br and F. A is preferably a hydrogen atom or an alkyl group having a carbon number of 1 to 3 (e.g., methyl, ethyl), more preferably a hydrogen atom or a methyl group.

R includes a halogen atom, an alkyl group, an alkenyl group, a cycloalkyl group, an aryl group, an aralkyl group, an alkoxy group, an alkylcarbonyloxy group and an alkylsulfonyloxy group, and these groups may further have a substituent. Examples of the halogen atom as R include Cl, Br, F and I. In the case of having a plurality of R's, these may combine with each other to form a ring (preferably a 5- or 6-membered ring).

R is preferably a halogen atom, a linear or branched alkyl group having a carbon number of 1 to 8, which may have a substituent, an alkenyl group having a carbon number of 1 to 8, which may have a substituent, a cycloalkyl group having a carbon number of 5 to 10, which may have a substituent, an aryl group having a carbon number of 6 to 15, which may have a substituent, an aralkyl group having a carbon number of 7 to 16, which may have a substituent, an alkoxy group having a carbon number of 1 to 8, which may have a substituent, an alkylcarbonyloxy group having a carbon number of 2 to 8, which may have a substituent, or an alkylsulfonyloxy group having a carbon number of 1 to 8, which may have a substituent.

Each R is, independently, more preferably a halogen atom, an alkyl group having a carbon number of 1 to 4, which may have a substituent, an alkoxy group having a carbon number of 1 to 4, which may have a substituent, or an alkylcarbonyloxy group having a carbon number of 2 to 4, which may have a substituent, still more preferably a chlorine atom, a bromine atom, an iodine atom, an alkyl group having a carbon number of 1 to 3 (e.g., methyl, ethyl, propyl, isopropyl), or an alkoxy group having a carbon number of 1 to 3 (e.g., methoxy, ethoxy, propyloxy, isopropyloxy).

Examples of the substituent which A and R may further have include an alkyl group (e.g., methyl, ethyl, propyl, isopropyl, butyl, tert-butyl, hexyl), an aryl group (e.g., phenyl, naphthyl), an aralkyl group, a hydroxyl group, an alkoxy group (e.g., methoxy, ethoxy, butoxy, octyloxy, dodecyloxy), an acyl group (e.g., acetyl, propanoyl, benzoyl), and an oxo group. The substituent is preferably a substituent having a carbon number of 15 or less.

The substituents (—(OH)$_a$ and (R)$_b$) in the repeating unit represented by formula (1) may be present in any of para-, meta- and ortho-positions with respect to the bond from the main chain of the resin, but it is preferred that —OH is present at least in the meta-position.

The resin (A) for use in the present invention may contain at least one kind of a repeating unit represented by any one of formulae (2) to (4), together with the repeating unit represented by formula (1).

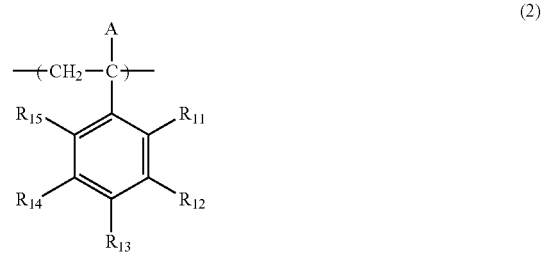

(2)

-continued (3)

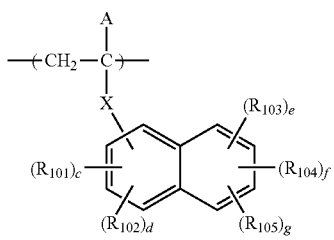

(4)

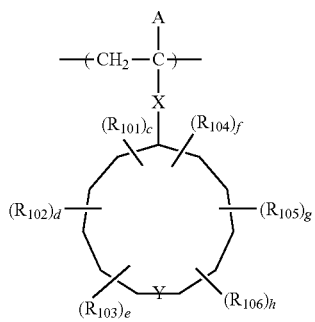

In formulae (2) to (4), A has the same meaning as A in formula (1).

X represents a single bond, a —COO— group, an —O— group or a —CON($R_{16}$)— group, wherein $R_{16}$ represents a hydrogen or an alkyl group having a carbon number of 1 to 3 (e.g., methyl, ethyl, propyl). X is preferably a single bond, —COO— or —CON($R_{16}$)—, more preferably a single bond or a —COO— group.

The ring structure of Y represents a tricyclic or greater polycyclic aromatic hydrocarbon ring structure and is preferably a structure represented by any one of the following structural formulae.

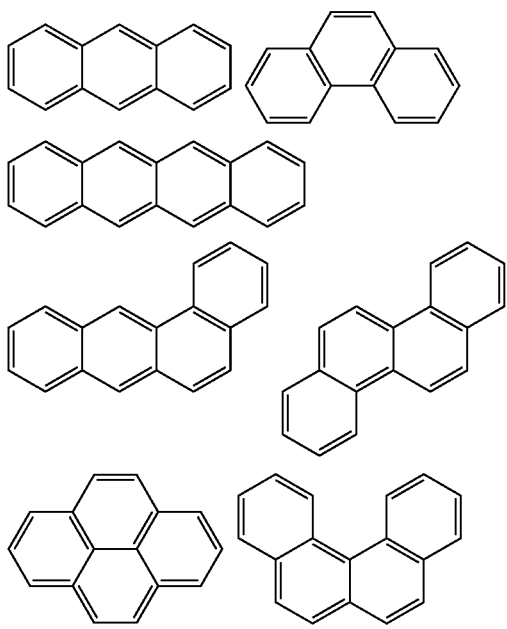

-continued

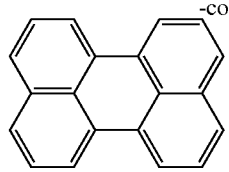

Each of $R_{11}$ to $R_{15}$ independently represents a hydrogen atom, a halogen atom, an alkyl group, a cycloalkyl group, an aryl group, an alkenyl group, an aralkyl group, an alkoxy group, an alkylcarbonyloxy group, an alkylsulfonyloxy group, an arylcarbonyloxy group, a nitro group or a cyano group. $R_{11}$ to $R_{15}$ may combine with each other to form a ring (preferably a 5- or 6-membered ring). Specific examples of the halogen atom, the alkyl group, the cycloalkyl group, the aryl group, the alkenyl group, the aralkyl group, the alkoxy group, the alkylcarbonyloxy group and the alkylsulfonyloxy group represented by $R_{11}$ to $R_{15}$ are the same as those for R in formula (1). The arylcarbonyloxy group represented by $R_{11}$ to $R_{15}$ is preferably an arylcarbonyloxy group having a carbon number of 7 to 16, which may have a substituent Each of $R_{101}$ to $R_{106}$ independently represents a hydroxy group, a halogen atom (e.g., Cl, Br, F, I), a linear or branched alkyl group having a carbon number of 1 to 8, which may have a substituent, a linear or branched alkoxy group having a carbon number of 1 to 8, which may have a substituent, a linear or branched alkylcarbonyloxy group having a carbon number of 2 to 8, which may have a substituent, a linear or branched alkylsulfonyloxy group having a carbon number of 1 to 8, which may have a substituent, an alkenyl group having a carbon number of 1 to 8, which may have a substituent, an aryl group having a carbon number of 6 to 15, which may have a substituent, an aralkyl group having a carbon number of 7 to 16, which may have a substituent, a carboxy group, or a perfluoroalkyl group having a carbon number of 1 to 4, which may have a substituent.

Each of c to h independently represents an integer of 0 to 3.

Specific examples of the substituent for these groups are the same as those described above as examples of the substituent which R in formula (1) may further have.

Each of $R_{101}$ to $R_{106}$ is, independently, preferably a halogen atom, an alkyl group having a carbon number of 1 to 4, which may have a substituent, an alkoxy group having a carbon number of 1 to 4, which may have a substituent, or an alkylcarbonyloxy group having a carbon number of 2 to 4, which may have a substituent, more preferably a chlorine atom, a bromine atom, an iodine atom, an alkyl group having a carbon number of 1 to 3 (e.g., methyl, ethyl, propyl, isopropyl), an alkoxy group having a carbon number of 1 to 3 (e.g., methoxy, ethoxy, propyloxy, isopropyloxy), or an alkylcarbonyloxy group having a carbon number of 2 or 3 (e.g., acetoxy, propionyloxy).

The resin (A) as for use in the present invention may be any of a resin having only one kind of a repeating unit represented by formula (1), a resin having two or more kinds of repeating units represented by formula (1), and a resin having a repeating unit represented by formula (1) and at least one kind of a repeating unit represented by any one of formulae (2) to (4), and other polymerizable monomers capable of controlling the film-forming property or solvent solubility may also be copolymerized therein.

Examples of such a polymerizable monomer include, but are not limited to, styrene, an alkyl-substituted styrene, an alkoxystyrene, an acyloxystyrene, a hydrogenated hydroxystyrene, maleic anhydride, an acrylic acid derivative (e.g., acrylic acid, acrylic acid ester), a methacrylic acid derivative (e.g., methacrylic acid, methacrylic acid ester), an N-substituted maleimide, acrylonitrile and methacrylonitrile.

In addition, preferred examples of the repeating unit of the resin include a repeating unit having a cyclic structure in the main chain (for example, a unit derived from a monomer having an indene structure), a repeating unit having a naphthol structure, and a repeating unit having a —$C(CF_3)_2OH$ group.

In the present invention, as for the resin (A), one kind of a resin may be used alone, or two or more kinds of resins may be used in combination.

The content of the repeating unit represented by formula (1) in the resin (A) for use in the present invention is generally from 50 to 100 mol %, preferably from 70 to 100 mol %.

In the resin (A), the ratio between the repeating unit represented by formula (1) and the repeating unit represented by formulae (2) to (4) is, in terms of the molar ratio, preferably from 100/0 to 50/50, more preferably from 100/0 to 60/40, still more preferably 100/0 to 70/30.

The molecular weight of the resin (A) is, in terms of the mass average molecular weight, preferably from 1,000 to 50,000, more preferably from 2,000 to 20,000.

The molecular weight distribution (Mw/Mn) of the resin (A) is preferably from 1.0 to 2.0, more preferably from 1.0 to 1.35.

The amount added of the resin (A) (in the case of using a plurality of resins in combination, the total amount) is from 30 to 95 mass %, preferably from 40 to 90 mass %, more preferably from 50 to 80 mass %, based on the entire solid content of the composition. Here, the molecular weight and molecular weight distribution of the resin are defined as polystyrene-equivalent values by GPC measurement.

The resin (A) can be synthesized by a known radical polymerization method or anionic polymerization method. For example, in the radical polymerization method, a vinyl monomer is dissolved in an appropriate organic solvent, and the reaction is allowed to proceed at room temperature or under heating by using a peroxide (e.g., benzoyl peroxide), a nitrile compound (e.g., azobisisobutyronitrile) or a redox compound (e.g., cumene hydroperoxide-ferrous salt) as the initiator, whereby the polymer can be obtained. In the anionic polymerization method, a vinyl monomer is dissolved in an appropriate organic solvent, and the reaction is allowed to proceed usually under cooling by using a metal compound (e.g., butyllithium) as the initiator, whereby the polymer can be obtained.

Specific examples of the resin (A) for use in the present invention are set forth below, but the present invention is not limited thereto.

In specific examples, n represents a positive integer.

x, y and z define the molar ratio of the resin composition and in the case of a resin composed of two components, x=from 10 to 95 and y=from 5 to 90, preferably x=from 40 to 90 and y=from 10 to 60. In case of a resin composed of three components, x=from 10 to 90, y=from 5 to 85 and z=from 5 to 85, preferably x=from 40 to 80, y=from 10 to 50 and z=from 10 to 50. Also, one of these resins may be used alone, or two or more thereof may be mixed and used.

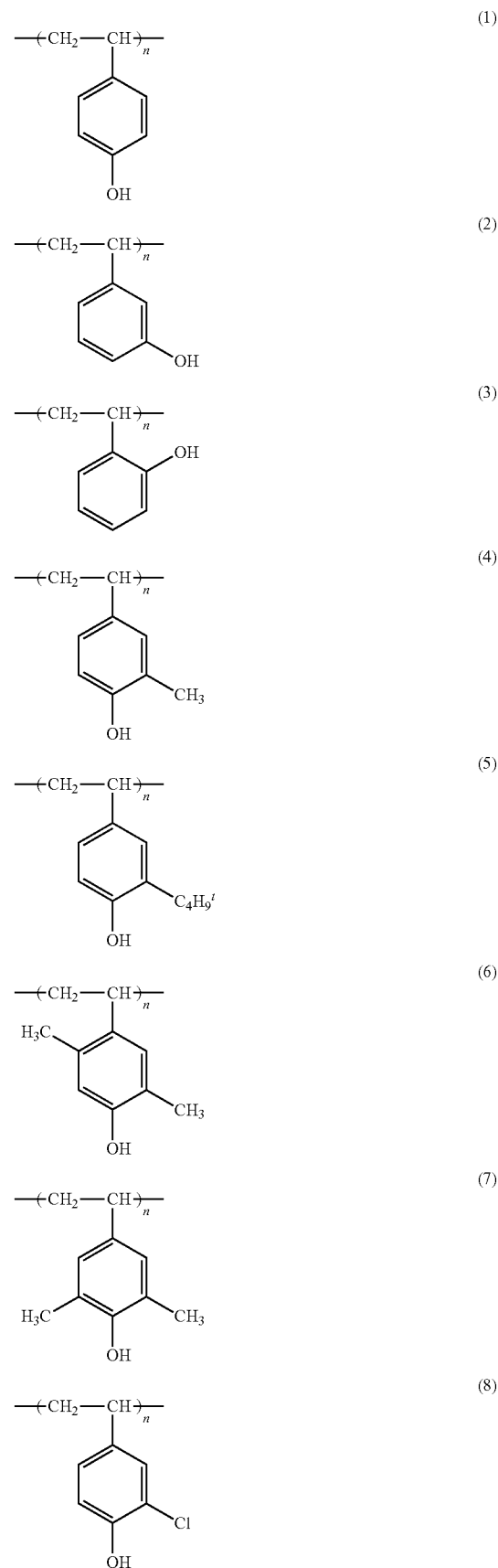

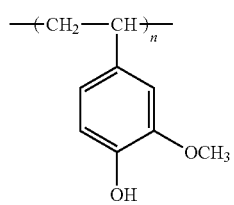
(9)
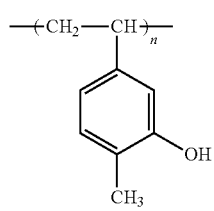
(10)
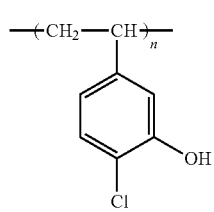
(11)
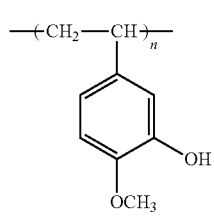
(12)
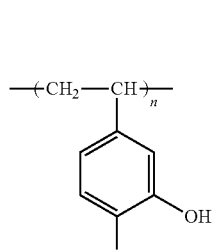
(13)
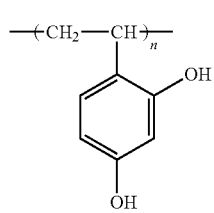
(14)
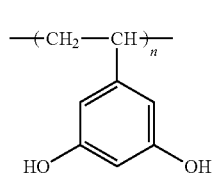
(15)
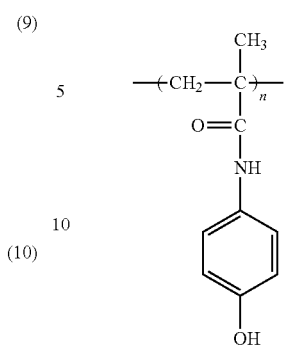
(16)
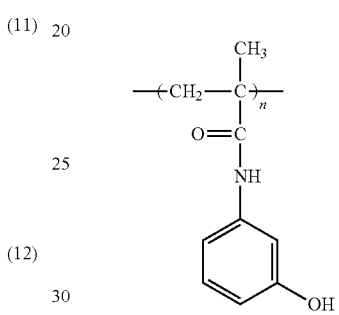
(17)
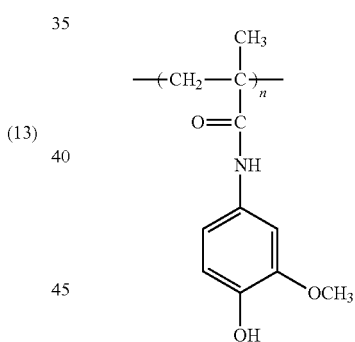
(18)
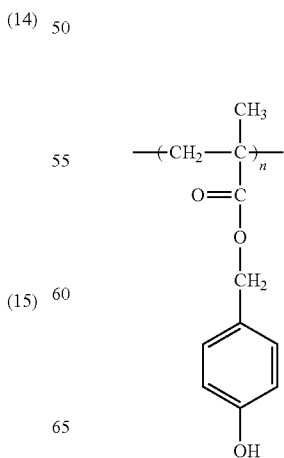
(19)

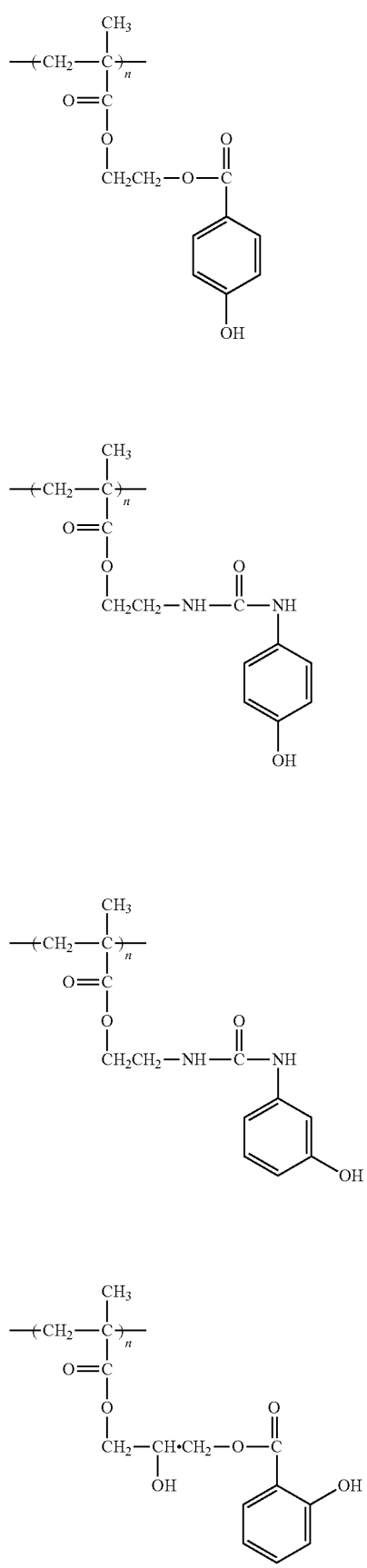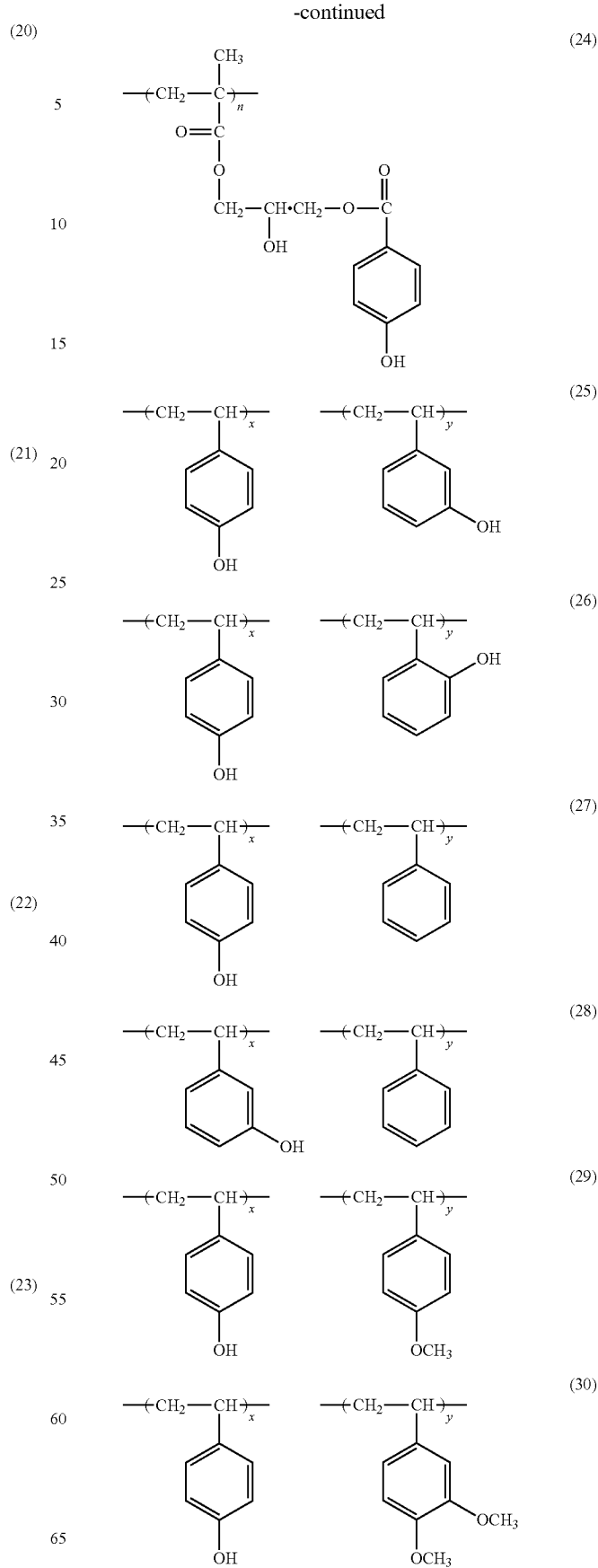

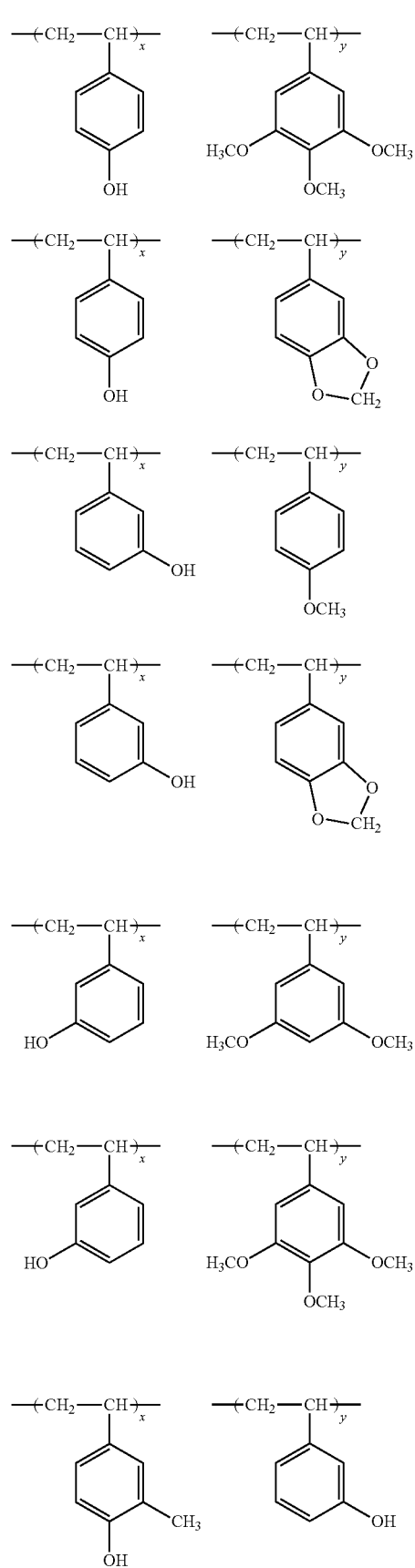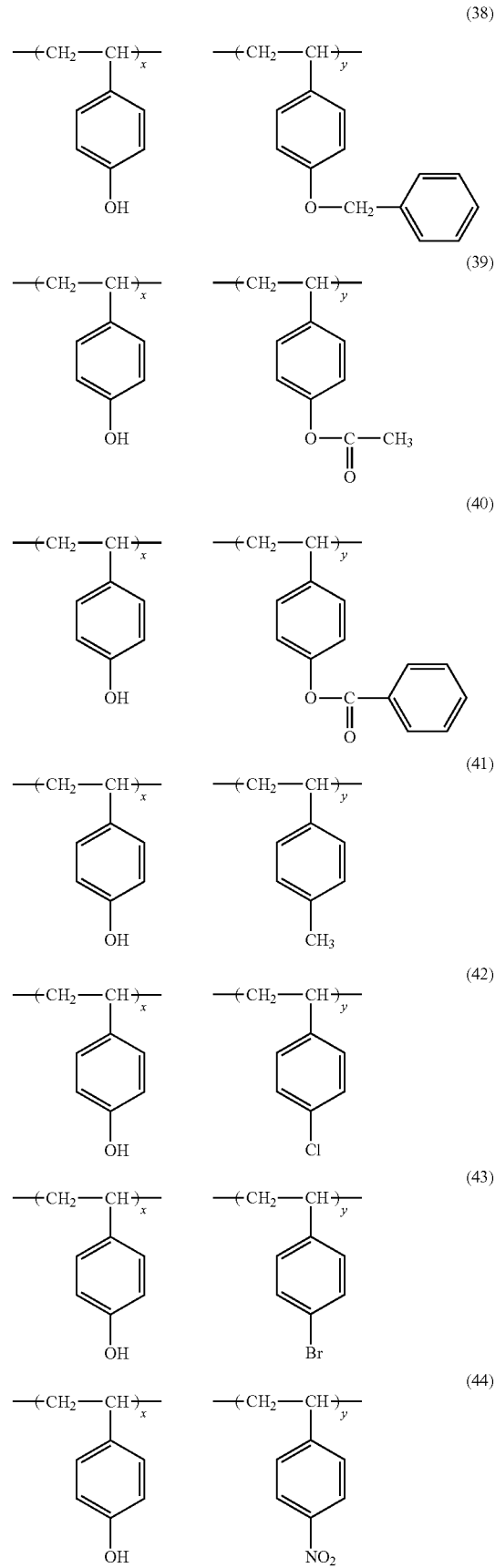

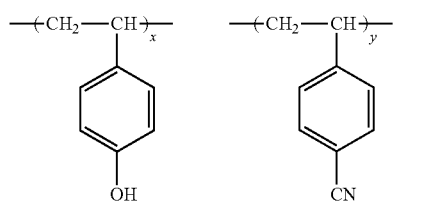
(45)
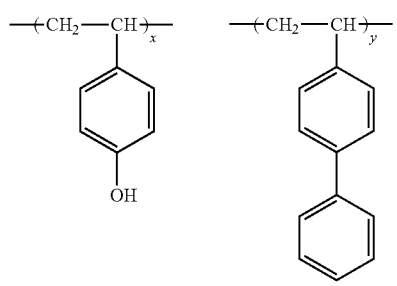
(46)
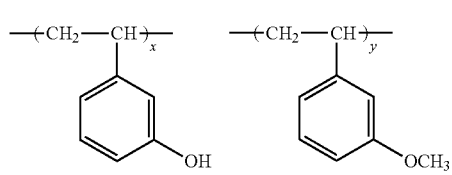
(47)
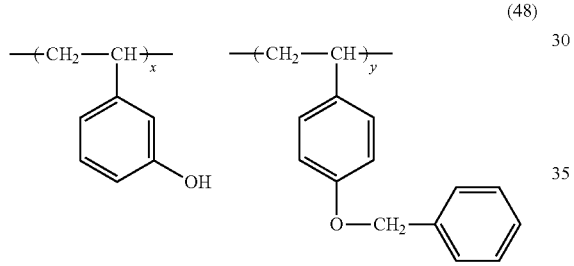
(48)
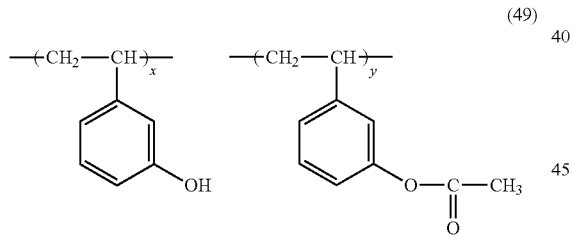
(49)
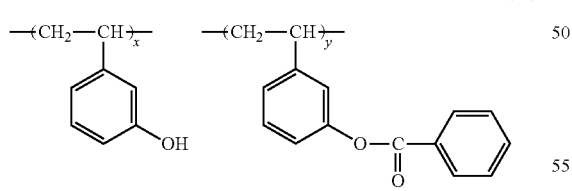
(50)
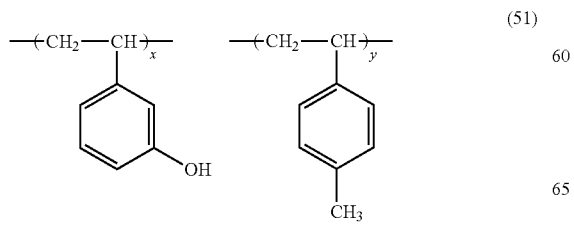
(51)
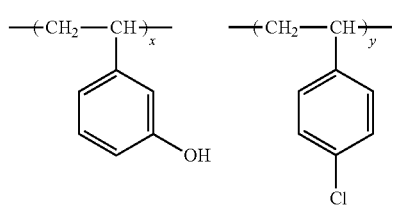
(52)
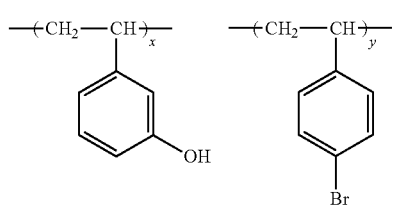
(53)
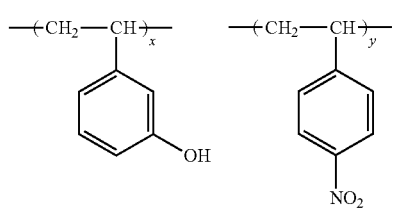
(54)
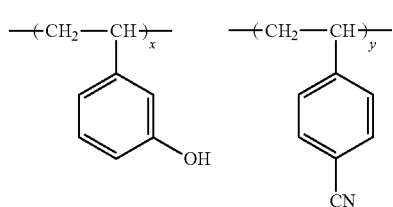
(55)
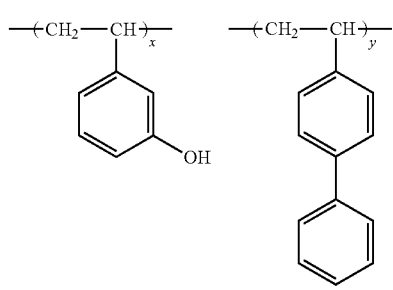
(56)
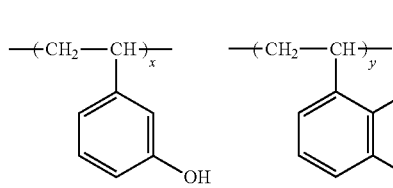
(57)
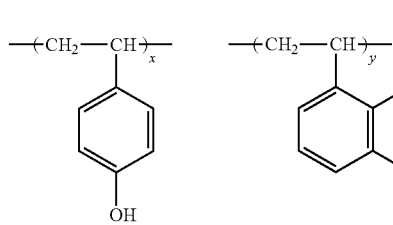
(58)

(59) 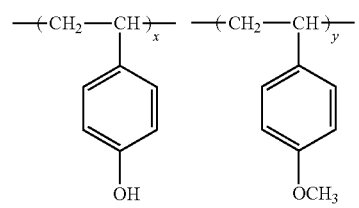
(60) 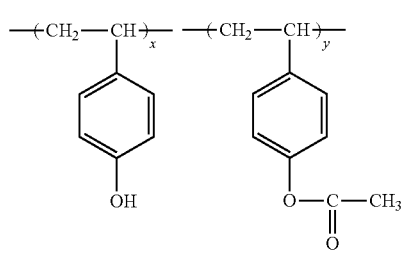
(61) 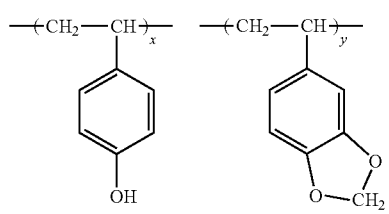
(62) 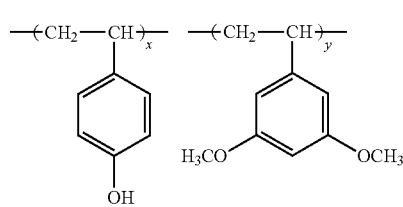
(63) 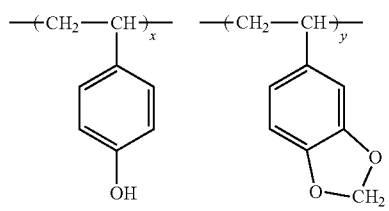
(64) 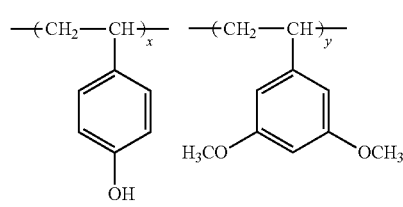
(65) 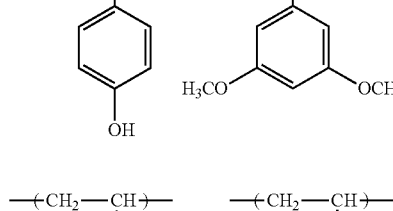
(66) 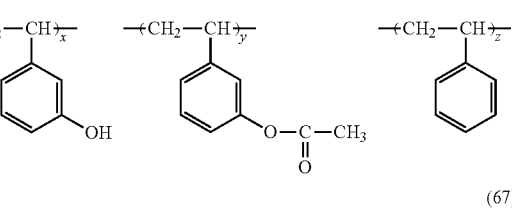
(67) 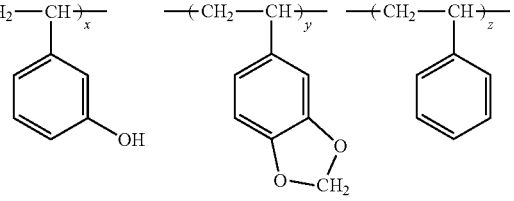
(68) 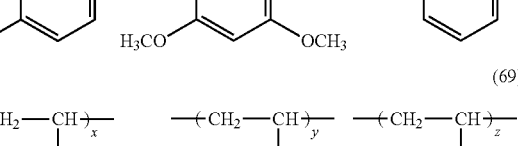
(69) 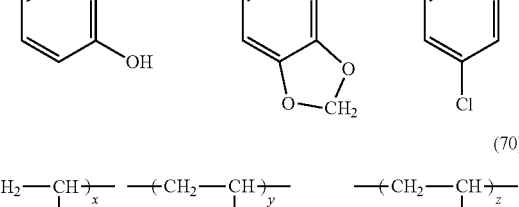
(70) 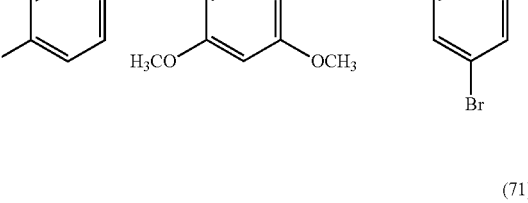
(71) 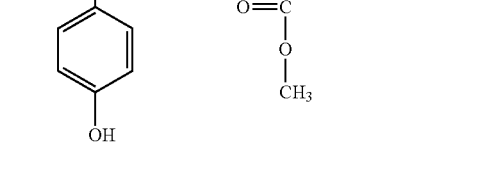
(72) 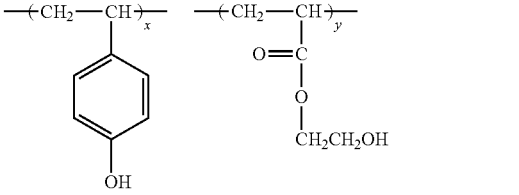

(73) 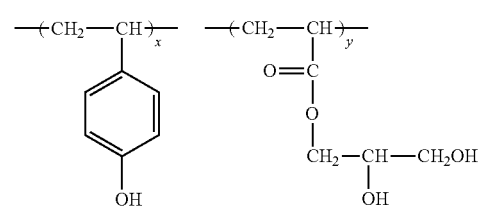
(74) 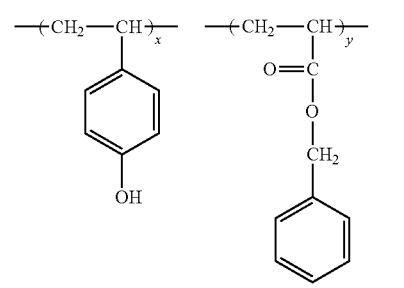
(75) 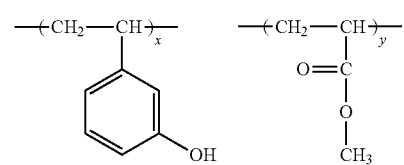
(76) 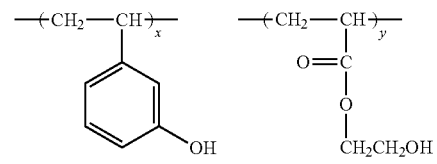
(77) 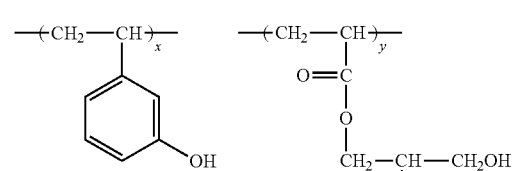
(78) 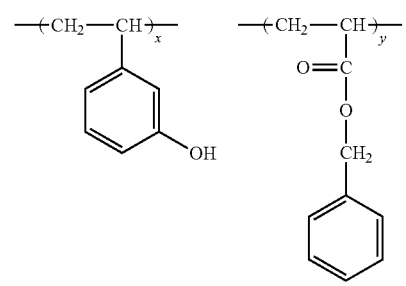
(79) 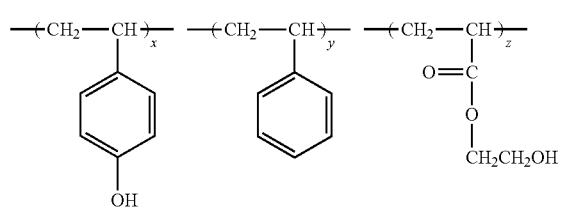
(80) 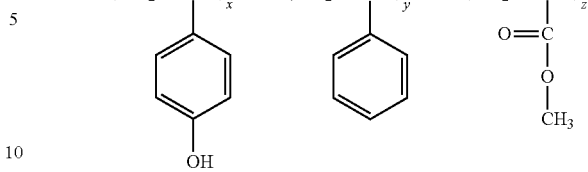
(81) 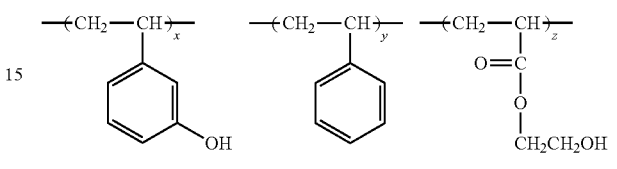
(82) 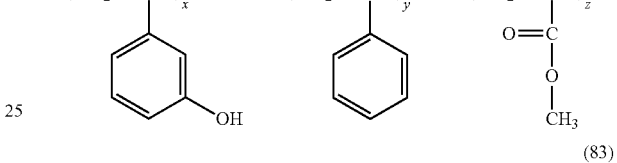
(83) 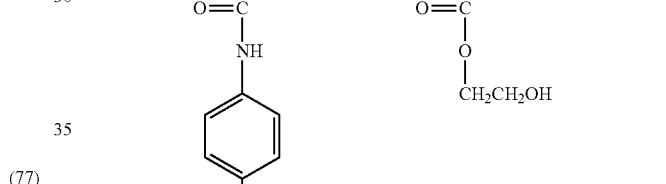
(84) 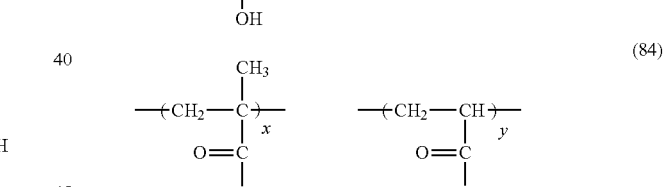
(85) 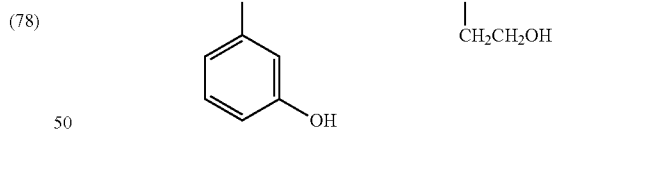
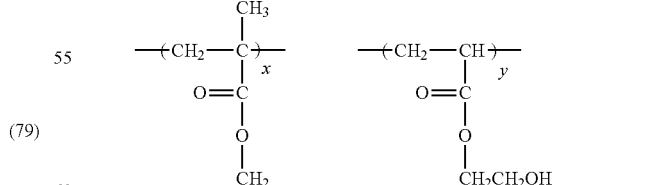
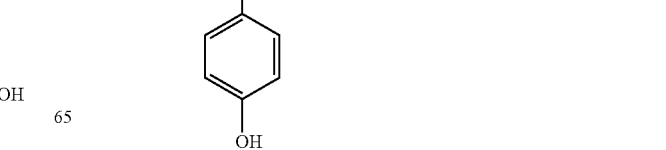

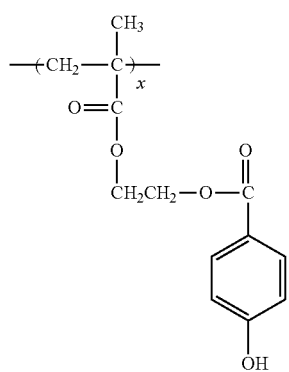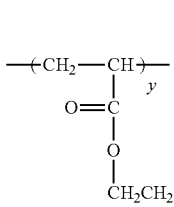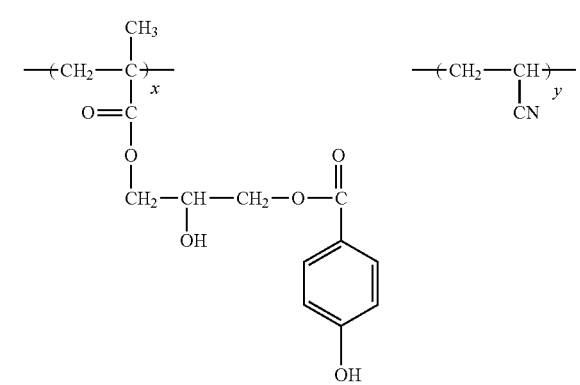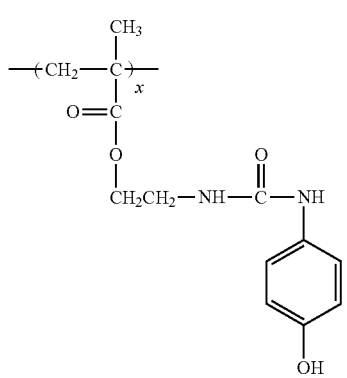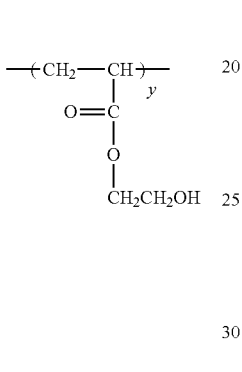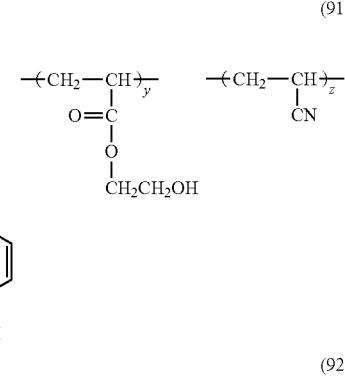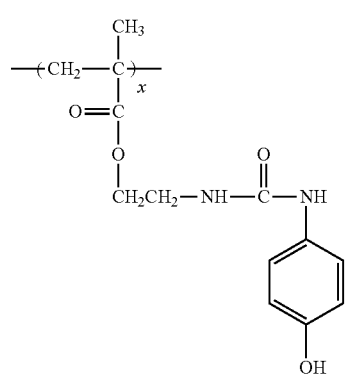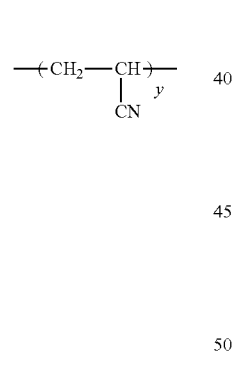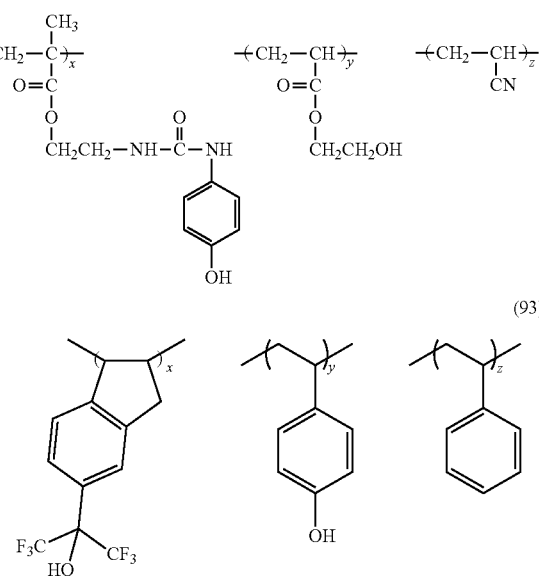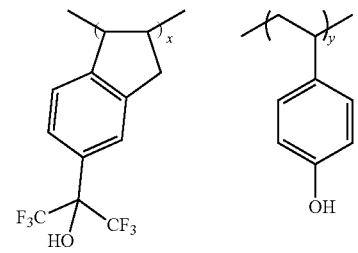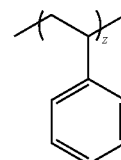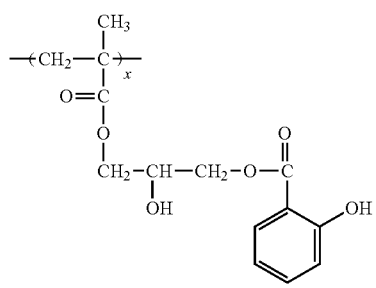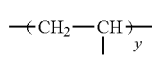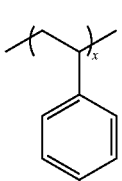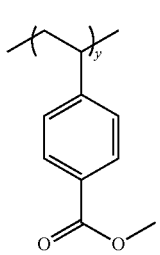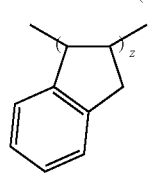

-continued

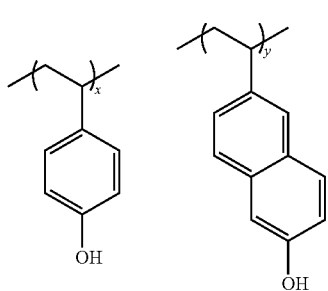

(95)

[2] (B) Crosslinking Agent

In the present invention, a compound capable of crosslinking the resin (A) by the action of an acid (hereinafter, referred to as a "crosslinking agent") is used together with the resin (A). A known crosslinking agent can be effectively used here.

The crosslinking agent (B) is, for example, a compound having a crosslinking group capable of crosslinking the resin (A) and is preferably a compound or resin having, as the crosslinking group, two or more hydroxymethyl groups, alkoxymethyl groups, acyloxymethyl groups or alkoxymethyl ether groups, or an epoxy compound.

More preferred examples thereof include an alkoxymethylated or acyloxymethylated melamine compound or resin, an alkoxymethylated or acyloxymethylated urea compound or resin, a hydroxymethylated or alkoxymethylated phenol compound or resin, and an alkoxymethyl-etherified phenol compound or resin.

Above all, the crosslinking agent (B) is preferably a phenol derivative having a molecular weight of 1,200 or less, containing from three to five benzene rings in the molecule and further having two or more hydroxymethyl groups or alkoxymethyl groups in total, where the hydroxymethyl groups or alkoxymethyl groups are bonded in a concentrated manner to at least any one benzene ring or distributed among the benzene rings. By virtue of using such a phenol derivative, the effects of the present invention are more remarkably brought out. The alkoxymethyl group bonded to the benzene ring is preferably an alkoxymethyl group having a carbon number of 6 or less, specifically, a methoxymethyl group, an ethoxymethyl group, an n-propoxymethyl group, an i-propoxymethyl group, an n-butoxymethyl group, an i-butoxymethyl group, a sec-butoxymethyl group, or a tert-butoxymethyl group. An alkoxy-substituted alkoxy group such as 2-methoxyethoxy group and 2-methoxy-1-propoxy group is also preferred.

The crosslinking agent (B) is preferably a phenol compound containing a benzene ring in the molecule, more preferably a phenol compound containing two or more benzene rings in the molecule, and is preferably a phenol compound containing no nitrogen atom.

Also, the crosslinking agent (B) is preferably a phenol compound having from two to eight crosslinking groups capable of crosslinking the resin (A) per molecule, and it is more preferred to have from three to six crosslinking groups.

Out of these phenol derivatives, particularly preferred compounds are set forth below. In the formulae, each of $L^1$ to $L^8$, which may be the same or different, represents a crosslinking group such as alkoxymethyl group, and the crosslinking group is preferably a hydroxymethyl group, a methoxymethyl group or an ethoxymethyl group

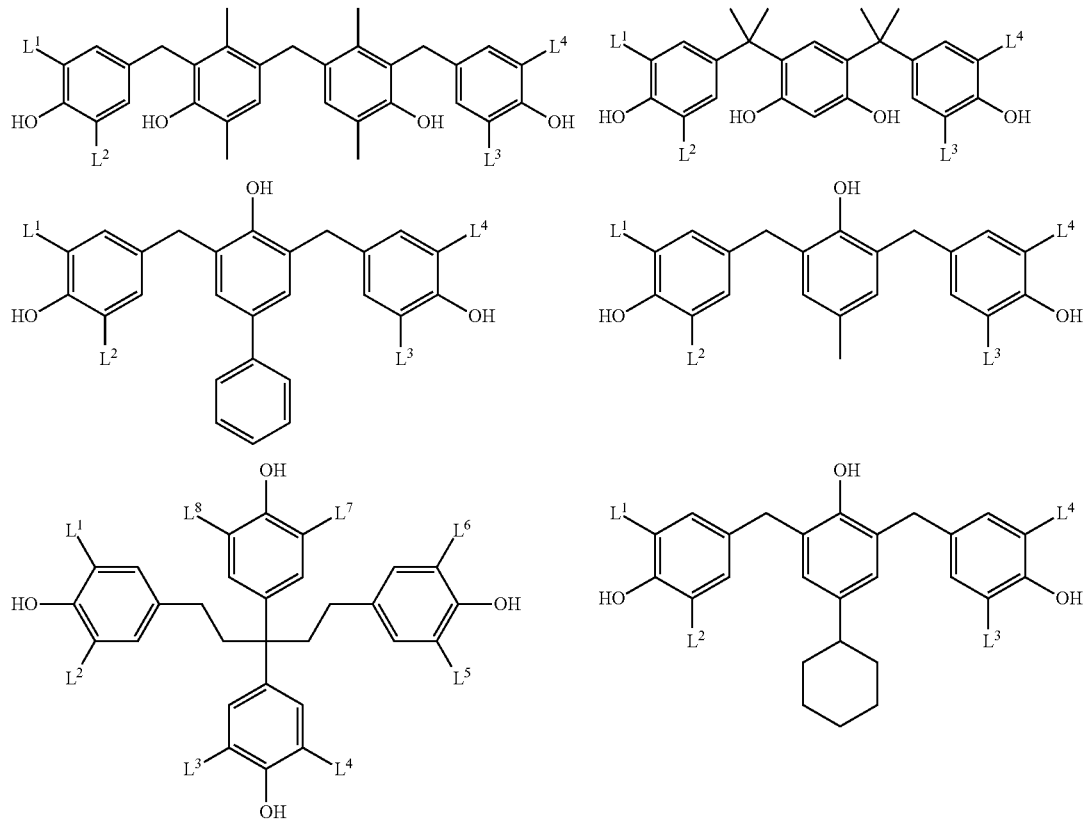

-continued
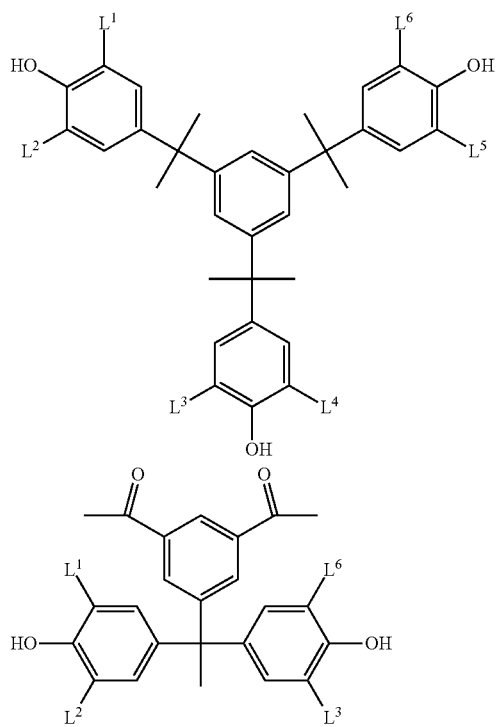
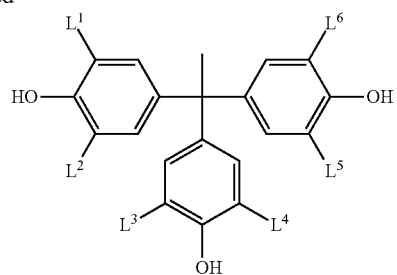
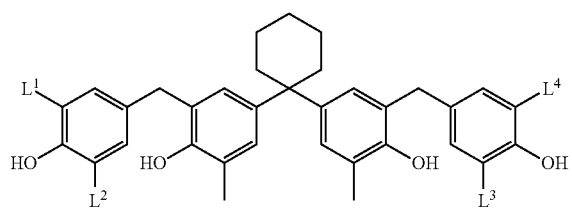
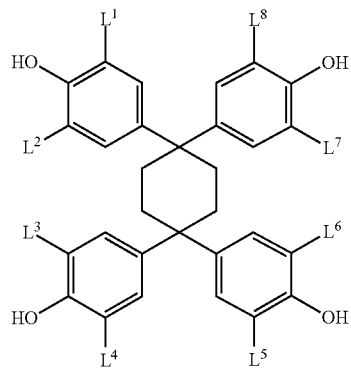
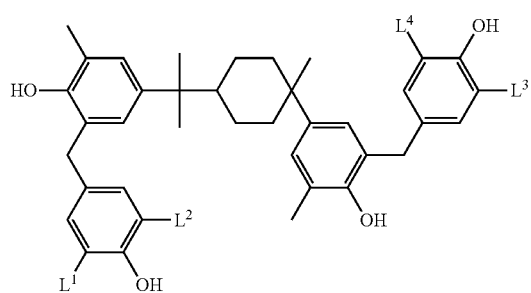
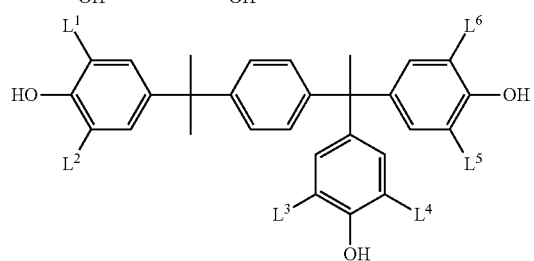
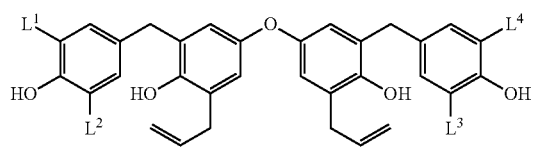
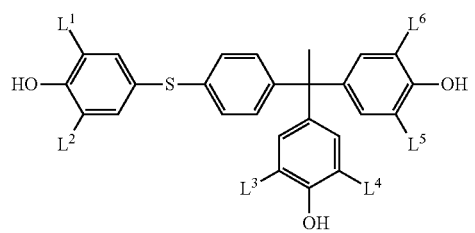

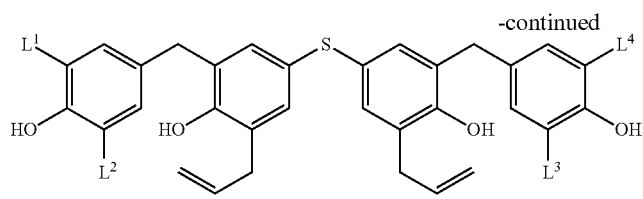

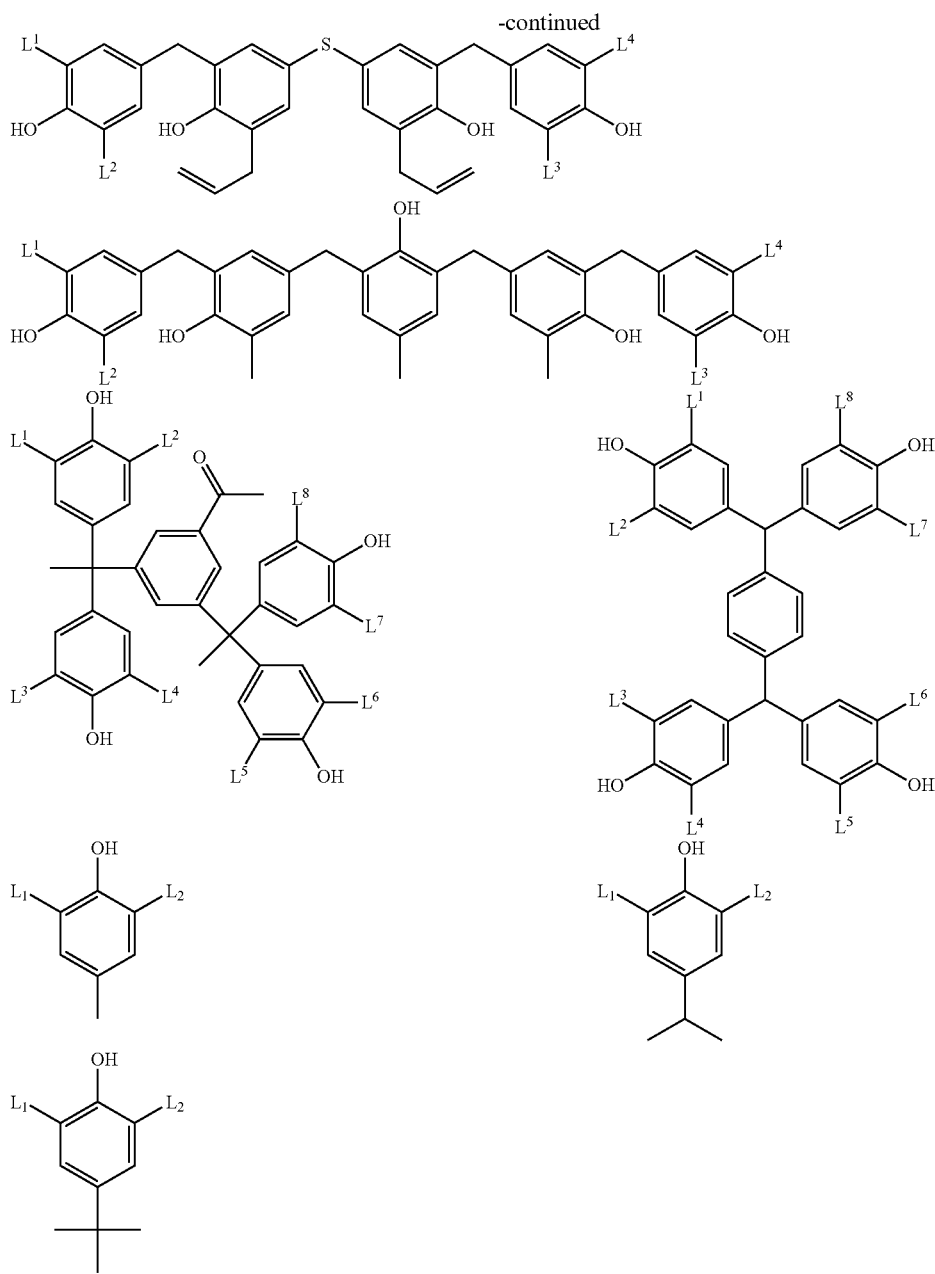

As for the crosslinking agent (B), a commercially available product may be used, or the compound may be synthesized by a known method. For example, a phenol derivative having a hydroxymethyl group can be obtained by reacting a phenol compound having no corresponding hydroxymethyl group (a compound where in the formulae above, each of $L^1$ to $L^8$ is a hydrogen atom) with formaldehyde in the presence of a base catalyst. At this time, in order to prevent resinification or gelling, the reaction is preferably performed at a temperature of 60° C. or less. Specifically, this compound can be synthesized by the method described, for example, in JP-A-6-282067 and JP-A-7-64285.

A phenol derivative having an alkoxymethyl group can be obtained by reacting a phenol derivative having a corresponding hydroxymethyl group with an alcohol in the presence of an acid catalyst. At this time, in order to prevent resinification or gelling, the reaction is preferably performed at a temperature of 100° C. or less. Specifically, this compound can be synthesized by the method described, for example, in EP-A-632003. The thus-synthesized phenol derivative having a hydroxymethyl group or an alkoxymethyl group is preferred in view of stability during storage, but a phenol derivative having an alkoxymethyl group is particularly preferred in view of stability during storage. One of these phenol derivatives having two or more hydroxymethyl groups or alkoxymethyl groups in total that are bonded in a concentrated manner to any one benzene ring or distributed among the benzene rings, may be used alone, or two or more thereof may be used in combination.

The crosslinking agent also includes (i) a compound having an N-hydroxymethyl group, an N-alkoxymethyl group or an N-acyloxymethyl group, and (ii) an epoxy compound, which are described below.

(i) The compound having an N-hydroxymethyl group, an N-alkoxymethyl group or an N-acyloxymethyl group is preferably a compound having two or more (preferably from two to eight) partial structures represented by the following formula (CLNM-1):

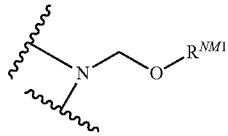

(CLNM-1)

In formula (CLNM-1), $R^{NM1}$ represents a hydrogen atom, an alkyl group, a cycloalkyl group or an oxoalkyl group.

The alkyl group of $R^{NM1}$ in formula (CLNM-1) is preferably a linear or branched alkyl group having a carbon number of 1 to 6, and the cycloalkyl group of $R^{NM1}$ is preferably a cycloalkyl group having a carbon number of 5 to 6. The oxoalkyl group of $R^{NM1}$ is preferably an oxoalkyl group having a carbon number of 3 to 6, and examples thereof include a β-oxopropyl group, a β-oxobutyl group, a β-oxopentyl group and a β-oxohexyl group.

More preferred embodiments of the compound having two or more partial structures represented by formula (CLNM-1) include a urea-based crosslinking agent represented by the following formula (CLNM-2), an alkylene urea-based crosslinking agent represented by the following formula (CLNM-3), a glycoluril-based crosslinking agent represented by the following formula (CLNM-4) and a melamine-based crosslinking agent represented by the following formula (CLNM-5).

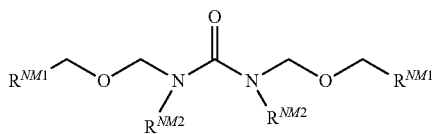

(CLNM-2)

In formula (CLNM-2), each $R^{NM1}$ independently has the same meaning as $R^{NM1}$ in formula (CLNM-1).

Each $R^{NM2}$ independently represents a hydrogen atom, an alkyl group (preferably having a carbon number of 1 to 6) or a cycloalkyl group (preferably having a carbon number of 5 to 6).

Specific examples of the urea-based crosslinking agent represented by formula (CLNM-2) include N,N-di(methoxymethyl)urea, N,N-di(ethoxymethyl)urea, N,N-di(propoxymethyl)urea, N,N-di(isopropoxymethyl)urea, N,N-di(butoxymethyl)urea, N,N-di(tert-butoxymethyl)urea, N,N-di(cyclohexyloxymethyl)urea, N,N-di(cyclopentyloxymethyl)urea, N,N-di(adamantyloxymethyl)urea and N,N-di(norbornyloxymethyl)urea.

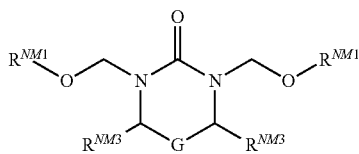

(CLNM-3)

In formula (CLNM-3), each $R^{NM1}$ independently has the same meaning as $R^{NM1}$ in formula (CLNM-1).

Each $R^{NM3}$ independently represents a hydrogen atom, a hydroxyl group, a linear or branched alkyl group (preferably having a carbon number of 1 to 6), a cycloalkyl group (preferably having a carbon number of 5 to 6), an oxoalkyl group (preferably having a carbon number of 1 to 6), an alkoxy group (preferably having a carbon number of 1 to 6) or an oxoalkoxy group (preferably having a carbon number of 1 to 6).

G represents a single bond, an oxygen atom, a sulfur atom, an alkylene group (preferably having a carbon number of 1 to 3) or a carbonyl group. Specific examples thereof include a methylene group, an ethylene group, a propylene group, a 1-methylethylene group, a hydroxymethylene group and a cyanomethylene group.

Specific examples of the alkylene urea-based crosslinking agent represented by formula (CLNM-3) include N,N-di(methoxymethyl)-4,5-di(methoxymethyl)ethylene urea, N,N-di(ethoxymethyl)-4,5-di(ethoxymethyl)ethylene urea, N,N-di(propoxymethyl)-4,5-di(propoxymethyl)ethylene urea, N,N-di(isopropoxymethyl)-4,5-di(isopropoxymethyl)ethylene urea, N,N-di(butoxymethyl)-4,5-di(butoxymethyl)ethylene urea, N,N-di(tert-butoxymethyl)-4,5-di(tert-butoxymethyl)ethylene urea, N,N-di(cyclohexyloxymethyl)-4,5-di(cyclohexyloxymethyl)ethylene urea, N,N-di(cyclopentyloxymethyl)-4,5-di(cyclopentyloxymethyl)ethylene urea, N,N-di(adamantyloxymethyl)-4,5-di(adamantyloxymethyl)ethylene urea and N,N-di(norbornyloxymethyl)-4,5-di(norbornyloxymethyl)ethylene urea.

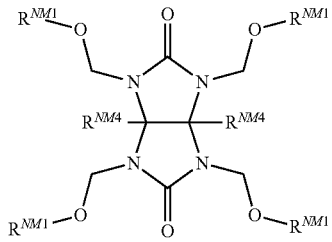

(CLNM-4)

In formula (CLNM-4), each $R^{NM1}$ independently has the same meaning as $R^{NM1}$ in formula (CLNM-1).

Each $R^{NM4}$ independently represents a hydrogen atom, a hydroxyl group, an alkyl group, a cycloalkyl group or an alkoxy group.

Specific examples of the alkyl group (preferably having a carbon number of 1 to 6), cycloalkyl group (preferably having a carbon number of 5 to 6) and alkoxy group (preferably having a carbon number of 1 to 6) of $R^{NM4}$ include a methyl group, an ethyl group, a butyl group, a cyclopentyl group, a cyclohexyl group, a methoxy group, an ethoxy group and a butoxy group.

Specific examples of the glycoluril-based crosslinking agent represented by formula (CLNM-4) include N,N,N,N-tetra(methoxymethyl)glycoluril, N,N,N,N-tetra(ethoxymethyl)glycoluril, N,N,N,N-tetra(propoxymethyl)glycoluril, N,N,N,N-tetra(isopropoxymethyl)glycoluril, N,N,N,N-tetra(butoxymethyl)glycoluril, N,N,N,N-tetra(tert-butoxymethyl)glycoluril, N,N,N,N-tetra(cyclohexyloxymethyl)glycoluril, N,N,N,N-tetra(cyclopentyloxymethyl)glycoluril, N,N,N,N-tetra(adamantyloxymethyl)glycoluril and N,N,N,N-tetra(norbornyloxymethyl)glycoluril.

(CLNM-5)

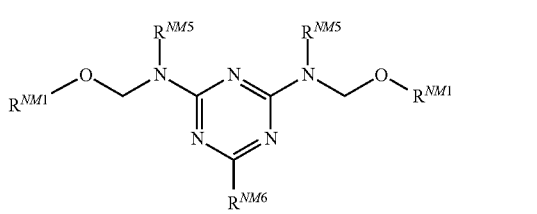

In formula (CLNM-5), each $R^{NM1}$ independently has the same meaning as $R^{NM1}$ in formula (CLNM-1).

Each $R^{NM5}$ independently represents a hydrogen atom, an alkyl group, a cycloalkyl group, an aryl group or an atomic group represented by the following formula (CLNM-5').

$R^{NM6}$ represents a hydrogen atom, an alkyl group, a cycloalkyl group, an aryl group or an atomic group represented by the following formula (CLNM-5").

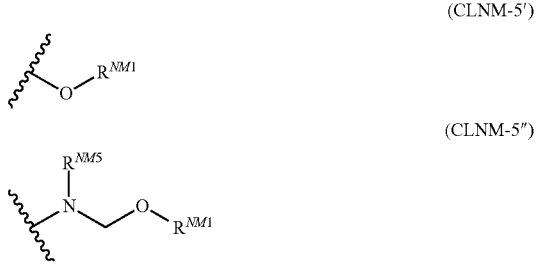

(CLNM-5')

(CLNM-5")

In formula (CLNM-5'), $R^{NM1}$ has the same meaning as $R^{NM1}$ in formula (CLNM-1).

In formula (CLNM-5"), $R^{NM1}$ has the same meaning as $R^{NM1}$ in formula (CLNM-1), and $R^{NM5}$ has the same meaning as $R^{NM5}$ in formula (CLNM-5).

More specific examples of the alkyl group (preferably having a carbon number of 1 to 6), cycloalkyl group (preferably having a carbon number of 5 to 6) and aryl group (preferably having a carbon number of 6 to 10) of $R^{NM5}$ and $R^{NM6}$ include a methyl group, an ethyl group, a propyl group, an isopropyl group, a butyl group, an isobutyl group, a tert-butyl group, a pentyl group, a cyclopentyl group, a hexyl group, a cyclohexyl group, a phenyl group and a naphthyl group.

Examples of the melamine-based crosslinking agent represented by formula (CLNM-5) include N,N,N,N,N,N-hexa(methoxymethyl)melamine, N,N,N,N,N,N-hexa(ethoxymethyl)melamine, N,N,N,N,N,N-hexa(propoxymethyl)melamine, N,N,N,N,N,N-hexa(isopropoxymethyl)melamine, N,N,N,N,N,N-hexa(butoxymethyl)melamine, N,N,N,N,N,N-hexa(tert-butoxymethyl)melamine, N,N,N,N,N,N-hexa(cyclohexyloxymethyl)melamine, N,N,N,N,N,N-hexa(cyclopentyloxymethyl)melamine, N,N,N,N,N,N-hexa(adamantyloxymethyl)melamine, N,N,N,N,N,N-hexa(norbornyloxymethyl)melamine, N,N,N,N,N,N-hexa(methoxymethyl)acetoguanamine, N,N,N,N,N,N-hexa(ethoxymethyl)acetoguanamine, N,N,N,N,N,N-hexa(propoxymethyl)acetoguanamine, N,N,N,N,N,N-hexa(isopropoxymethyl)acetoguanamine, N,N,N,N,N,N-hexa(butoxymethyl)acetoguanamine, N,N,N,N,N,N-hexa(tert-butoxymethyl)acetoguanamine, N,N,N,N,N,N-hexa(methoxymethyl)benzoguanamine, N,N,N,N,N,N-hexa(ethoxymethyl)benzoguanamine, N,N,N,N,N,N-hexa(propoxymethyl)benzoguanamine, N,N,N,N,N,N-hexa(isopropoxymethyl)benzoguanamine, N,N,N,N,N,N-hexa(butoxymethyl)benzoguanamine and N,N,N,N,N,N-hexa(tert-butoxymethyl)benzoguanamine.

The groups represented by $R^{NM1}$ to $R^{NM6}$ in formulae (CLNM-1) to (CLNM-5) may further have a substituent. Examples of the substituent which $R^{NM1}$ to $R^{NM6}$ may have include a halogen atom, a hydroxyl group, a nitro group, a cyano group, a carboxyl group, a cycloalkyl group (preferably having a carbon number of 3 to 20), an aryl group (preferably having a carbon number of 6 to 14), an alkoxy group (preferably having a carbon number of 1 to 20), a cycloalkoxy group (preferably having a carbon number of 3 to 20), an acyl group (preferably having a carbon number of 2 to 20) and an acyloxy group (preferably having a carbon number of 2 to 20).

Specific examples of the compound having two or more partial structures represented by formula (CLNM-1) are set forth below, but the present invention is not limited thereto.

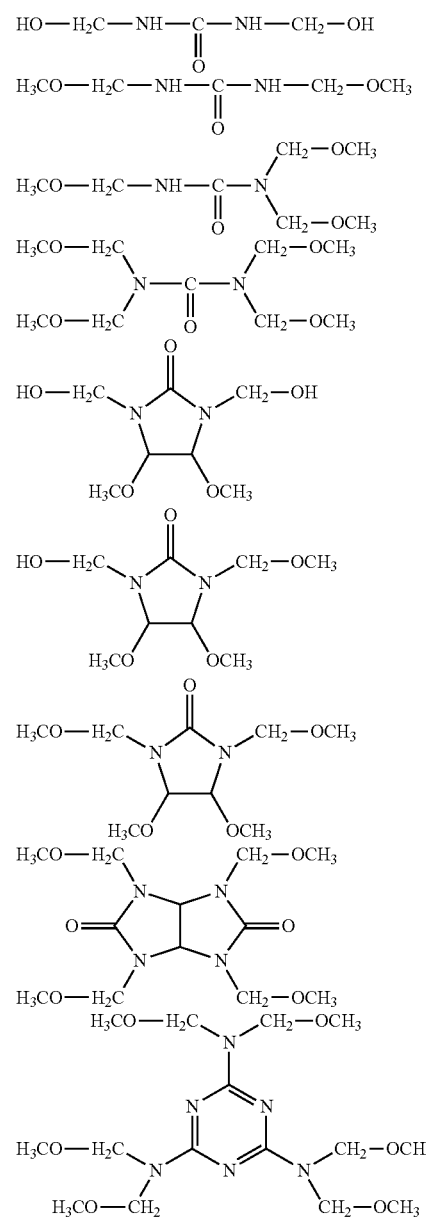

(ii) The epoxy compound includes a compound represented by the following formula (EP1):

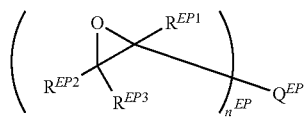

In formula (EP1), each of $R^{EP1}$ to $R^{EP3}$ independently represents a hydrogen atom, a halogen atom, an alkyl group or a cycloalkyl group, and these alkyl group and cycloalkyl group may have a substituent. Also, $R^{EP1}$ and $R^{EP2}$, or $R^{EP2}$ and $R^{EP3}$ may combine with each other to form a ring structure.

Examples of the substituent which the alkyl group and cycloalkyl group may have include a hydroxyl group, a cyano group, an alkoxy group, an alkylcarbonyl group, an alkoxycarbonyl group, an alkylcarbonyloxy group, an alkylthio group, an alkylsulfone group, an alkylsulfonyl group, an alkylamino group and an alkylamide group.

$Q^{EP}$ represents a single bond or an $n^{EP}$-valent organic group. $R^{EP1}$ to $R^{EP3}$ may combine not only with each other but also with $Q^{EP}$ to form a ring structure.

$n^{EP}$ represents an integer of 2 or more and is preferably an integer of 2 to 10, more preferably from 2 to 6. However, when $Q^{EP}$ is a single bond, $n^{EP}$ is 2.

In the case where $Q^{EP}$ is an $n^{EP}$-valent organic group, the organic group is preferably, for example, a chain or cyclic $n^{EP}$-valent saturated hydrocarbon group (preferably having a carbon number of 2 to 20), an $n^{EP}$-valent aromatic ring group (preferably having a carbon number of 6 to 30), or an $n^{EP}$-valent organic group having a structure where a divalent linking group such as ether, ester, amide, sulfonamide and alkylene (preferably an alkylene having a carbon number of 1 to 4, more preferably methylene), a trivalent linking group such as $-N(-)_2$, or a combination thereof is linked to a chain or cyclic saturated hydrocarbon or aromatic hydrocarbon.

Specific examples of (B) the compound having an epoxy structure are set forth below, but the present invention is not limited thereto.

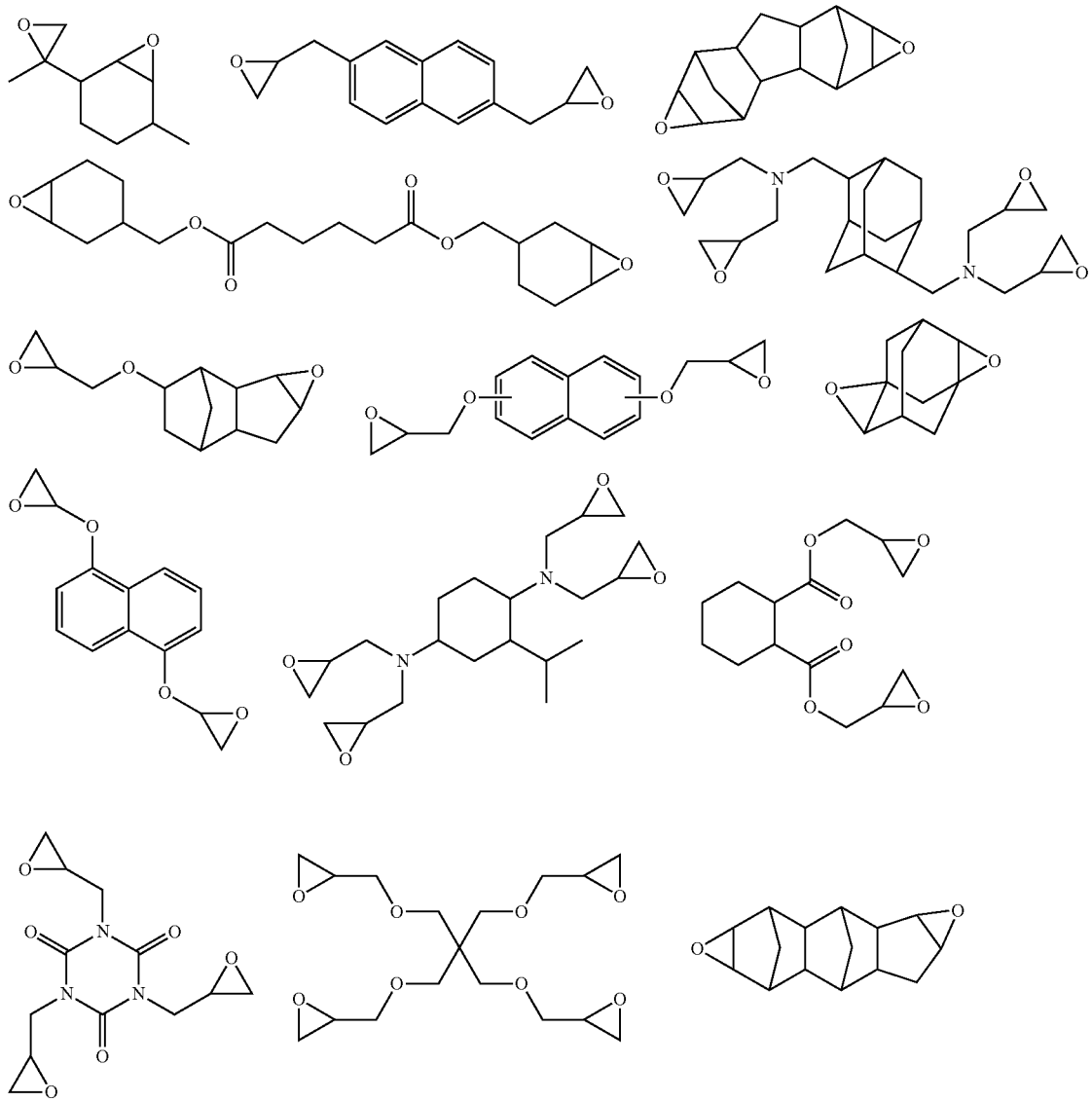

-continued
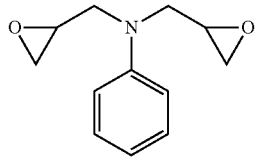 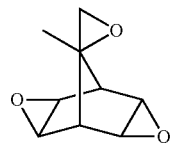 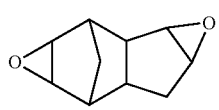 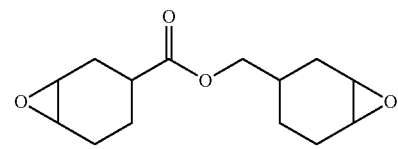
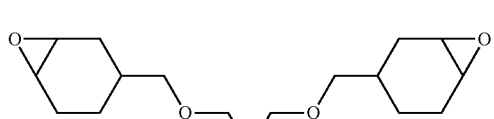
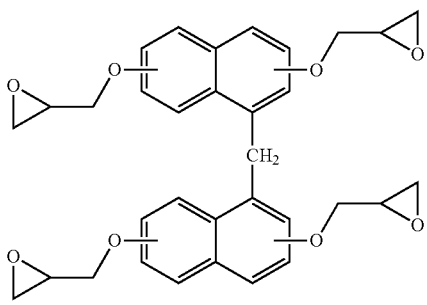
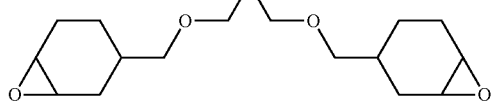
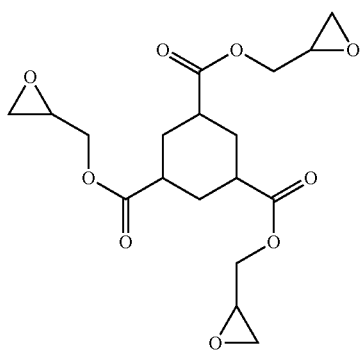
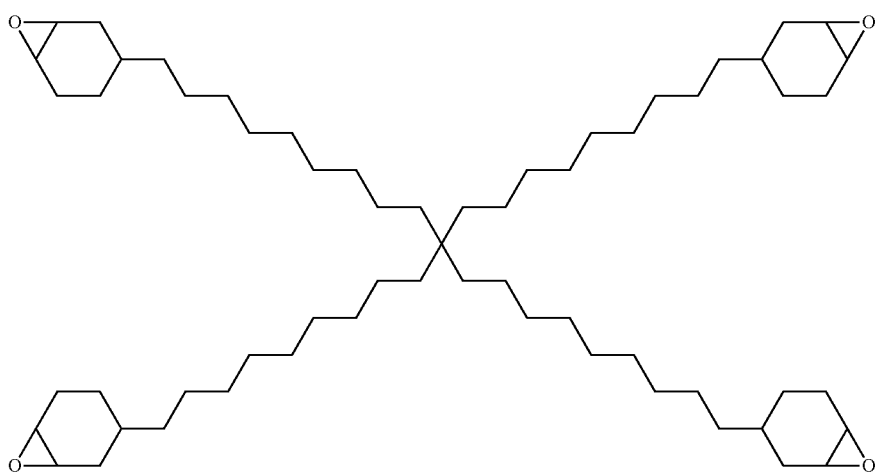

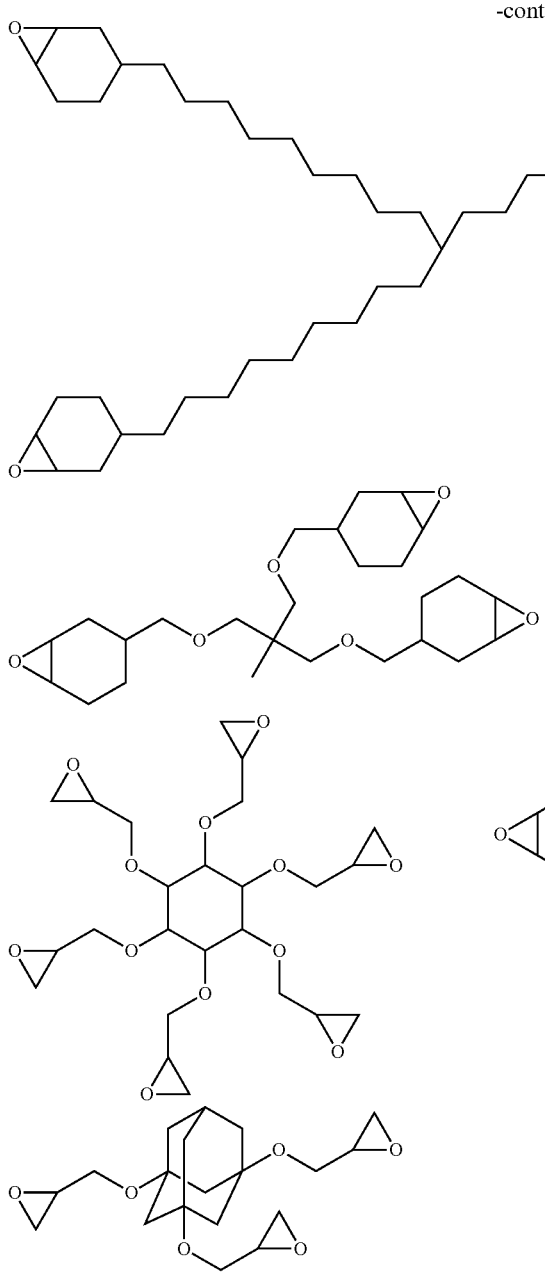
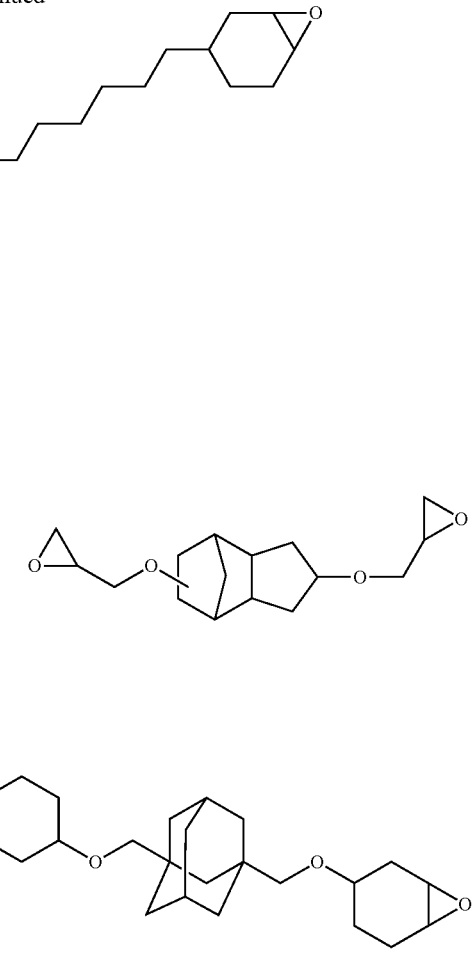

From the standpoint of preventing reduction of the residual film ratio and resolution and at the same time, keeping good the stability of the resist solution during storage, the crosslinking agent is added in an amount of preferably from 3 to 65 mass %, more preferably from 5 to 50 mass %, still more preferably from 10 to 45 mass %, based on the entire solid content of the resist composition.

In the present invention, one kind of a crosslinking agent may be used alone, or two or more kinds of crosslinking agents may be used in combination. For example, in the case of using, in addition to the above-described phenol derivative, other crosslinking agents such as (i) and (ii) above in combination, the ratio between the phenol derivative and the other crosslinking agent(s) is, in terms of molar ratio, from 100/0 to 20/80, preferably from 90/10 to 40/60, more preferably from 80/20 to 50/50.

[3] (C) Compound Capable of Generating an Acid Upon Irradiation with an Actinic Ray or Radiation The composition of the present invention contains a compound capable of generating an acid upon irradiation with an actinic ray or radiation (hereinafter, sometimes referred to as an "acid generator").

The acid generator is not particularly limited as long as it is a known acid generator, but a compound capable of generating an organic acid, for example, at least any one of a sulfonic acid, a bis(alkylsulfonyl)imide and a tris(alkylsulfonyl)methide, upon irradiation with an actinic ray or radiation is preferred.

More preferred are compounds represented by the following formulae (ZI), (ZII) and (ZIII):

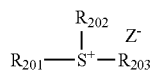

(ZI)

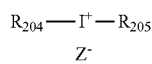

(ZII)

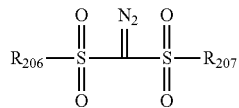

(ZIII)

In formula (ZI), each of $R_{201}$, $R_{202}$ and $R_{203}$ independently represents an organic group. The number of carbons in the organic group as $R_{201}$, $R_{202}$ and $R_{203}$ is generally from 1 to 30, preferably from 1 to 20.

Examples of the organic group of $R_{201}$, $R_{202}$ and $R_{203}$ include an aryl group, an alkyl group and a cycloalkyl group.

The aryl group of $R_{201}$, $R_{202}$ and $R_{203}$ is usually an aryl group having a carbon number of 6 to 20, preferably an aryl group having a carbon number of 6 to 10, more preferably a phenyl group or a naphthyl group, still more preferably a phenyl group. The aryl group may be an aryl group having a heterocyclic structure containing an oxygen atom, a nitrogen atom, a sulfur atom or the like. Examples of the heterocyclic structure include pyrrole, furan, thiophene, indole, benzofuran and benzothiophene.

The alkyl group and cycloalkyl group of $R_{201}$, $R_{202}$ and $R_{203}$ are preferably a linear or branched alkyl group having a carbon number of 1 to 10 and a cycloalkyl group having a carbon number of 3 to 10. The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

Each of $R_{201}$, $R_{202}$ and $R_{203}$ may be further substituted by a halogen atom, an alkoxy group (for example, having a carbon number of 1 to 5), a hydroxyl group, a cyano group, a nitro group or the like.

Two members out of $R_{201}$ to $R_{203}$ may combine to form a ring structure (preferably a 3- to 15-membered ring), and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion (an anion having an extremely low ability of causing a nucleophilic reaction).

Examples of the non-nucleophilic anion include a sulfonate anion (such as aliphatic sulfonate anion, aromatic sulfonate anion and camphorsulfonate anion), a carboxylate anion (such as aliphatic carboxylate anion, aromatic carboxylate anion and aralkylcarboxylate anion), a sulfonylimide anion, a bis(alkylsulfonyl)imide anion and a tris(alkylsulfonyl)methide anion.

The aliphatic moiety in the aliphatic sulfonate anion and aliphatic carboxylate anion may be an alkyl group or a cycloalkyl group but is preferably a linear or branched alkyl group having a carbon number of 1 to 30 or a cycloalkyl group having a carbon number of 3 to 30.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Specific examples thereof include a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20).

As for the aryl group or ring structure in each group, examples of the substituent further include an alkyl group (preferably having a carbon number of 1 to 15).

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples of the substituent of this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom and a fluorine atom-substituted alkyl group being preferred.

Also, the alkyl groups in the bis(alkylsulfonyl)imide anion may combine with each other to form a ring structure. In this case, the acid strength increases.

Other examples of the non-nucleophilic anion include fluorinated phosphorus (e.g., $PF_6^-$), fluorinated boron (e.g., $BF_4^-$) and fluorinated antimony (e.g., $SbF_6^-$).

The non-nucleophilic anion is preferably an aliphatic sulfonate anion substituted by a fluorine atom at the α-position of the sulfonic acid, an aromatic sulfonate anion substituted by a fluorine atom or a fluorine atom-containing group, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion (preferably having a carbon number of 4 to 8) or a fluorine atom-containing benzenesulfonate anion, still more preferably nonafluorobutanesulfonate anion, perfluorooctanesulfonate anion, pentafluorobenzenesulfonate anion or 3,5-bis(trifluoromethyl)benzenesulfonate anion.

As regards the acid strength, the pKa of the acid generated is preferably −1 or less for enhancing the sensitivity.

An anion represented by the following formula (AN1) is also a preferred embodiment of the non-nucleophilic anion.

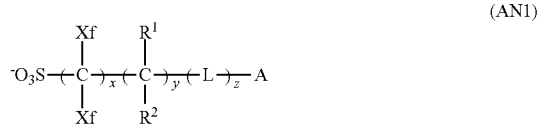

In the formula, each Xf independently represents a fluorine atom or an alkyl group substituted by at least one fluorine atom.

Each of $R^1$ and $R^2$ independently represents a group selected from a hydrogen atom, a fluorine atom and an alkyl group, and when a plurality of $R^1$'s or $R^2$'s are present, these may be the same or different.

L represents a divalent linking group, and when a plurality of L's are present, these may be the same or different.

A represents a group having a cyclic structure.

x represents an integer of 1 to 20, y represents an integer of 0 to 10, and z represents an integer of 0 to 10.

Formula (AN1) is described in more detail.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples thereof include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xf's are a fluorine atom.

The alkyl group of $R^1$ and $R^2$ may have a substituent (preferably a fluorine atom) and is preferably an alkyl group having a carbon number of 1 to 4, more preferably a perfluoroalkyl group having a carbon number of 1 to 4. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R^1$ and $R^2$ is preferably a fluorine atom or $CF_3$.

x is preferably an integer of 1 to 10, more preferably from 1 to 5.

y is preferably an integer of 0 to 4, more preferably 0.

z is preferably an integer of 0 to 5, more preferably from 0 to 3.

The divalent linking group of L is not particularly limited and includes —COO—, —OCO—, —CO—, —O—, —S—, —SO—, —SO$_2$—, an alkylene group, a cycloalkylene group, an alkenylene group, and a linking group formed by linking a plurality of these groups. A linking group having a total carbon number of 12 or more is preferred. Among these, —COO—, —OCO—, —CO—, —O— and —SO$_2$— are preferred, and —COO—, —OCO— and —SO$_2$— are more preferred.

The group having a ring structure of A is not particularly limited as long as it has a cyclic structure, and examples thereof include an alicyclic group, an aryl group and a heterocyclic structure-containing group (including not only those having aromaticity but also those having no aromaticity).

The alicyclic group may be monocyclic or polycyclic and is preferably a monocyclic cycloalkyl group such as cyclopentyl group, cyclohexyl group and cyclooctyl group, or a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that the diffusion in the film during heating after exposure can be suppressed and MEEF can be improved.

Examples of the aryl group include a benzene ring, a naphthalene ring, a phenanthrene ring and an anthracene ring.

Examples of the heterocyclic structure-containing group include a furan ring, a thiophene ring, a benzofuran ring, a benzothiophene ring, a dibenzofuran ring, a dibenzothiophene ring and a pyridine ring. Among these, a furan ring, a thiophene ring and a pyridine ring are preferred.

The above-described cyclic structure-containing group may have a substituent, and examples of the substituent include an alkyl group (may be linear, branched or cyclic; preferably having a carbon number of 1 to 12), an aryl group (preferably having a carbon number of 6 to 14), a hydroxy group, an alkoxy group (preferably having a carbon number of 1 to 12), a ureido group, a sulfonamido group (preferably having a carbon number of 0 to 12), and a group (preferably having a carbon number of 1 to 12) having an ester group, an amido group, a urethane group, a thioether group or a sulfonic acid ester group.

At least one of $R_{201}$, $R_{202}$ and $R_{203}$ is preferably an aryl group, and it is more preferred that those three members all are an aryl group. The aryl group may be, for example, a phenyl group or a naphthyl group and may also be a heteroaryl group such as indole residue and pyrrole residue. This aryl group may further have a substituent, and examples of the substituent include, but are not limited to, a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12) and an alkoxycarbonyloxy group (preferably having a carbon number of 2 to 7).

In the case where two members out of $R_{201}$ to $R_{203}$ are combined to form a ring structure, the ring structure is preferably a structure represented by the following formula (A1):

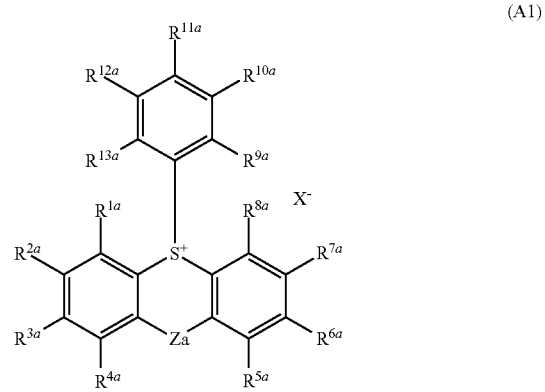

In formula (A1), each of $R^{1a}$ to $R^{13a}$ independently represents a hydrogen atom, a halogen atom, a nitro group or an organic group.

From one to three members out of $R^{1a}$ to $R^{13a}$ are preferably not a hydrogen atom, and it is more preferred that at least any one of $R^{9a}$ to $R^{13a}$ is not a hydrogen atom.

Za represents a single bond or a divalent linking group.

$X^-$ has the same meaning as $Z^-$ in formula (ZI).

Specific examples of $R^{1a}$ to $R^{13a}$ when these are not a hydrogen atom include a halogen atom, a nitro group, a linear, branched or cyclic alkyl group, an alkenyl group, an alkynyl group, an aryl group, a heterocyclic group, a cyano group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an acylamino group, an aminocarbonylamino group, an alkoxycarbonylamino group, an aryloxycarbonylamino group, a sulfamoylamino group, an alkylsulfonylamino group, an arylsulfonylamino group, an alkylthio group, an arylthio group, a heterocyclic thio group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, a phosphinylamino group, a silyl group, a ureido group, and other known organic groups.

$R^{1a}$ to $R^{13a}$ are, when these are not a hydrogen atom, preferably a linear, branched or cyclic alkyl group substituted by a hydroxyl group.

Examples of the divalent linking group of Za include an alkylene group, an arylene group, a carbonyl group, a sulfonyl group, a carbonyloxy group, a carbonylamino group, a sulfonylamide group, —O—, —S—, an amino group, a disulfide group, —(CH$_2$)$_n$—CO—, —(CH$_2$)$_n$—SO$_2$—, —CH=CH—, an aminocarbonylamino group and an aminosulfonylamino group (n is an integer of 1 to 3).

Incidentally, preferred examples of the structure where at least one of $R_{201}$, $R_{202}$ and $R_{203}$ is not an aryl group include a cation structure such as compounds described in paragraphs 0046 and 0047 of JP-A-2004-233661 and paragraphs 0040 to 0046 of JP-A-2003-35948, compounds illustrated as formulae (I-1) to (1-70) in U.S. Patent Application Publication No. 2003/0224288A1, and compounds illustrated as formulae (IA-1) to (IA-54) and formulae (IB-1) to (IB-24) in U.S. Patent Application Publication No. 2003/0077540 A1.

In formulae (ZII) and (ZIII), each of $R_{204}$ to $R_{207}$ independently represents an aryl group, an alkyl group or a cycloalkyl group.

The aryl group, alkyl group and cycloalkyl group of $R_{204}$ to $R_{207}$ are the same as the aryl group, alkyl group and cycloalkyl group of $R_{201}$ to $R_{203}$ in the compound (ZI).

The aryl group, alkyl group and cycloalkyl group of $R_{204}$ to $R_{207}$ may have a substituent. Examples of the substituent include those of the substituent which the aryl group, alkyl group and cycloalkyl group of $R_{201}$ to $R_{203}$ in the compound (ZI) may have.

$Z^-$ represents a non-nucleophilic anion, and examples thereof are the same as those of the non-nucleophilic anion of $Z^-$ in formula (ZI).

The acid generator further includes compounds represented by the following formulae (ZIV), (ZV) and (ZVI):

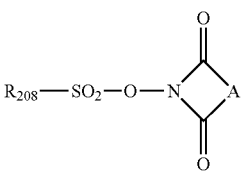

(ZIV)

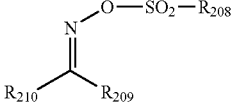

(ZV)

(ZVI)

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI).

The alkylene group of A includes an alkylene group having a carbon number of 1 to 12 (e.g., methylene, ethylene, propylene, isopropylene, butylene, isobutylene), the alkenylene group of A includes an alkenylene group having a carbon number of 2 to 12 (e.g., ethynylene, propenylene, butenylene), and the arylene group of A includes an arylene group having a carbon number of 6 to 10 (e.g., phenylene, tolylene, naphthylene).

Out of the acid generators, particularly preferred examples are set forth below.

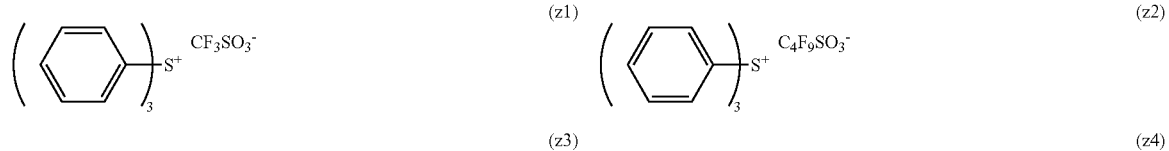

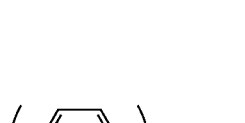

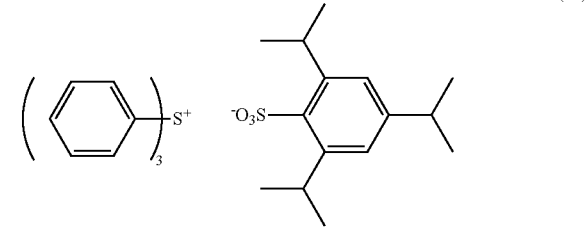

-continued
(z5) 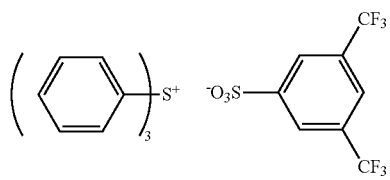
(z6) 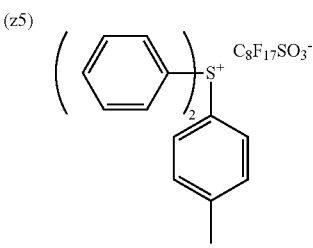
(z7) 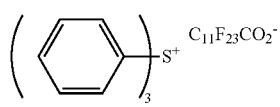
(z8) 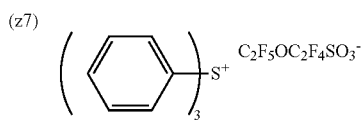
(z9) 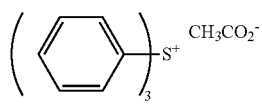
(z10) 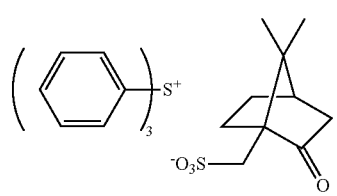
(z11) 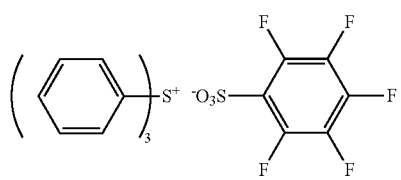
(z12) 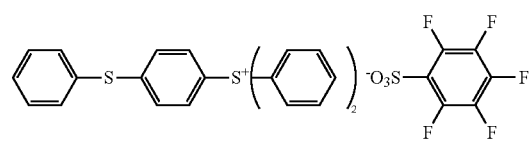
(z13) 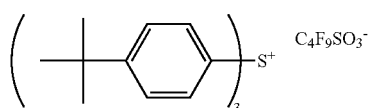
(z14) 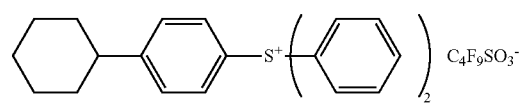
(z15) 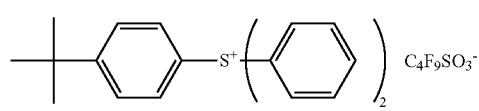
(z16) 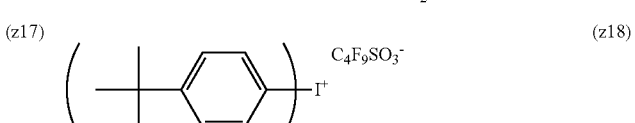
(z17) 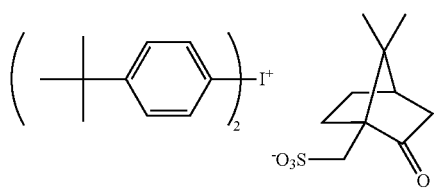
(z18) 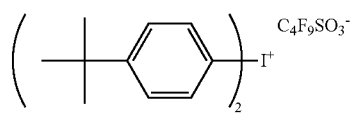
(z19) 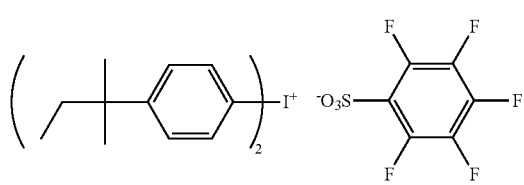
(z20) 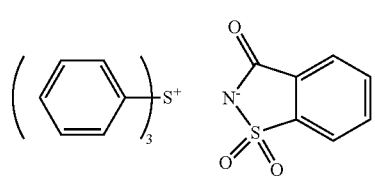
(z21) 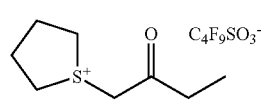
(z22) 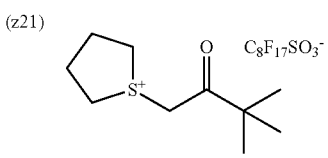

-continued

-continued
(z41) 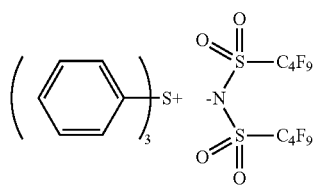
(z42) 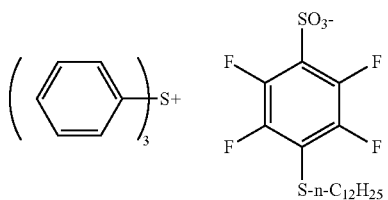
(z43) 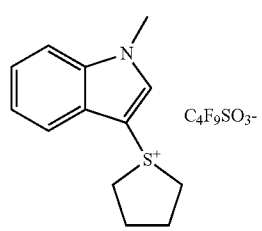
(z44) 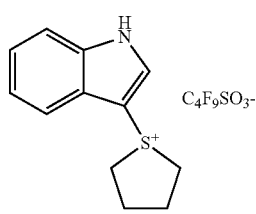
(z45) 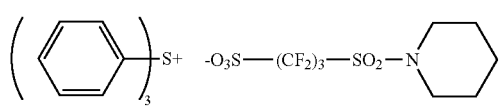
(z46) 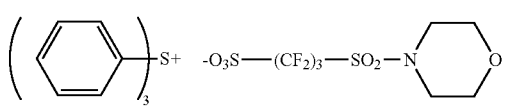
(z47) 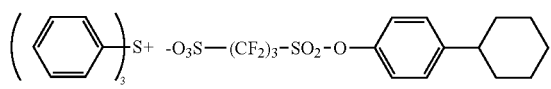
(z48) 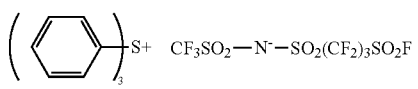
(z49) 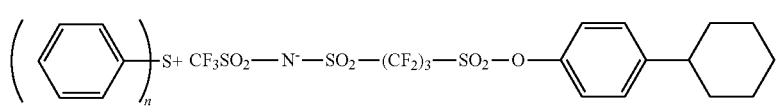
(z50) 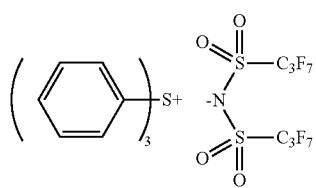
(z51) 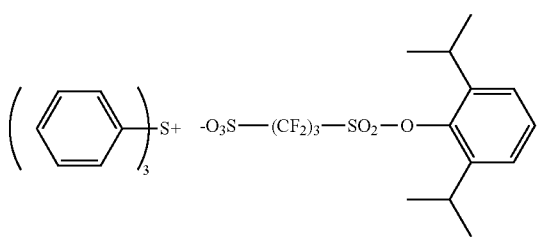
(z52) 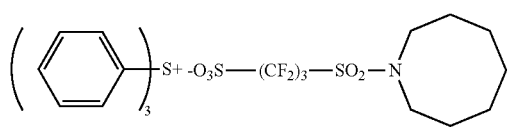
(z53) 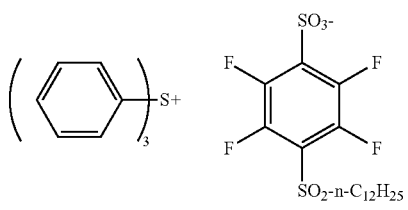
(z54) 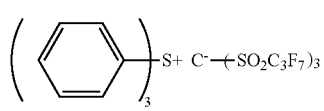
(z55) 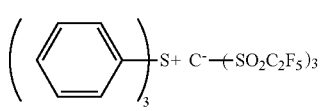
(z56) 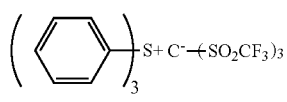
(z57) 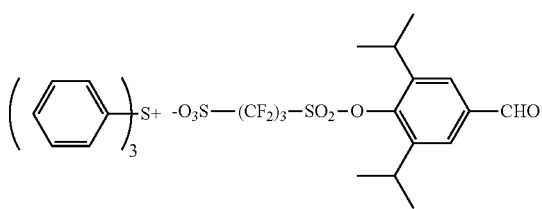

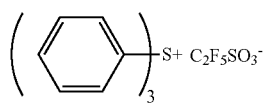(z58)
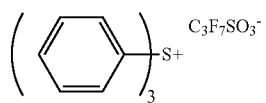(z59)
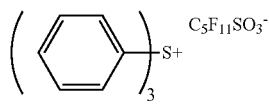(z60)
(z61)
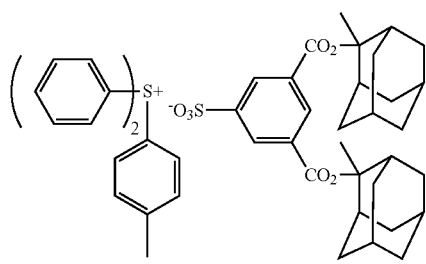(z62)
(z63)
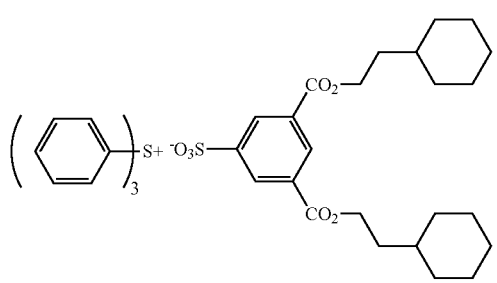(z64)
(z65)
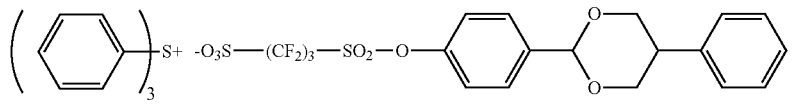(z66)
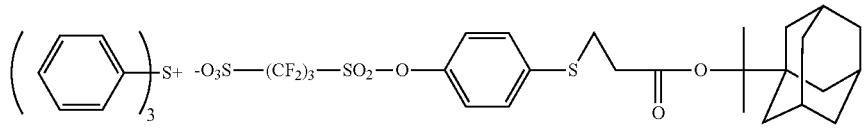(z67)
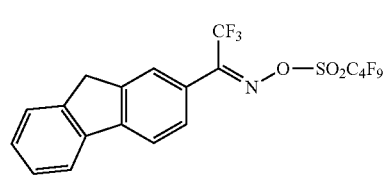(z68)
(z69)
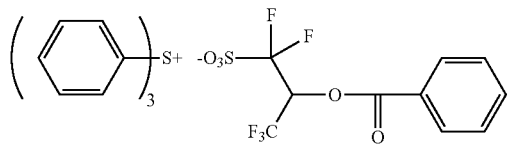(z70)
(z71)

-continued
(z72) 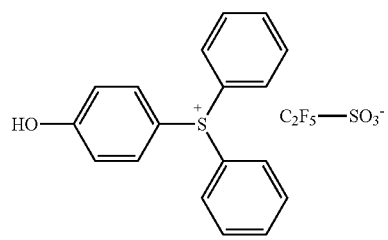
(z73) 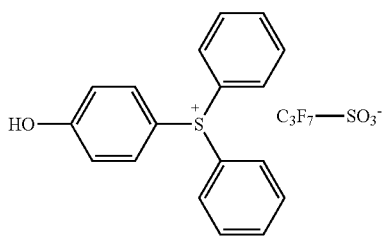
(z74) 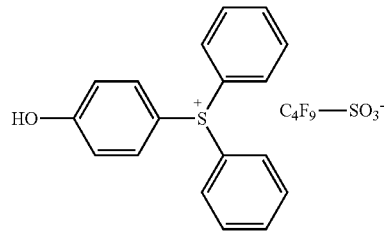
(z75) 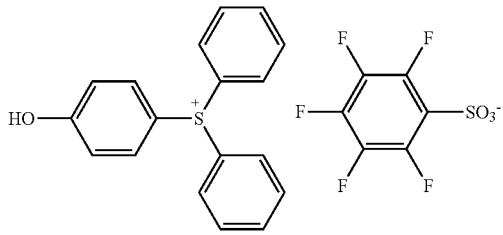
(z76) 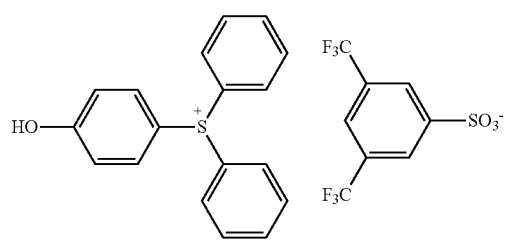
(z77) 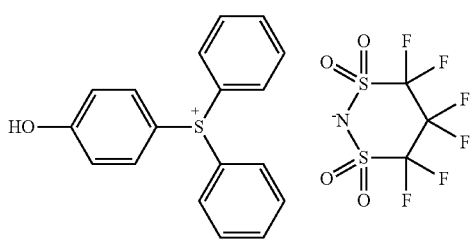
(z78) 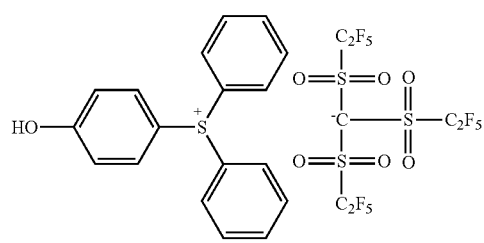
(z79) 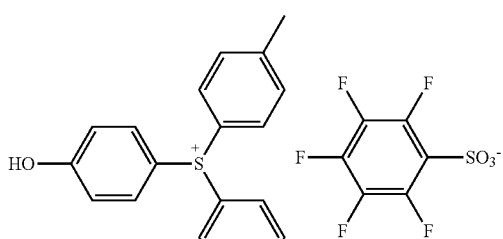
(z80) 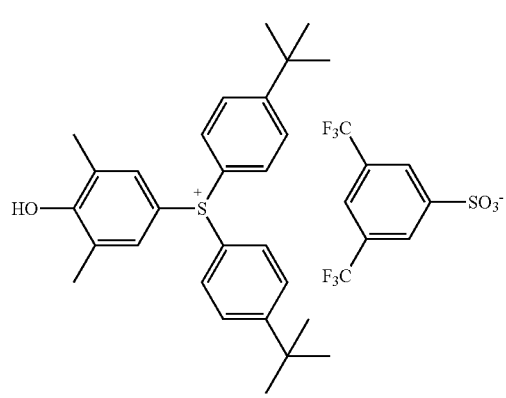
(z81) 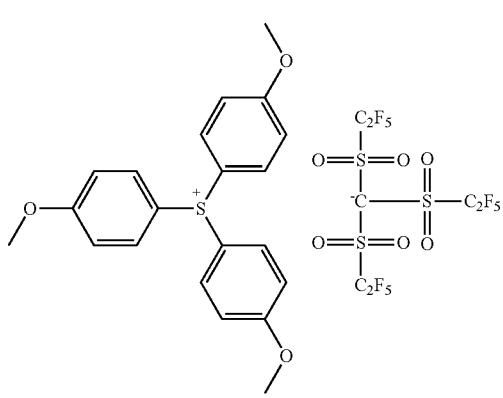

-continued
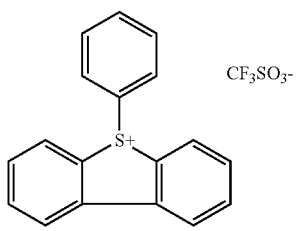 (z82)
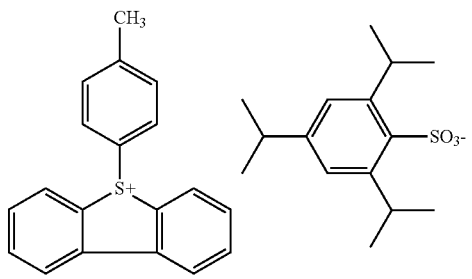 (z83)
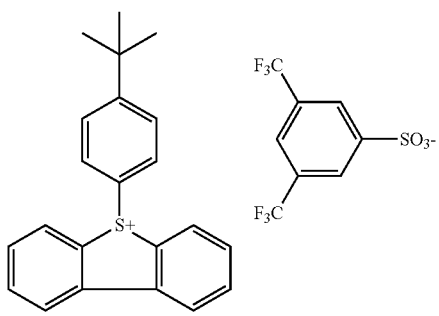 (z84)
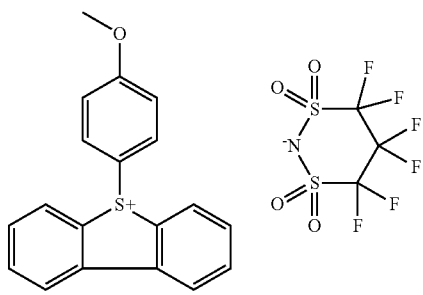 (z85)
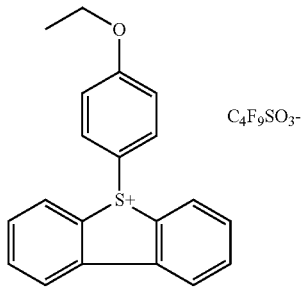 (z86)
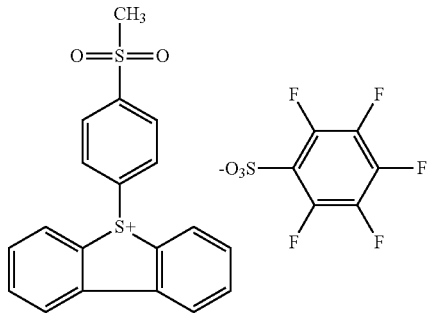 (z87)
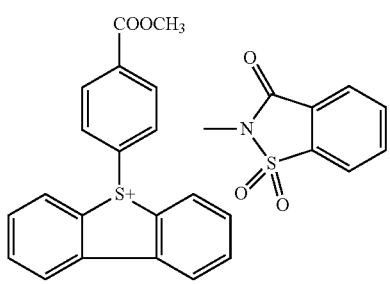 (z88)
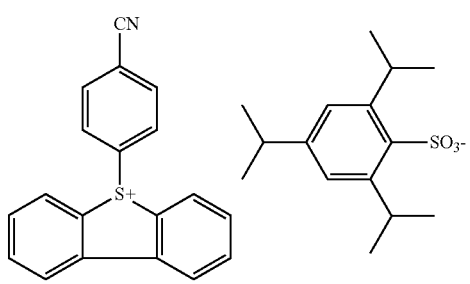 (z89)
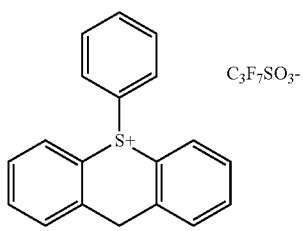 (z90)
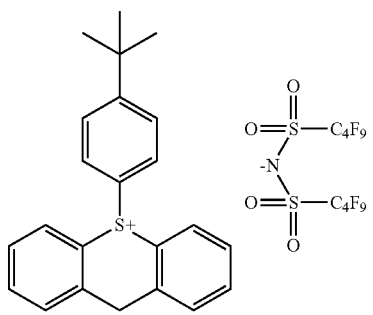 (z91)

-continued
(z92)
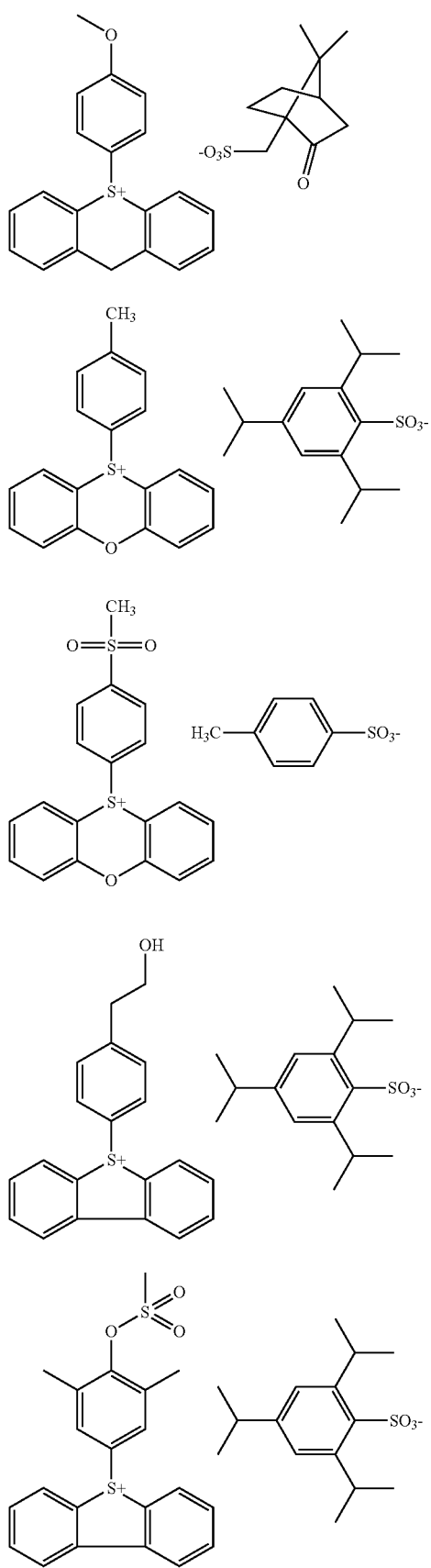
(z93)
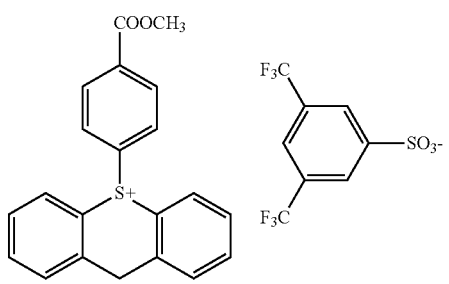
(z94)
(z95)
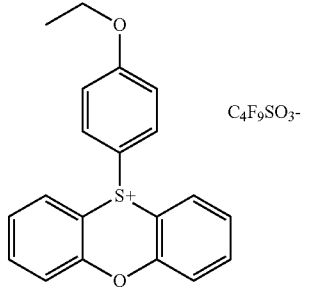
(z96)
(z97)
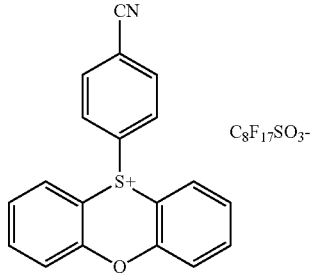
(z98)
(z99)
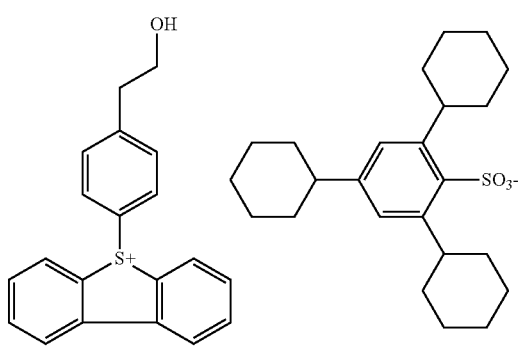
(z100)
(z101)
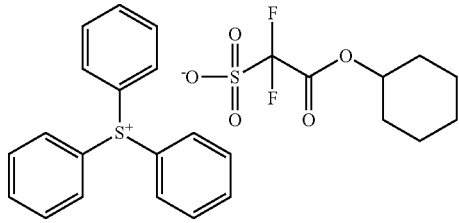

-continued

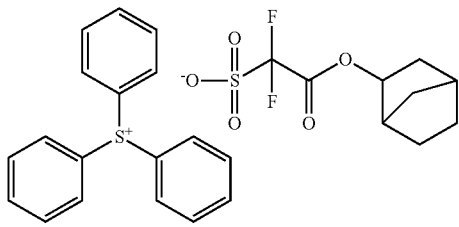 (z102)

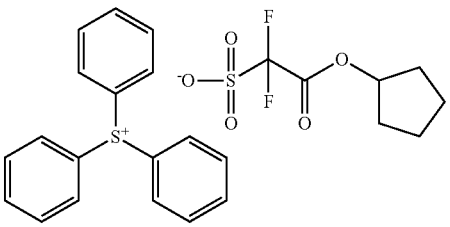 (z103)

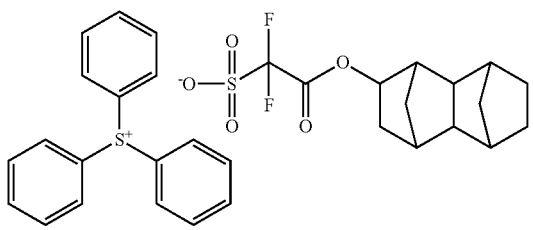 (z104)

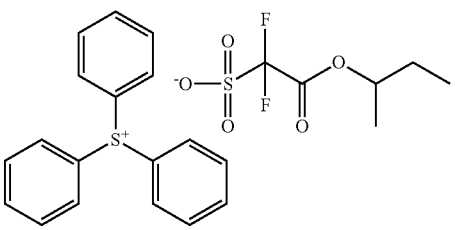 (z105)

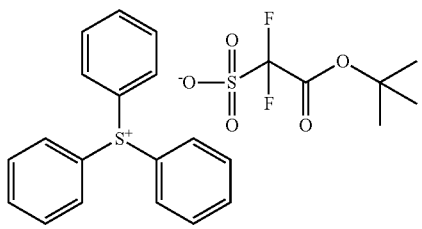 (z106)

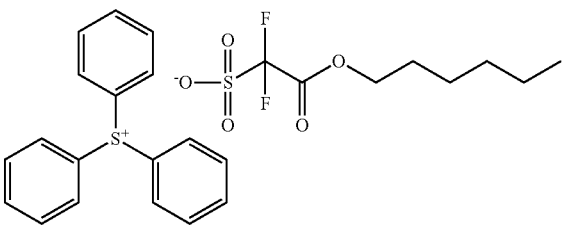 (z107)

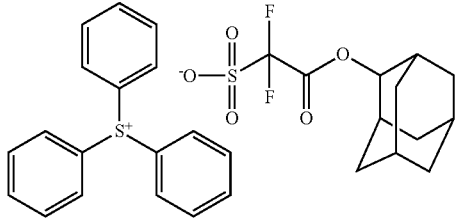 (z108)

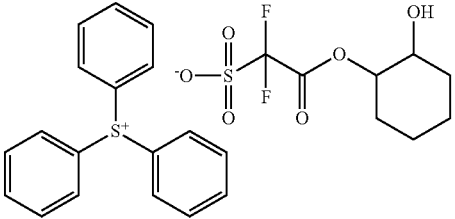 (z109)

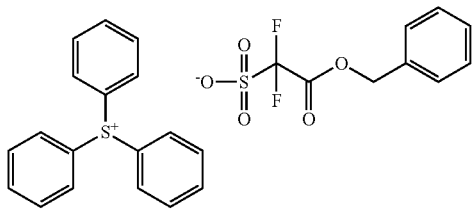 (z110)

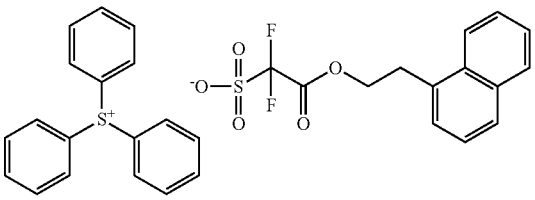 (z111)

As for the acid generator, one kind of an acid generator may be used alone, or two or more kinds of acid generators may be used in combination. In the case of using two or more kinds of acid generators in combination, for example, (1) an embodiment where two kinds of PAGs differing in the acid strength are used in combination, and (2) an embodiment where two kinds of acid generators differing in the size (molecular weight or carbon number) of the generated acid are used in combination, are preferred.

Examples of the embodiment (1) include a combination use of a sulfonic acid generator having fluorine and a tris(fluoroalkylsulfonyl)methide acid generator, a combination use of a sulfonic acid generator having fluorine and a sulfonic acid generator having no fluorine, and a combination use of an alkylsulfonic acid generator and an arylsulfonic acid generator.

Examples of the embodiment (2) include a combination use of two kinds of acid generators differing in the carbon number of the generated acid anion by 4 or more.

The content of the acid generator (in the case of using a plurality of acid generators in combination, the total amount) in the composition is preferably from 0.1 to 30 mass %, more preferably from 0.5 to 20 mass %, still more preferably from 1 to 15 mass %, based on the entire solid content of the composition.

[4] Basic Compound

The resist composition of the present invention preferably contains a basic compound.

The basic compound is preferably a nitrogen-containing organic basic compound.

The compound which can be used is not particularly limited but, for example, compounds classified into the following (1) to (4) are preferably used.

(1) Compound Represented by the Following Formula (BS-1)

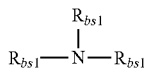

In formula (BS-1), each $R_{bs1}$ independently represents any one of a hydrogen atom, an alkyl group (linear or branched), a cycloalkyl group (monocyclic or polycyclic), an aryl group and an aralkyl group. However, it does not occur that three $R_{bs1}$'s all are a hydrogen atom.

The carbon number of the alkyl group as $R_{bs1}$ is not particularly limited but is usually from 1 to 20, preferably from 1 to 12.

The carbon number of the cycloalkyl group as $R_{bs1}$ is not particularly limited but is usually from 3 to 20, preferably from 5 to 15.

The carbon number of the aryl group as $R_{bs1}$ is not particularly limited but is usually from 6 to 20, preferably from 6 to 10. Specific examples thereof include a phenyl group and a naphthyl group.

The carbon number of the aralkyl group as $R_{bs1}$ is not particularly limited but is usually from 7 to 20, preferably from 7 to 11. Specific examples thereof include a benzyl group.

In the alkyl group, cycloalkyl group, aryl group or aralkyl group as $R_{bs1}$, a hydrogen atom may be replaced by a substituent. Examples of the substituent include an alkyl group, a cycloalkyl group, an aryl group, an aralkyl group, a hydroxyl group, a carboxyl group, an alkoxy group, an aryloxy group, an alkylcarbonyloxy group and an alkyloxycarbonyl group.

The compound represented by formula (BS-1) is preferably a compound where only one of three $R_{bs1}$'s is a hydrogen atom or all $R_{bs1}$'s are not a hydrogen atom.

Specific examples of the compound represented by formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline and N,N-dihexylaniline.

Also, one preferred embodiment is a compound where in formula (BS-1), at least one $R_{bs1}$ is an alkyl group substituted by a hydroxyl group. Specific examples of the compound include triethanolamine and N,N-dihydroxyethylaniline.

The alkyl group as $R_{bs1}$ may have an oxygen atom in the alkyl chain to form an alkyleneoxy chain. The alkyleneoxy chain is preferably —$CH_2CH_2O$—. Specific examples thereof include tris(methoxyethoxyethyl)amine and compounds illustrated in column 3, line 60 et seq. of U.S. Pat. No. 6,040,112.

(2) Compound Having a Nitrogen-Containing Heterocyclic Structure

The heterocyclic structure may or may not have aromaticity. Also, the heterocyclic structure may contain a plurality of nitrogen atoms and may further contain a heteroatom other than nitrogen. Specific examples of the compound include a compound having an imidazole structure (e.g., 2-phenylbenzimidazole, 2,4,5-triphenylimidazole), a compound having a piperidine structure (e.g., N-hydroxyethylpiperidine, bis(1,2,2,6,6-pentamethyl-4-piperidyl)sebacate), a compound having a pyridine structure (e.g., 4-dimethylaminopyridine), and a compound having an antipyrine structure (e.g., antipyrine, hydroxyantipyrine).

A compound having two or more ring structures is also suitably used. Specific examples thereof include 1,5-diazabicyclo[4.3.0]non-5-ene and 1,8-diazabicyclo[5.4.0]-undec-7-ene.

(3) Amine Compound Having a Phenoxy Group

The amine compound having a phenoxy group has a phenoxy group at the terminal opposite the nitrogen atom of the alkyl group in an amine compound. The phenoxy group may have a substituent such as alkyl group, alkoxy group, halogen atom, cyano group, nitro group, carboxyl group, carboxylic acid ester group, sulfonic acid ester group, aryl group, aralkyl group, acyloxy group and aryloxy group.

A compound having at least one alkyleneoxy chain between the phenoxy group and the nitrogen atom is preferred. The number of alkyleneoxy chains in one molecule is preferably from 3 to 9, more preferably from 4 to 6. Among alkyleneoxy chains, —$CH_2CH_2O$— is preferred.

Specific examples of the compound include 2-[2-{2-(2,2,-dimethoxy-phenoxyethoxy)ethyl}-bis-(2-methoxyethyl)]-amine and Compounds (C1-1) to (C3-3) illustrated in paragraph [0066] of U.S. Patent Application Publication No. 2007/0224539A1.

(4) Ammonium Salt

An ammonium salt is also appropriately used. The ammonium salt is preferably a hydroxide or a carboxylate. More specifically, a tetraalkylammonium hydroxide typified by tetrabutylammonium hydroxide is preferred. In addition, an ammonium salt derived from amines of (1) to (3) above can also be used.

Other examples of the basic compound which can be used include compounds synthesized in Examples of JP-A-2002-363146 and compounds described in paragraph 0108 of JP-A-2007-298569.

As for the basic compound, one basic compound is used alone, or two or more kinds of basic compounds are used in combination.

The amount of the basic compound used is usually from 0.001 to 10 mass %, preferably from 0.01 to 5 mass %, based on the solid content of the composition.

The molar ratio of acid generator/basic compound is preferably from 2.5 to 300. That is, the molar ratio is preferably 2.5 or more in view of sensitivity and resolution and is preferably 300 or less from the standpoint of suppressing reduction in the resolution due to thickening of the pattern with aging after exposure until heat treatment. This molar ratio is more preferably from 5.0 to 200, still more preferably from 7.0 to 150.

[5] Resist Solvent

The solvent which can be used when preparing the composition is not particularly limited as long as it dissolves respective components, but examples thereof include an alkylene glycol monoalkyl ether carboxylate (e.g., propylene glycol monomethyl ether acetate (PGMEA; 1-methoxy-2-acetoxypropane)), an alkylene glycol monoalkyl ether (e.g., propylene glycol monomethyl ether (PGME; 1-methoxy-2-propanol)), an alkyl lactate (e.g., ethyl lactate, methyl lactate), a cyclic lactone (e.g., γ-butyrolactone; preferably having a carbon number of 4 to 10), a chain or cyclic ketone (e.g., 2-heptanone, cyclohexanone; preferably having a carbon number of 4 to 10), an alkylene carbonate (e.g., ethylene carbonate, propylene carbonate), and an alkyl carboxylate (preferably an alkyl acetate such as butyl acetate), an alkyl alkoxyacetate (e.g., ethyl ethoxypropionate). Other examples of the solvent which can be used include solvents described in paragraph [0244] et seq. of U.S. Patent Application Publication No. 2008/0248425A1.

Among the solvents above, an alkylene glycol monoalkyl ether carboxylate and an alkylene glycol monoalkyl ether are preferred.

One of these solvents may be used alone, or two or more kinds thereof may be mixed and used. In the case of mixing two or more kinds of solvents, it is preferred to mix a solvent having a hydroxyl group and a solvent having no hydroxyl group. The ratio by mass of the solvent having a hydroxyl group and the solvent having no hydroxyl group is from 1/99 to 99/1, preferably from 10/90 to 90/10, more preferably from 20/80 to 60/40.

The solvent having a hydroxy group is preferably an alkylene glycol monoalkyl ether, and the solvent having no hydroxyl group is preferably an alkylene glycol monoalkyl ether carboxylate.

The amount used of the solvent in the entire amount of the composition of the present invention may be appropriately adjusted according to the desired film thickness or the like but is generally adjusted to give a composition having an entire solid content concentration of 0.5 to 30 mass %, preferably from 1.0 to 20 mass %, more preferably from 1.5 to 10 mass %, still more preferably from 1.5 to 5 mass %.

[6] Surfactant

The composition of the present invention preferably further contains a surfactant. The surfactant is preferably a fluorine-containing and/or silicon-containing surfactant.

Examples of the surfactant above include Megaface F176 and Megaface R08 produced by Dainippon Ink & Chemicals, Inc.; PF656 and PF6320 produced by OMNOVA; Troysol S-366 produced by Troy Chemical; Florad FC430 produced by Sumitomo 3M Inc.; and polysiloxane polymer KP-341 produced by Shin-Etsu Chemical Co., Ltd.

A surfactant other than the fluorine-containing and/or silicon-containing surfactant may also be used. Specific examples thereof include polyoxyethylene alkyl ethers and polyoxyethylene alkylaryl ethers.

In addition, known surfactants may be appropriately used. Examples of the surfactant which can be used include surfactants described in paragraph [0273] et seq. of U.S. Patent Application Publication No. 2008/0248425A1.

One kind of a surfactant may be used alone, or two or more kinds of surfactants may be used in combination.

The amount of the surfactant used is preferably from 0.0001 to 2 mass %, more preferably from 0.001 to 1 mass %, based on the entire solid content of the composition.

[7] Other additives

The composition of the present invention may appropriately contain, in addition to the components described above, a carboxylic acid, an onium carboxylate, a dissolution inhibiting compound having a molecular weight of 3,000 or less described, for example, in *Proceeding of SPIE,* 2724, 355 (1996), a dye, a plasticizer, a photosensitizer, a light absorber, an antioxidant and the like.

In particular, a carboxylic acid is suitably used for enhancing the performance. The carboxylic acid is preferably an aromatic carboxylic acid such as benzoic acid and naphthoic acid.

The content of the carboxylic acid is preferably from 0.01 to 10 mass %, more preferably from 0.01 to 5 mass %, still more preferably from 0.01 to 3 mass %, based on the entire solid content concentration of the composition.

[8] Usage

The pattern forming method of the present invention is suitably used for the fabrication of a semiconductor microcircuit in the production of VLSI or a high-capacity microchip. Incidentally, in the fabrication of a semiconductor microcircuit, the resist film having formed therein a pattern is subjected to circuit formation or etching and the remaining resist film part is finally removed with a solvent or the like. Therefore, unlike a so-called permanent resist used for a printed board and the like, the resist film derived from the resist composition of the present invention does not remain in the final product such as microchip.

EXAMPLES

The present invention is described in greater detail below by referring to Examples, but the contents of the present invention are not limited thereto.

1. Synthesis Example of Constituent Material (1) Resin (Component A)

Synthesis Example 1

Synthesis of Resin (29)

3.9 Gram (0.024 mol) of 4-acetoxystyrene and 0.8 g (0.006 mol) of 4-methoxystyrene were dissolved in 30 ml of 1-methoxy-2-propanol and thereto, 70 ml of a 1-methoxy-2-propanol solution containing 50 mg of 2,2'-azobis(2,4-dimethylvaleronitrile) (V-65, trade name, produced by Wako Pure Chemical Industries, Ltd.) as a polymerization initiator, 9.1 g (0.056 mol) of 4-acetoxystyrene and 1.9 g (0.014 mol) of 4-methoxystyrene was added dropwise at 70° C. over 2 hours under stirring in a nitrogen stream. After 2 hours, 50 mg of the initiator was added, and the reaction was further allowed to proceed for 2 hours. Thereafter, the temperature was raised to 90° C., and the stirring was continued for 1 hour. The obtained reaction solution was allowed to cool and then poured in 1 L of ion-exchanged water with vigorous stirring to precipitate a white resin. The resin obtained was dried and then dissolved in 100 ml of methanol and after adding an aqueous 25 mass % tetramethylammonium hydroxide solution to hydrolyze the acetoxy group in the resin, the resulting solution was neutralized with an aqueous hydrochloric acid solution to precipitate a white resin. This resin was washed with ion-exchanged water and dried under reduced pressure to obtain 11.6 g of Resin (29) of the present invention. The obtained resin was measured for the molecular weight by GPC and found to have a weight average molecular weight (Mw, in terms of polystyrene) of 9,200 and a polydispersity (Mw/Mn) of 2.0.

The polymers as the component (A) for use in the present invention were synthesized in the same manner.

(2) Synthesis of Crosslinking Agent (Component B)

Synthesis of (HM-1):

Gram of 1-[α-methyl-α-(4-hydroxyphenyl)ethyl]-4-[α,α-bis(4-hydroxyphenyl)ethyl]benzene (Trisp-PA produced by Honshu Chemical Industry Co., Ltd.) was added to an aqueous 10 mass % potassium hydroxide solution and dissolved with stirring, and while stirring this solution, 60 ml of an aqueous 37 mass % formalin solution was gradually added thereto at room temperature over 1 hour. After further stirring at room temperature for 6 hours, the solution was poured in an aqueous dilute sulfuric acid solution, and the precipitate was collected by filtration, thoroughly washed with water and then recrystallized from 30 ml of methanol to obtain 20 g of white powder of Hydroxymethyl Group-Containing Phenol Derivative [HM-1] having a structure shown below. The purity was 92% (as determined by a liquid chromatography method).

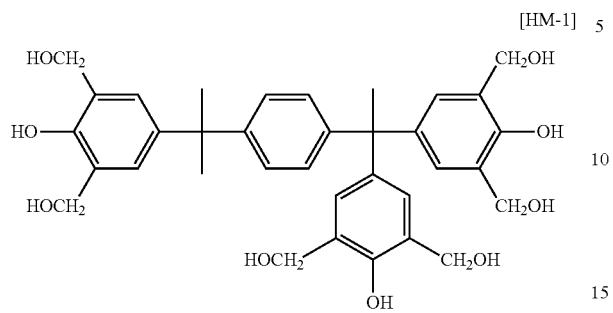

[HM-1]

Synthesis of (MM-1):

Gram of Hydroxymethyl Group-Containing Phenol Derivative [HM-1] obtained in Synthesis Example above was added to 1 liter of methanol and dissolved with stirring under heating. Subsequently, 1 ml of concentrated sulfuric acid was added to the resulting solution, and the mixture was refluxed under heating for 12 hours. After the completion of reaction, the reaction solution was cooled, and 2 g of potassium carbonate was added thereto. This mixture was sufficiently concentrated, and 300 ml of ethyl acetate was added thereto. The resulting solution was washed with water and then concentrated to dryness to obtain 22 g of a white solid of Methoxymethyl Group-Containing Phenol Derivative [MM-1] having a structure shown below. The purity thereof was 90% (as determined by a liquid chromatography method).

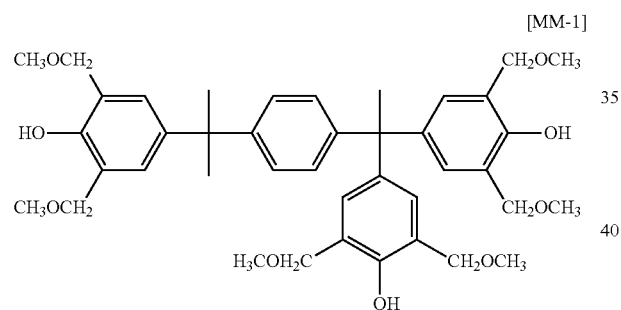

[MM-1]

Furthermore, the phenol derivatives shown below were synthesized in the same manner.

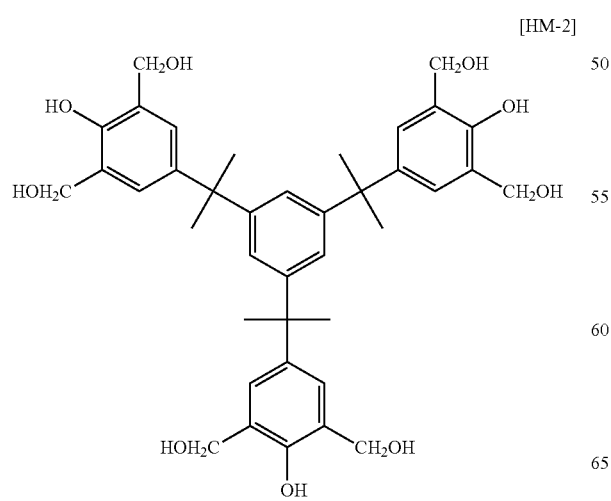

[HM-2]

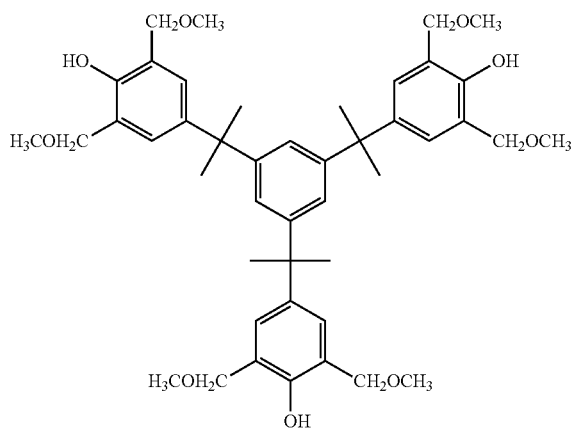

[MM-2]

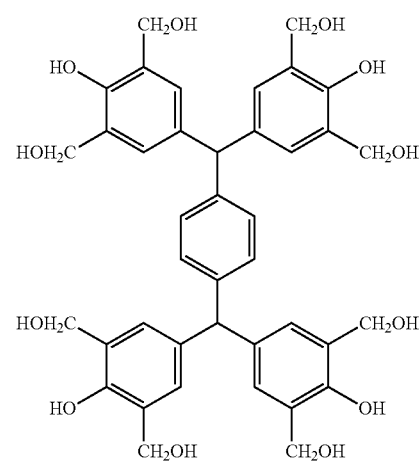

[HM-3]

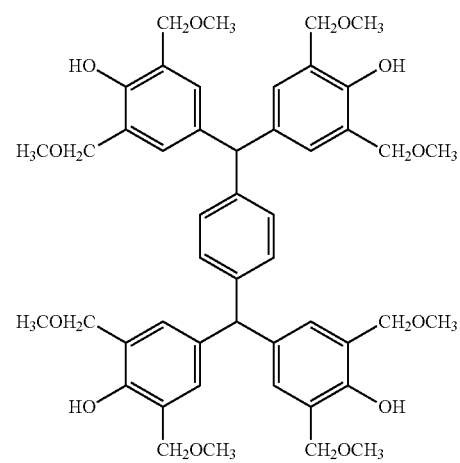

[MM-3]

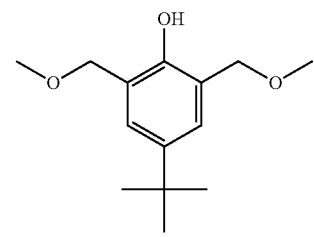

[MM-4]

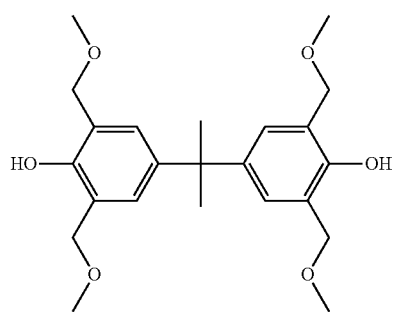

[MM-5]

2. Examples

2.1 EB Exposure

Examples 1 to 21

(1) Preparation and Coating of Negative Resist Coating Solution

A coating solution composition having the formulation shown in Table 1 was microfiltered through a membrane filter having a pore size of 0.1 μm to obtain a resist solution. In Table 1, the ratio when using two or more kinds of components is the ratio by mass.

This resist solution was applied on an HMDS-treated 6-inch Si wafer by using a spin coater, Mark 8, manufactured by Tokyo Electron Ltd. and dried on a hot plate at 110° C. for 90 seconds to obtain a 0.2 μm-thick resist film.

(2) Evaluation of EB Exposure

The resist film obtained in (1) above was subjected to pattern irradiation using an electron beam lithography system (HL750 manufactured by Hitachi, Ltd., accelerating voltage: 50 KeV). After the irradiation, the resist film was heated on a hot plate at 120° C. for 90 seconds.

Subsequently, the resist film was spray-developed using the organic solvent shown in Table 1 at a flow rate of 200 mL/min for 30 seconds and then dried by high-speed spinning of 2,000 revolutions (rpm) for 20 seconds.

In the case where an organic solvent is designated in the column of Rinsing Solution of Table 1, after spray development using an organic solvent at a rate of 200 mL/min for 30 seconds, the resist film was rinsed with the designated organic solvent at a flow rate of 200 mL/min for 30 seconds while spinning the wafer by 1,500 revolutions (rpm) and then dried by high-speed spinning of 2,000 revolutions (rpm) for 20 seconds.

The obtained pattern was evaluated for the sensitivity, resolution, pattern profile, line width roughness, bridge margin and collapse margin by the following methods. The evaluation results are shown in Table 2 below.

(2-1) Sensitivity ($E_0$)

The obtained pattern was observed using a scanning electron microscope (S-9220, manufactured by Hitachi, Ltd.), and the electron beam irradiation dose when resolving a pattern (line:space=1:1) with a line width of 0.10 μm was defined as the sensitivity ($E_0$).

(2-2) Resolution

The limiting resolution (the minimum line width allowing the line and space to be separated and resolved) at the irradiation dose giving the sensitivity above was defined as the resolution.

(2-3) Pattern Profile

The cross-sectional profile of a 0.10-μm line pattern at the irradiation dose giving the sensitivity above was observed using a scanning electron microscope (S-4300, manufactured by Hitachi, Ltd.).

(2-4) Line Width Roughness (LWR)

The line width was measured at arbitrary 30 points in the region of 50 μm in the longitudinal direction of a 0.10-μm line pattern at the irradiation dose giving the sensitivity above and from the variation (standard deviation) thereof, 3σ (nm) was computed, whereby the line width roughness was evaluated.

(2-5) Bridge Margin

The irradiation dose was increased from the irradiation dose ($E_0$) giving the sensitivity above under the same conditions as in the measurement of sensitivity (in the evaluation of the positive resist composition of Comparative Example, the irradiation dose was decreased), and the irradiation dose $E_1$ when a bridge was generated in the pattern was determined. A value obtained by the following formula was calculated and used as the index of bridge margin.

Bridge margin (%)=($E_1$−$E_0$)/$E_0$×100

A larger calculated value indicates higher performance.

(2-6) Collapse Margin

The irradiation dose was decreased from the irradiation dose ($E_0$) giving the sensitivity above under the same conditions as in the measurement of sensitivity (in the evaluation of the positive resist composition of Comparative Example, the irradiation dose was increased), and the irradiation dose $E_2$ when a pattern collapse was generated was determined. A value obtained by the following formula was calculated and used as the index of collapse margin.

Collapse margin (%)=($E_0$−$E_2$)/$E_0$×100

Comparative Example 1

The resist solution preparation, pattern formation and evaluation were performed in the same manner as in Example 1 except for using a coating solution composition according to the formulation shown in Table 1, performing the development with an aqueous alkali solution (TMAH; an aqueous tetramethylammonium hydroxide (2.38 mass %) solution), and rinsing the resist film with pure water.

Comparative Example 2

The resist solution preparation, pattern formation and evaluation were performed in the same manner as in Example 1 except for using a coating solution composition according to the formulation shown in Table 1, and performing the development and rinsing with the developer and rinsing solution shown in Table 1, respectively.

Comparative Example 3

The resist solution preparation, pattern formation and evaluation were performed in the same manner as in Example 1 except for using the positive chemical-amplification resist composition containing a resin capable of decomposing by the action of an acid, shown in Table 1, and performing the development and rinsing with the developer and rinsing solution shown in Table 1, respectively.

The evaluation results are shown in Table 2. Incidentally, in Comparative Example 3, a 0.10-μm pattern could not be resolved.

TABLE 1

| | (A) Resin (mg) | (B) Crosslinking Agent (mg) | (C) Acid Generator (mg) | Basic Compound (mg) | Other Components (mg) | Solvent (g) | Surfactant (1 mg) | Developer (ratio by mass) | Rinsing Solution (ratio by mass) |
|---|---|---|---|---|---|---|---|---|---|
| Example 1 | (29) Mw = 9200 Mw/Mn = 2.0 x/y = 80/20 (400 mg) | MM-1 (120) | z11 (50) | D-1 (2) | — | S-1 (5) | W-1 | S-2 | — |
| Example 2 | (2) Mw = 5000 Mw/Mn = 1.18 (340 mg) | MM-1 (180) | z39 (50) | D-1 (2) | — | S-1/S-2 (4/1) | W-1 | S-7 | — |
| Example 3 | (1) Mw = 2500 Mw/Mn = 1.15 (400 mg) | MM-2 (110) | z2 (50) | D-4 (3) | — | S-1 (5) | W-1 | S-1/S-2 = 30/70 | — |
| Example 4 | (2) Mw = 7000 Mw/Mn = 1.3 (400 mg) | MM-3 (120) | z8 (50) | D-1 (4) | — | S-1 (5) | W-2 | S-1/S-2 = 30/70 | — |
| Example 5 | (27) Mw = 3500 Mw/Mn = 1.2 x/y = 85/15 (400 mg) | MM-1 (120) | z45 (50) | D-2 (2) | — | S-1/S-2 (4/1) | W-1 | S-8 | |
| Example 6 | (25) Mw = 5000 Mw/Mn = 1.1 x/y = 60/40 (340 mg) | MM-3 (180) | z56 (50) | D-3 (6) | — | S-2 (5) | W-1 | S-9 | — |
| Example 7 | (32) Mw = 7500 Mw/Mn = 1.6 x/y = 80/20 (400 mg) | MM-1 (120) | z81 (50) | D-1 (1) | F-1 (12) | S-1/S-2 (4/1) | W-2 | S-3 | — |
| Example 8 | (2) Mw = 5000 Mw/Mn = 1.18 (400 mg) | CL-1 (120) | z85 (60) | D-1 (2) | F-2 (12) | S-1 (5) | W-1 | S-4 | |
| Example 9 | (2) Mw = 5000 Mw/Mn = 1.1 (300 mg)/ (1) Mw = 2500 Mw/Mn = 1.1 (100 mg) | MM-1 (120) | z11 (50) | D-1 (2) | — | S-1/S-2 (4/1) | W-1 | S-4 | — |
| Example 10 | (58) Mw = 3500 x/y = 80/20 Mw/Mn = 2.0 (400 mg) | MM-1 (120) | z11 (60) | D-2 (2) | — | S-1/S-2 (4/1) | W-1 | S-4 | — |
| Example 11 | (2) Mw = 5000 Mw/Mn = 1.18 (400 mg) | MM-1 (120) | z81 (50) | D-2 (2) | — | S-1/S-2 (4/1) | W-1 | S-2 | S-5 |
| Example 12 | P-1 Mw = 5000 x/y = 40/60 Mw/Mn = 1.5 (400 mg) | X-1 (120) | z59 (50) | D-1 (1) | — | S-1 (5) | W-1 | S-4 | S-5 |
| Example 13 | P-1 Mw = 5000 x/y = 40/60 Mw/Mn = 1.5 (400 mg) | X-2 (120) | z59 (50) | D-1 (1) | — | S-1 (5) | W-1 | S-4 | S-5 |
| Example 14 | P-1 Mw = 5000 x/y = 40/60 Mw/Mn = 1.5 (400 mg) | X-3 (120) | z59 (50) | D-1 (1) | — | S-1 (5) | W-1 | S-4 | S-5 |
| Example 15 | (2) Mw = 5000 Mw/Mn = 1.8 (340 mg) | MM-1 (180) | z39 (50) | D-1 (2) | — | S-1/S-2 (4/1) | W-1 | S-4 | S-10 |
| Example 16 | (2) Mw = 5000 Mw/Mn = 1.8 (340 mg) | MM-1 (180) | z39 (50) | D-1 (2) | — | S-1/S-2 (4/1) | W-1 | S-4 | S-11 |
| Example 17 | (2) Mw = 5000 Mw/Mn = 1.8 (340 mg) | MM-1/MM-4 (90/90) | z39 (50) | D-1 (2) | — | S-1/S-2 (4/1) | W-1 | S-4 | S-10 |
| Example 18 | (2) Mw = 5000 Mw/Mn = 1.8 (340 mg) | MM-5 (120) | z39 (50) | D-1/D-2 (1/1) | — | S-1/S-2 (4/1) | W-1 | S-4 | S-10 |
| Example 19 | (2) Mw = 5000 Mw/Mn = 1.8 (340 mg) | MM-1 (180) | z11/z56 (25/25) | D-1 (2) | — | S-1/S-2 (4/1) | W-1 | S-4/S-10 50/50 | S-3/S-10 = 25/75 |
| Example 20 | (2) Mw = 5000 Mw/Mn = 1.8 (340 mg) | MM-1 (180) | z4/z45 (25/25) | D-1 (2) | — | S-1/S-2 (4/1) | W-1 | S-4 | S-10 |
| Example 21 | (2) Mw = 5000 Mw/Mn = 1.8 (340 mg) | MM-1 (180) | z1/z11 (25/25) | D-1/D-4 (1/1) | — | S-1/S-2 (4/1) | W-1 | S-4 | S-10 |
| Comparative Example 1 | (29) Mw = 9200 x/y = 80/20 Mw/Mn = 2.0 (400 mg) | MM-1 (120) | z5 (50) | D-1 (2) | — | S-1 (5) | W-1 | TMAH | pure water |
| Comparative Example 2 | PMMA Mw = 300000 Mw/Mn = 1.8 (400 mg) | — | — | — | — | S-6 (5) | W-1 | S-4 | S-5 |
| Comparative Example 3 | P-2 Mw = 8000 x/y/z = 60/20/20 Mw/Mn = 1.6 (400 mg) | — | z19 (30) | D-1 (10) | — | S-1 (5) | W-1 | S-4 | S-5 |

TABLE 2

| | Sensitivity ($\mu C/cm^2$) | Resolution ($\mu m$) | Pattern Profile (rating on a scale of 3 grades) | LWR (nm) | Bridge Margin (%) | Collapse Margin (%) |
|---|---|---|---|---|---|---|
| Example 1 | 18.0 | 0.050 | rectangular | 2.0 | 40 | 15 |
| Example 2 | 15.0 | 0.038 | rectangular | 2.0 | 50 | 15 |
| Example 3 | 18.0 | 0.038 | rectangular | 2.0 | 40 | 15 |
| Example 4 | 21.0 | 0.050 | rectangular | 2.5 | 35 | 15 |
| Example 5 | 15.0 | 0.038 | rectangular | 3.0 | 50 | 15 |
| Example 6 | 18.0 | 0.038 | rectangular | 3.0 | 40 | 15 |
| Example 7 | 21.0 | 0.050 | rectangular | 2.5 | 40 | 25 |
| Example 8 | 18.0 | 0.050 | rectangular | 2.5 | 40 | 35 |

TABLE 2-continued

| | Sensitivity (μC/cm²) | Resolution (μm) | Pattern Profile (rating on a scale of 3 grades) | LWR (nm) | Bridge Margin (%) | Collapse Margin (%) |
|---|---|---|---|---|---|---|
| Example 9 | 15.0 | 0.050 | rectangular | 2.5 | 40 | 40 |
| Example 10 | 15.0 | 0.050 | rectangular | 2.0 | 40 | 35 |
| Example 11 | 21.0 | 0.050 | rectangular | 3.0 | 40 | 15 |
| Example 12 | 35.0 | 0.100 | rectangular | 4.0 | 25 | 15 |
| Example 13 | 40.0 | 0.100 | rectangular | 4.0 | 25 | 15 |
| Example 14 | 25.0 | 0.100 | rectangular | 5.5 | 25 | 15 |
| Example 15 | 15.5 | 0.038 | rectangular | 2.0 | 40 | 45 |
| Example 16 | 18.0 | 0.038 | rectangular | 2.5 | 45 | 40 |
| Example 17 | 18.0 | 0.038 | rectangular | 2.0 | 40 | 45 |
| Example 18 | 17.5 | 0.038 | rectangular | 2.0 | 55 | 45 |
| Example 19 | 18.0 | 0.038 | rectangular | 2.0 | 45 | 45 |
| Example 20 | 19.5 | 0.038 | rectangular | 2.0 | 45 | 45 |
| Example 21 | 18.0 | 0.038 | rectangular | 2.0 | 40 | 40 |
| Comparative Example 1 | 18.0 | 0.080 | round top | 7.0 | 35 | 30 |
| Comparative Example 2 | 100 | 0.050 | rectangular | 5.0 | 50 | 15 |
| Comparative Example 3 | — | — | — | — | — | — |

In the Table, abbreviations indicate specific examples above or the followings.

<Organic Basic Compound>
D-1: Tetra-(n-butyl)ammonium hydroxide
D-2: 1,8-Diazabicyclo[5.4.0]-7-undecene
D-3: 2,4,5-Triphenylimidazole
D-4: Tridodecylamine <Other Components>
F-1: Benzoic acid
F-2: 2-Naphthoic acid <Resist Solvent, Developer, Rinsing Solution>
S-1: Propylene glycol monomethyl ether acetate (PGMEA)
S-2: Propylene glycol monomethyl ether (PGME)
S-3: Cyclohexanone
S-4: Butyl acetate
S-5: Dodecane
S-6: Tetrahydrofuran
S-7: 1-Hexanol
S-8: Methyl amyl ketone
S-9: Ethyl lactate
S-10: Decane
S-11: Isopropyl alcohol <Surfactant>
W-1: PF6320 (produced by OMNOVA)
W-2: Megaface F176 (produced by Dainippon Ink & Chemicals, Inc.)

<Resin>
PMMA: Polymethyl methacrylate

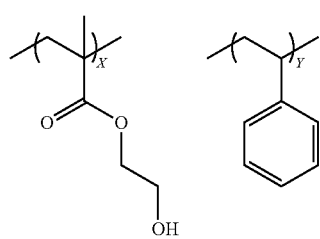
(P-1)

-continued

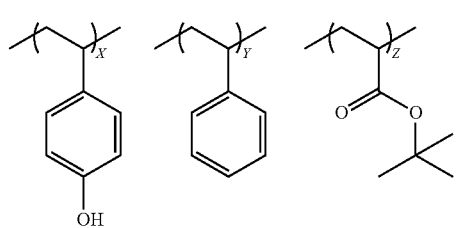
(P-2)

<Crosslinking Agent>

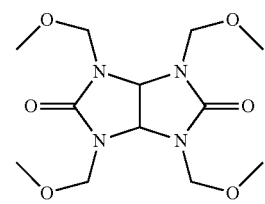
(X-1)

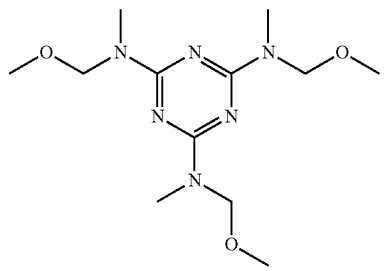
(X-2)

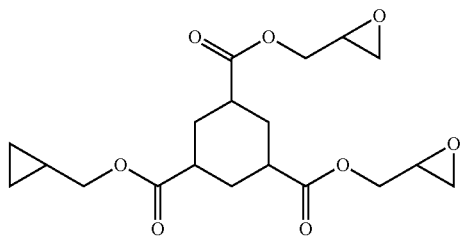
(X-3)

-continued

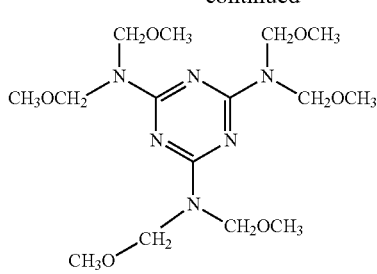

(CL-1)

2.2 EUV Exposure

Examples 22 to 42

(3) Preparation and Coating of Negative Resist Coating Solution

The coating solution composition shown in Table 3 was microfiltered through a membrane filter having a pore size of 0.1 μm to obtain a resist solution.

This resist solution was applied on an HMDS-treated 6-inch Si wafer by using a spin coater, Mark 8, manufactured by Tokyo Electron Ltd. and dried on a hot plate at 110° C. for 90 seconds to obtain a 0.1 μm-thick resist film.

(4) Evaluation of EUV Exposure

The resist film obtained was subjected to surface exposure using EUV light (wavelength: 13 nm) by changing the exposure dose in steps of 0.5 mJ/cm$^2$ in the range from 0 to 10.0 mJ/cm$^2$.

After the irradiation, the resist film was heated on a hot plate at 120° C. for 90 seconds.

Subsequently, the resist film was spray-developed using the organic solvent shown in Table 3 at a flow rate of 200 mL/min for 30 seconds and then dried by high-speed spinning of 2,000 revolutions (rpm) for 20 seconds.

In the case where an organic solvent is designated in the column of Rinsing Solution of Table 3, after spray development using an organic solvent at a flow rate of 200 mL/min for 30 seconds, the resist film was rinsed with the designated organic solvent at a flow rate of 200 mL/min for 30 seconds while spinning the wafer by 1,500 revolutions (rpm) and then dried by high-speed spinning of 2,000 revolutions (rpm) for 20 seconds.

Using the obtained sensitivity-residual film ratio curve, the sensitivity (Eth) and the residual film ratio were evaluated by the following methods.

(4-1) Sensitivity (Eth)

The exposure dose when the residual film ratio becomes 50% was defined as the sensitivity (Eth).

(4-2) Residual Film Ratio

The (film thickness after development/film thickness before exposure)×100 at an irradiation dose three times larger than the exposure dose giving the sensitivity (Eth) above was defined as the residual film ratio (%).

In Table 3, the ratio when using two or more kinds of components is the ratio by mass. The evaluation results are shown in Table 4 below.

In Table 3, the abbreviations are the same as those in Table.

TABLE 3

| | (A) Resin (mg) | (B) Crosslinking Agent (mg) | (C) Acid Generator (mg) | Basic Compound (mg) | Other Components (mg) | Solvent (g) | Surfactant (1 mg) | Developer (ratio by mass) | Rinsing Solution (ratio by mass) |
|---|---|---|---|---|---|---|---|---|---|
| Example 22 | (29) Mw = 9200 x/y = 80/20 Mw/Mn = 2.0 (400 mg) | MM-1 (120) | z11 (50) | D-1 (2) | — | S-1 (10) | W-1 | S-2 | — |
| Example 23 | (2) Mw = 5000 Mw/Mn = 1.18 (340 mg) | MM-1 (180) | z39 (50) | D-1 (2) | — | S-1/S-2 (8/2) | W-1 | S-7 | — |
| Example 24 | (1) Mw = 2500 Mw/Mn = 1.15 (400 mg) | MM-2 (110) | z2 (50) | D-4 (3) | — | S-1 (10) | W-1 | S-1/S-2 (30/70) | — |
| Example 25 | (2) Mw = 7000 Mw/Mn = 1.3 (400 mg) | MM-3 (120) | z8 (50) | D-1 (4) | — | S-1 (10) | W-2 | S-1/S-2 (30/70) | — |
| Example 26 | (27) Mw = 3500 x/y = 85/15 Mw/Mn = 1.2 (400 mg) | MM-1 (120) | z45 (50) | D-2 (2) | — | S-1/S-2 (8/2) | W-1 | S-8 | — |
| Example 27 | (25) Mw = 5000 x/y = 60/40 Mw/Mn = 1.1 (340 mg) | MM-3 (180) | z56 (50) | D-3 (6) | — | S-2 (10) | W-1 | S-9 | — |
| Example 28 | (32) Mw = 7500 x/y = 80/20 Mw/Mn = 1.6 (400 mg) | MM-1 (120) | z81 (50) | D-1 (1) | F-1 (12) | S-1/S-2 (8/2) | W-2 | S-3 | — |
| Example 29 | (2) Mw = 5000 Mw/Mn = 1.18 (400 mg) | CL-1 (120) | z85 (60) | D-1 (2) | F-2 (12) | S-1 (10) | W-1 | S-4 | — |
| Example 30 | (2) Mw = 5000 Mw/Mn = 1.1 (300 mg)/ (1) Mw = 2500 Mw/Mn = 1.1 (100 mg) | MM-1 (120) | z11 (50) | D-1 (2) | — | S-1/S-2 (8/2) | W-1 | S-4 | — |
| Example 31 | (58) Mw = 3500 x/y = 80/20 Mw/Mn = 2.0 (400 mg) | MM-1 (120) | z11 (60) | D-2 (2) | — | S-1/S-2 (8/2) | W-1 | S-4 | — |
| Example 32 | (2) Mw = 5000 Mw/Mn = 1.18 (400 mg) | MM-1 (120) | z81 (50) | D-2 (2) | — | S-1/S-2 (8/2) | W-1 | S-2 | S-5 |
| Example 33 | P-1 Mw = 5000 x/y = 40/60 Mw/Mn = 1.5 (400 mg) | X-1 (120) | z59 (50) | D-1 (1) | — | S-1 (10) | W-1 | S-4 | S-5 |
| Example 34 | P-1 Mw = 5000 x/y = 40/60 Mw/Mn = 1.5 (400 mg) | X-2 (120) | z59 (50) | D-1 (1) | — | S-1 (10) | W-1 | S-4 | S-5 |
| Example 35 | P-1 Mw = 5000 x/y = 40/60 Mw/Mn = 1.5 (400 mg) | X-3 (120) | z59 (50) | D-1 (2) | — | S-1 (10) | W-1 | S-4 | S-5 |

TABLE 3-continued

|  | (A) Resin (mg) | (B) Crosslinking Agent (mg) | (C) Acid Generator (mg) | Basic Compound (mg) | Other Components (mg) | Solvent (g) | Surfactant (1 mg) | Developer (ratio by mass) | Rinsing Solution (ratio by mass) |
|---|---|---|---|---|---|---|---|---|---|
| Example 36 | (2) Mw = 5000 Mw/Mn = 1.18 (340 mg) | MM-1 (180) | z39 (50) | D-1 (2) | — | S-1/S-2 (4/1) | W-1 | S-4 | S-10 |
| Example 37 | (2) Mw = 5000 Mw/Mn = 1.18 (340 mg) | MM-1 (180) | z39 (50) | D-1 (2) | — | S-1/S-2 (4/1) | W-1 | S-4 | S-11 |
| Example 38 | (2) Mw = 5000 Mw/Mn = 1.18 (340 mg) | MM-1/MM-4 (90/90) | z39 (50) | D-1 (2) | — | S-1/S-2 (4/1) | W-1 | S-4 | S-10 |
| Example 39 | (2) Mw = 5000 Mw/Mn = 1.18 (400 mg) | MM-5 (120) | z39 (50) | D-1/D-2 (1/1) | — | S-1/S-2 (4/1) | W-1 | S-4 | S-10 |
| Example 40 | (2) Mw = 5000 Mw/Mn = 1.18 (340 mg) | MM-1 (180) | z11/z56 (25/25) | D-1 (2) | — | S-1/S-2 (4/1) | W-1 | S-4/S-10 (50/50) | S-3/S-10 (25/75) |
| Example 41 | (2) Mw = 5000 Mw/Mn = 1.18 (340 mg) | MM-1 (180) | z4/z45 (25/25) | D-1 (2) | — | S-1/S-2 (4/1) | W-1 | S-4 | S-10 |
| Example 42 | (2) Mw = 5000 Mw/Mn = 1.18 (340 mg) | MM-1 (180) | z1/z11 (25/25) | D-1/D-4 (1/1) | — | S-1/S-2 (4/1) | W-1 | S-4 | S-10 |

TABLE 4

|  | Sensitivity (mJ/cm$^2$) | Residual Film Ratio (%) |
|---|---|---|
| Example 22 | 6.0 | 95 |
| Example 23 | 5.0 | 97 |
| Example 24 | 6.0 | 95 |
| Example 25 | 7.0 | 94 |
| Example 26 | 5.0 | 98 |
| Example 27 | 6.0 | 95 |
| Example 28 | 7.0 | 96 |
| Example 29 | 6.0 | 95 |
| Example 30 | 5.0 | 96 |
| Example 31 | 5.0 | 98 |
| Example 32 | 7.0 | 95 |
| Example 33 | 15.0 | 90 |
| Example 34 | 15.0 | 92 |
| Example 35 | 10.0 | 95 |
| Example 36 | 5.0 | 97 |
| Example 37 | 6.0 | 98 |
| Example 38 | 6.0 | 97 |
| Example 39 | 6.0 | 97 |
| Example 40 | 6.0 | 98 |
| Example 41 | 6.5 | 97 |
| Example 42 | 6.0 | 98 |

As seen from Table 2, in Examples of the present invention where the development is performed using a developer containing an organic solvent, a good pattern is formed as compared with Comparative Example 1 where conventional development by an aqueous alkali solution is performed.

Also, even when the development is performed using a developer containing an organic solvent, in Examples of the present invention using a negative (crosslinking-type) chemical-amplification resist composition, a good pattern is formed as compared with Comparative Example 2 using a non-chemical amplification resin composition or Comparative Example 3 using a positive (polarity conversion-type) chemical-amplification resist composition.

It is seen from Tables 2 and 4 that by the pattern forming method using the negative chemical-amplification resist composition of the present invention, a pattern was formed with good properties in sensitivity, resolution, pattern profile, line width roughness, bridge margin, collapse margin and residual film ratio. Particularly, in the EB exposure, the line width roughness is greatly improved while ensuring good performance in terms of bridge margin and collapse margin.

INDUSTRIAL APPLICABILITY

According to the present invention, a pattern forming method using a negative chemical-amplification resist composition capable of satisfying high sensitivity, high resolution, good pattern profile, good line width roughness, bridge margin adequacy, collapse margin adequacy and good residual film ratio in the ultrafine region, a developer and a negative chemical-amplification resist composition used therefor, and a resist pattern formed by the pattern forming method can be provided.

The entire disclosure of Japanese Patent Application Nos. 2009-020887 filed on Jan. 30, 2009, 2009-038665 filed on Feb. 20, 2009 and 2009-088556 filed on Mar. 31, 2009, and U.S. Provisional Patent Application No. 61/148,517 filed on Jan. 30, 2009, from which the benefit of foreign priority has been claimed in the present application, is incorporated herein by reference, as if fully set forth.

The invention claimed is:

1. A resist pattern forming method comprising, in the following order:
    (1) a step of forming a film by using a negative chemical-amplification resist composition capable of undergoing negative conversion by a crosslinking reaction;
    (2) a step of exposing the film; and
    (4) a step of developing the exposed film by using a developer containing an organic solvent,
    wherein:
    the negative chemical-amplification resist composition comprises:
    (A) a resin;
    (B) a crosslinking agent capable of crosslinking the resin (A) by the action of an acid; and
    (C) a compound capable of generating an acid upon irradiation with an actinic ray or radiation;
    the resin (A) is a resin containing a repeating unit represented by formula (1):

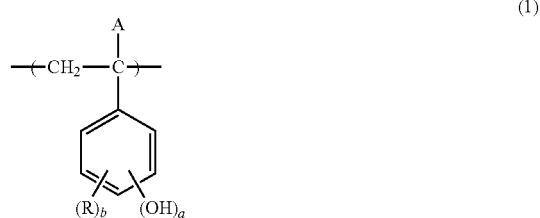

wherein
A represents a hydrogen atom, an alkyl group, a cycloalkyl group, a halogen atom or a cyano group,
R represents a halogen atom, an alkyl group, a cycloalkyl group, an aryl group, an alkenyl group, an aralkyl group, an alkoxy group, an alkylcarbonyloxy group or an alkylsulfonyloxy group, and when a plurality of R's are present, each R may be the same as or different from every other R and they may combine with each other to form a ring,
a represents an integer of 1 to 3, and
b represents an integer of 0 to (3-a); and
the crosslinking agent (B) is a phenol compound having two or more benzene rings in the molecule.

2. The resist pattern forming method as claimed in claim 1, wherein
the organic solvent contained in the developer is one or more kinds of solvents selected from the group consisting of an ester-based solvent, a ketone-based solvent, an alcohol-based solvent, an amide-based solvent, an ether-based solvent and a hydrocarbon-based solvent.

3. The resist pattern forming method as claimed in claim 1, wherein
the organic solvent contained in the developer is one or more kinds of solvents selected from the group consisting of an alkylene glycol monoalkyl ether carboxylate-based solvent, an alkylene glycol monoalkyl ether-based solvent, an alkyl carboxylate-based solvent and an alkyl ketone-based solvent.

4. The resist pattern forming method as claimed in claim 1, wherein
the organic solvent contained in the developer is one or more kinds of solvents selected from the group consisting of propylene glycol monomethyl ether, propylene glycol monomethyl ether acetate, methyl isobutyl ketone, methyl amyl ketone, cyclopentanone, cyclohexanone, ethyl lactate and butyl acetate.

5. The resist pattern forming method as claimed in claim 1, wherein
the organic solvent contained in the developer is one or more kinds of solvents selected from the group consisting of an ester-based solvent containing no hydroxyl group in the molecule, a ketone-based solvent containing no hydroxyl group in the molecule, and an ether-based solvent containing no hydroxyl group in the molecule.

6. The resist pattern forming method as claimed in claim 1, further comprising: (5) a step of performing a rinsing treatment by using a rinsing solution containing an organic solvent after the developing step (4).

7. The resist pattern forming method as claimed in claim 6, wherein
the organic solvent contained in the rinsing solution is one or more kinds of solvents selected from the group consisting of a monohydric alcohol-based solvent and a hydrocarbon-based solvent.

8. The resist pattern forming method as claimed in claim 1, further comprising: (3) a baking step between the exposing step (2) and the developing step (4).

9. The resist pattern forming method as claimed in claim 1, wherein
the exposure in (2) the exposing step is performed by an electron beam or EUV light.

10. The resist pattern forming method as claimed in claim 1, which is used for fabrication of a semiconductor microcircuit.

11. The resist pattern forming method as claimed in claim 1, wherein
the percentage of water content in the developer is 10 mass % or less.

12. The resist pattern forming method as claimed in claim 1, wherein
the content of the cros slinking agent (B) in the negative chemical-amplification resist composition is from 3 to 65 mass % based on the entire solid content of the resist composition.

13. The resist pattern forming method as claimed in claim 1, wherein
the compound (C) is a compound capable of generating at least any one acid of a sulfonic acid, a bis(alkylsulfonyl)imide and a tris(alkylsulfonyl)methide upon irradiation with an actinic ray or radiation.

14. A resist pattern formed by the resist pattern forming method claimed in claim 1.

15. The resist pattern forming method as claimed in claim 4, wherein the organic solvent contained in the developer is any of methyl isobutyl ketone, methyl amyl ketone and cyclohexanone.

16. The resist pattern forming method as claimed in claim 15, wherein the organic solvent contained in the developer is methyl amyl ketone.

* * * * *